United States Patent
Park et al.

(10) Patent No.: US 11,814,401 B2
(45) Date of Patent: Nov. 14, 2023

(54) LUMINESCENT MATERIAL AND ELECTROLUMINESCENT DISPLAY DEVICE USING THE SAME

(71) Applicants: LG Display Co., Ltd., Seoul (KR); Rohm and Haas Electronic Materials Korea Ltd., Chungcheongnam-do (KR)

(72) Inventors: HeeJun Park, Paju-si (KR); Jaemin Moon, Paju-si (KR); Kusun Choung, Paju-si (KR); Hee Ryong Kang, Hwaseong-si (KR); Hyun Kim, Hwaseong-si (KR); Ga Won Lee, Hwaseong-si (KR); Seung Hyun Yoon, Hwaseong-si (KR); Kyoung-Jin Park, Hwaseong-si (KR)

(73) Assignees: LG DISPLAY CO., LTD, Seoul (KR); ROHM AND HAAS ELECTRONIC MATERIALS KOREA LTD., Chungcheongnam-Do (KR)

( * ) Notice: Subject to any disclaimer, the term of this patent is extended or adjusted under 35 U.S.C. 154(b) by 335 days.

(21) Appl. No.: 17/135,414

(22) Filed: Dec. 28, 2020

(65) Prior Publication Data
US 2021/0198298 A1    Jul. 1, 2021

(30) Foreign Application Priority Data
Dec. 31, 2019  (KR) .................. 10-2019-0179888

(51) Int. Cl.
*H01L 51/00* (2006.01)
*C07F 15/00* (2006.01)
(Continued)

(52) U.S. Cl.
CPC ....... *C07F 15/0033* (2013.01); *H10K 85/342* (2023.02); *H10K 50/15* (2023.02)

(58) Field of Classification Search
CPC .............. C07F 15/0033; H10K 85/342; C09K 2211/185; C09K 2211/1029; C09K 2211/1088; C09K 2211/1092
See application file for complete search history.

(56) References Cited

U.S. PATENT DOCUMENTS 6,921,915 B2    7/2005  Takiguchi et al.
9,184,397 B2    11/2015 Kottas et al.
(Continued)

FOREIGN PATENT DOCUMENTS

KR  10-2002-0072215 A  9/2002
KR  10-2011-0130475 A  12/2011
KR  10-2013-0018550 A  2/2013

*Primary Examiner* — Alexander C Kollias
(74) *Attorney, Agent, or Firm* — Morgan, Lewis & Bockius LLP

(57) ABSTRACT

A new luminescent material and an electroluminescent display device using the same are disclosed, in which the luminescent material includes a compound expressed by the following chemical formula 1 and may be used as a dopant of a light emitting layer of a green, yellow-green or red color:

Chemical formula 1

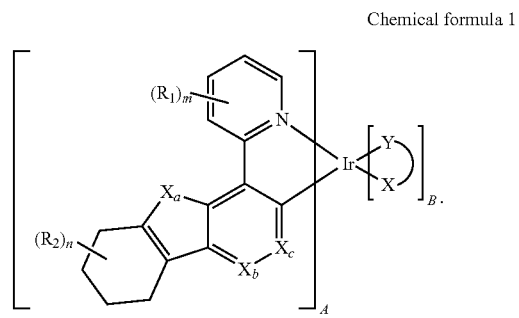

12 Claims, 2 Drawing Sheets

(51) Int. Cl.
  *H10K 85/30* (2023.01)
  *H10K 50/15* (2023.01)

(56) References Cited

U.S. PATENT DOCUMENTS

| | | |
|---|---|---|
| 10,056,566 B2 | 8/2018 | Xia et al. |
| 2018/0194791 A1* | 7/2018 | Boudreault .......... H10K 85/342 |
| 2018/0323382 A1* | 11/2018 | Boudreault .......... H10K 85/342 |

* cited by examiner

LUMINESCENT MATERIAL AND ELECTROLUMINESCENT DISPLAY DEVICE USING THE SAME

CROSS-REFERENCE TO RELATED APPLICATIONS

This application claims the benefit of the Korean Patent Application No. 10-2019-0179888 filed on Dec. 31, 2019, which are hereby incorporated by reference as if fully set forth herein.

BACKGROUND

Technical Field

The present disclosure relates to an electroluminescent display device, and more particularly, to a luminescent material constituting a light emitting layer of an electroluminescent display device.

Discussion of the Related Art

An electroluminescent display device has a structure that constitutes a light emitting layer formed between an anode electrode and a cathode electrode, and is a device for displaying an image as the light emitting layer emits light due to an electric field between the two electrodes.

The light emitting layer includes a luminescent material for emitting light as an exciton is generated by combination of electrons and holes and the generated exciton is transited from an excited state to a ground state.

In the related art, a phosphor material of an organic metal compound is used as the luminescent material, and the phosphor material developed up to now has limitation in improving efficiency and lifetime. Therefore, the development of a new phosphor material that may improve efficiency and lifetime is required.

SUMMARY

Accordingly, embodiments of the present disclosure are directed to a display device that substantially obviates one or more of the problems due to limitations and disadvantages of the related art.

The present disclosure has been made in view of the above problems, and it is an aspect of the present disclosure to provide a luminescent material that may improve efficiency and lifetime and an electroluminescent display device comprising the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

In accordance with an aspect of the present disclosure, the above and other objects can be accomplished by the provision of a luminescent material comprising a compound expressed by the following chemical formula 1:

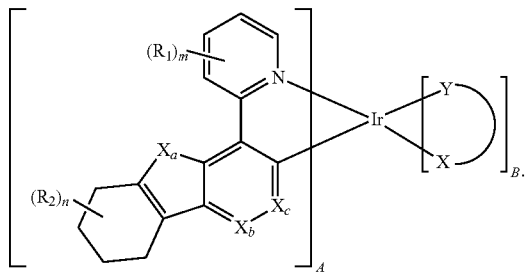

Chemical formula 1

In the Chemical formula 1,
$X_a$ is selected from oxygen or sulfur;
$X_b$ and $X_c$ are independently selected from nitrogen or carbon;
$R_1$ and $R_2$ are independently selected from a group of hydrogen, heavy hydrogen, —F, —Cl, —Br, —I, hydroxyl group, cyano group, nitro group, amidino group, hydrazine group, hydrazone group, alkyl group of substituted or unsubstituted $C_1$-$C_{20}$, alkenyl group of substituted or unsubstituted $C_2$-$C_{20}$, alkynyl group of substituted or unsubstituted $C_2$-$C_{20}$, heteroalkyl group of substituted or unsubstituted $C_1$-$C_{20}$, aralkyl group of substituted or unsubstituted $C_7$-$C_{20}$, aryl group of substituted or unsubstituted $C_6$-$C_{30}$, heteroaryl group of substituted or unsubstituted $C_3$-$C_{30}$, and heteroaralkyl group of substituted or unsubstituted $C_3$-$C_{20}$;
m is selected from integers of 1 to 4;
two or more $R_1$ are equal to or different from one another if m is 2 or more;
two of $R_1$, which are combined with adjacent carbons, may selectively be combined with each other to form a ring;
n is selected from integers of 1 to 8;
two or more $R_2$ are equal to or different from one another if n is 2 or more;
two of $R_2$, which are combined with adjacent carbons, may selectively be combined with each other to form a ring;
two of $R_2$, which are combined with the same carbon, may selectively be combined with each other to form a ring;
X—Y is an auxiliary ligand; and
A and B indicate values of ligands combined with iridium, wherein A is an integer of 1 to 3, B is an integer of 0 to 2, and a sum of A and B is 3.

In accordance with another aspect of the present disclosure, the above and other objects can be accomplished by the provision of an electroluminescent display device comprising a substrate, a first electrode provided on the substrate, a light emitting layer provided on the first electrode, and a second electrode provided on the light emitting layer, wherein the light emitting layer includes the luminescent material of the aforementioned chemical formula 1.

If the luminescent material according to one embodiment of the present disclosure is used as a dopant of the light emitting layer, an electroluminescent display device of high efficiency and long lifetime may be obtained.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
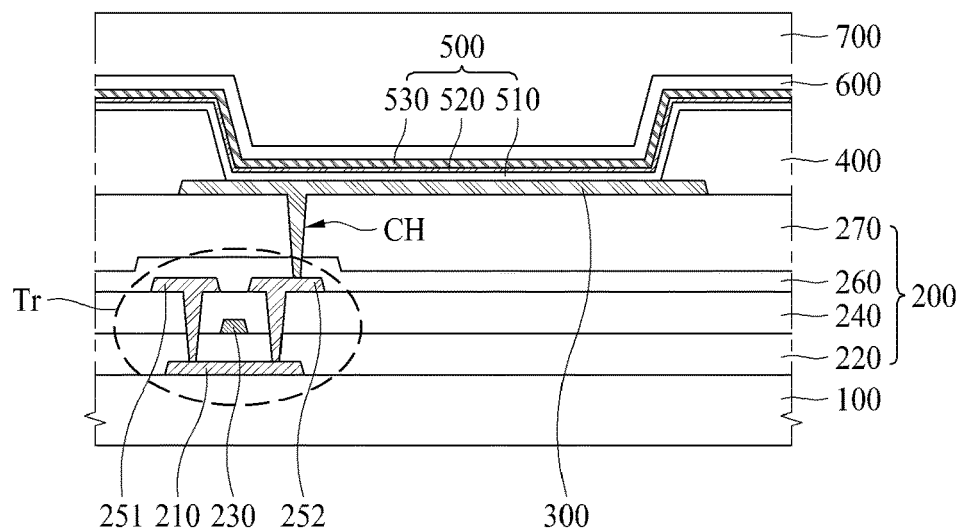
FIG. 1 is a schematic cross-sectional view illustrating an electroluminescent display device according to one embodiment of the present disclosure.

Reference will now be made in detail to exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiment of the present disclosure will be described in detail with the accompanying drawings.

The present disclosure provides a luminescent material comprising a compound expressed by the following chemical formula 1.

Chemical formula 1

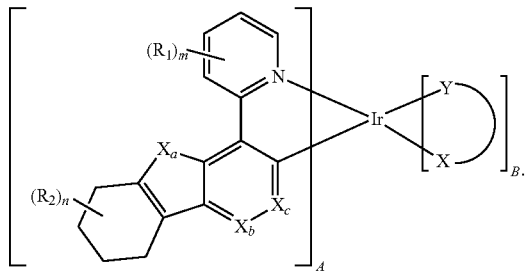

In the Chemical formula 1, $X_a$ is selected from oxygen or sulfur;

$X_b$ and $X_c$ are independently selected from nitrogen or carbon;

$R_1$ and $R_2$ are independently selected from a group of hydrogen, heavy hydrogen, —F, —Cl, —Br, —I, hydroxyl group, cyano group, nitro group, amidino group, hydrazine group, hydrazone group, alkyl group of substituted or unsubstituted $C_1$-$C_{20}$, alkenyl group of substituted or unsubstituted $C_2$-$C_{20}$, alkynyl group of substituted or unsubstituted $C_2$-$C_{20}$, heteroalkyl group of substituted or unsubstituted $C_1$-$C_{20}$, aralkyl group of substituted or unsubstituted $C_7$-$C_{20}$, aryl group of substituted or unsubstituted $C_6$-$C_{30}$, heteroaryl group of substituted or unsubstituted $C_3$-$C_{30}$, and heteroaralkyl group of substituted or unsubstituted $C_3$-$C_{20}$;

m is selected from integers of 1 to 4;

two or more $R_1$ are equal to or different from one another if m is 2 or more;

two $R_1$, which are combined with adjacent carbons, may selectively be combined with each other to form a ring;

n is selected from integers of 1 to 8;

two or more $R_2$ are equal to or different from one another if n is 2 or more;

two $R_2$, which are combined with adjacent carbons, may selectively be combined with each other to form a ring;

two $R_2$, which are combined with a same carbon, may selectively be combined with each other to form a ring;

X—Y is an auxiliary ligand; and

A and B indicate values of ligands combined with iridium, wherein A is an integer of 1 to 3, B is an integer of 0 to 2, and a sum of A and B is 3.

The chemical formula 1 according to the present disclosure may be a compound expressed by the following chemical formula 2.

Chemical formula 2

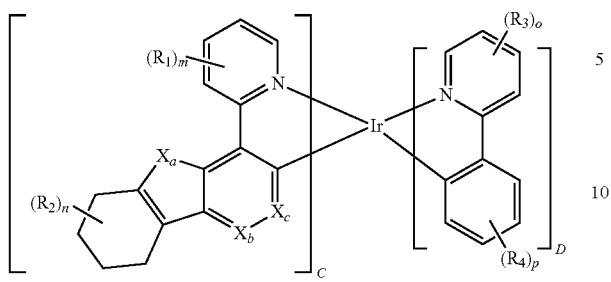

In the chemical formula 2,
$X_a$, $X_b$, $X_c$, $R_1$, $R_2$, m, and n are as defined in the chemical formula 1,
$R_3$ and $R_4$ are respectively equal to
o and p are equal to m,
C is equal to A of the chemical formula 1, and D is equal to B of the chemical formula 1.

The chemical formula 1 according to the present disclosure may be a compound expressed by the following chemical formula 3.

Chemical formula 3

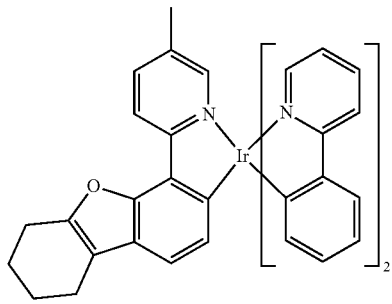

In the chemical formula 3,
$X_a$, $X_b$, $X_c$, $R_1$, $R_2$, m, and n are as defined in the chemical formula 1,
$R_5$, $R_6$, and $R_7$ are respectively equal to $R_1$,
E is equal to A of the chemical formula 1, and F is equal to B of the chemical formula 1.

The chemical formula 1 according to the present disclosure includes compounds as follows. Among the following compounds, the compounds 1 to 60 and the compounds 111 to 119 are examples of the compounds according to the chemical formula 2, and the compounds 61 to 110 are examples of the compounds according to the chemical formula 3.

1

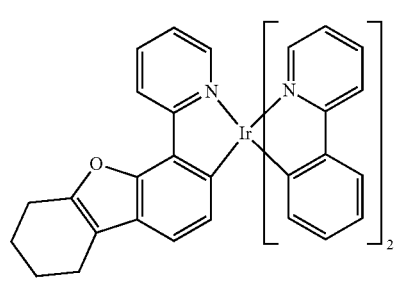

2

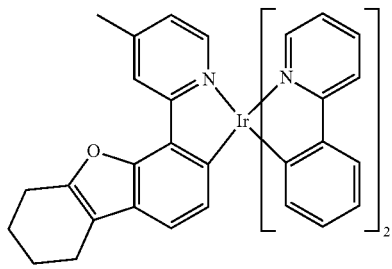

3

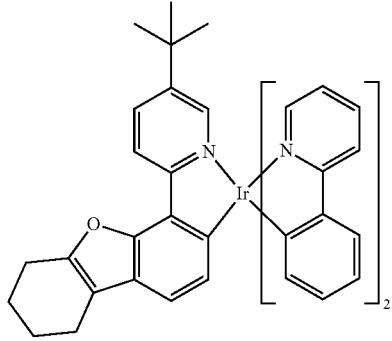

4

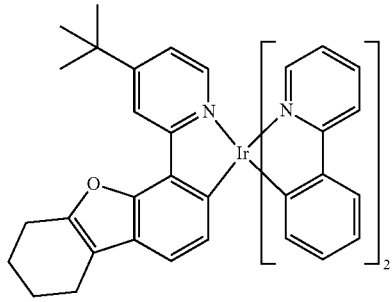

5

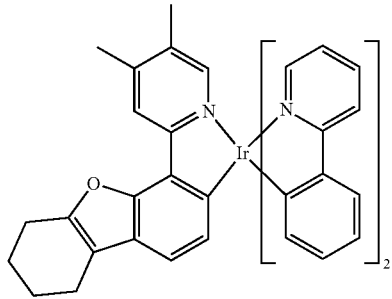

6

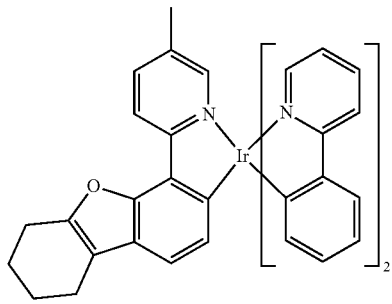

7
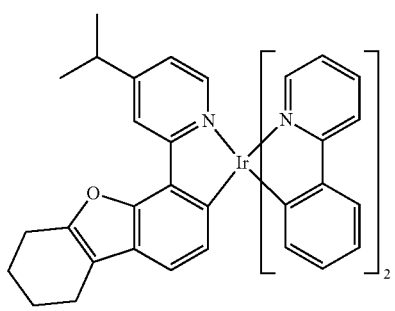
8
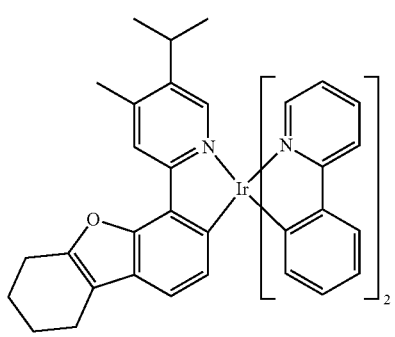
9
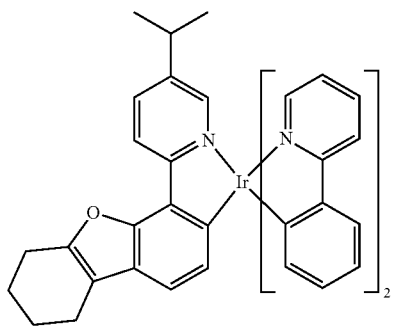
10
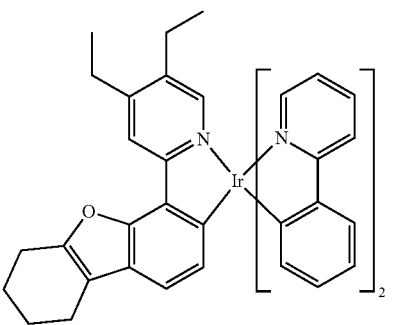
11
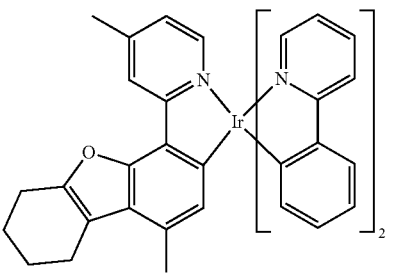
12
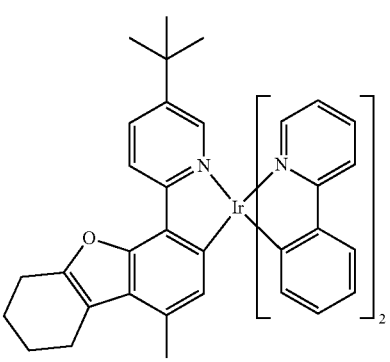
13
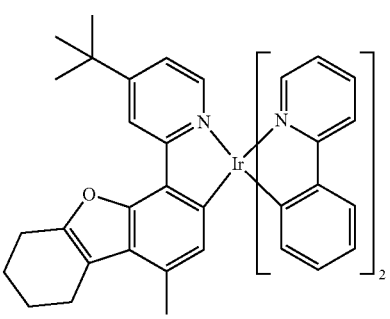
14
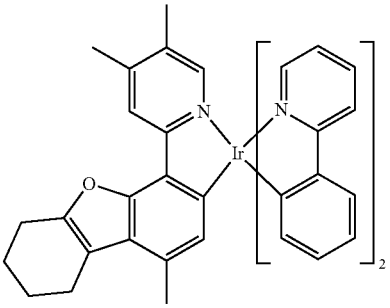
15
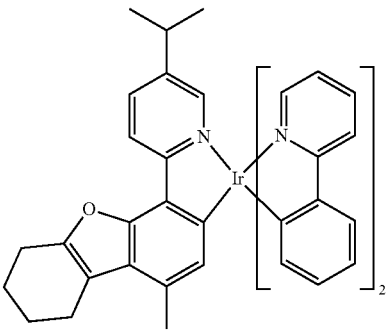
16
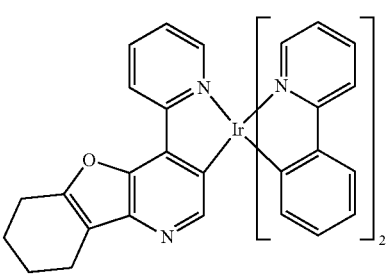

17
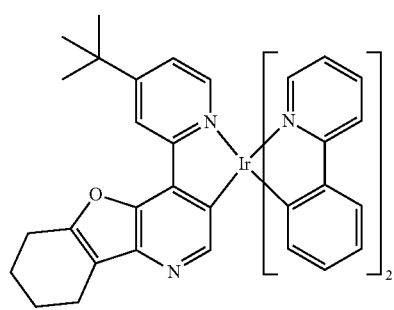
18
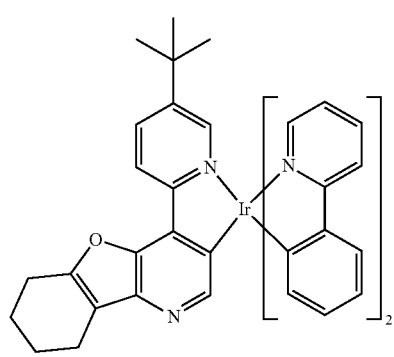
19
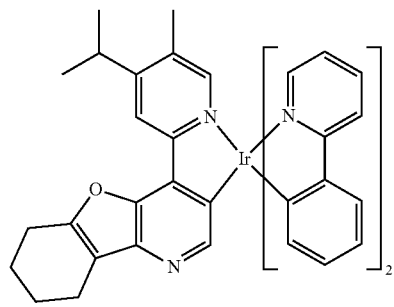
20
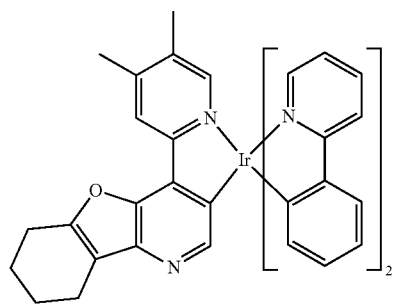
21
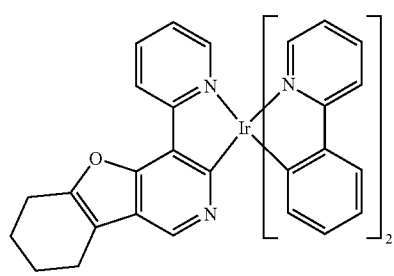
22
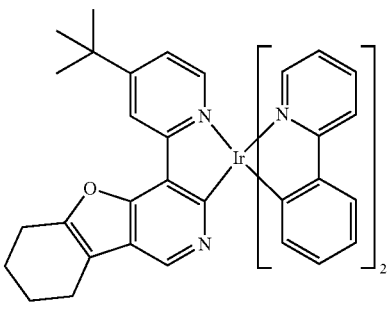
23
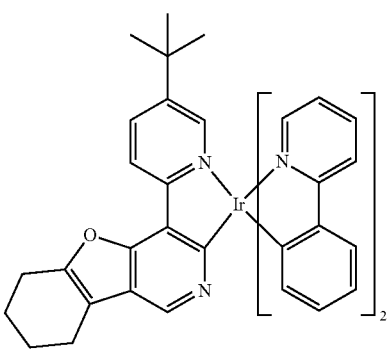
24
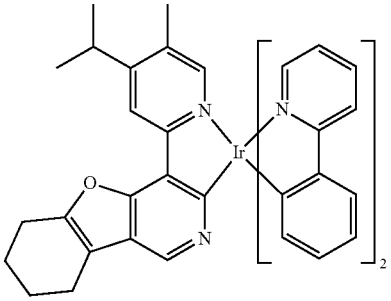
25
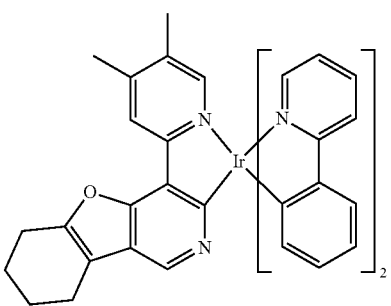
26
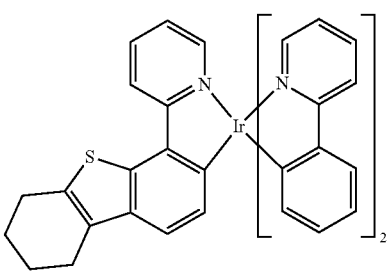

27
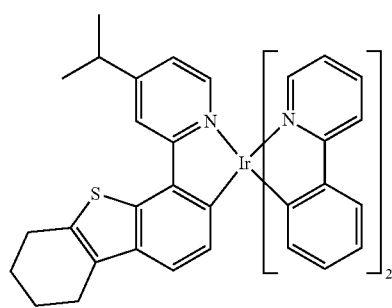
28
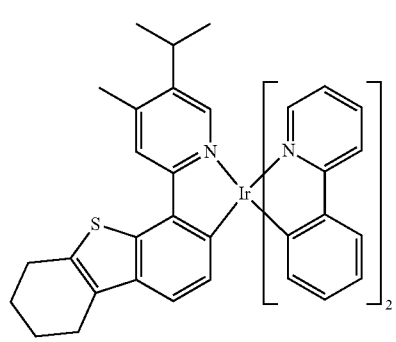
29
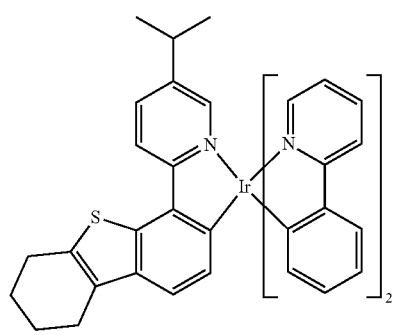
30
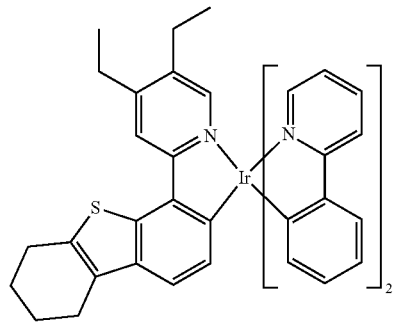
31
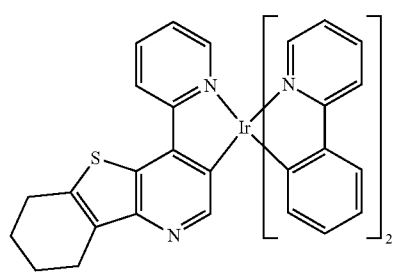
32
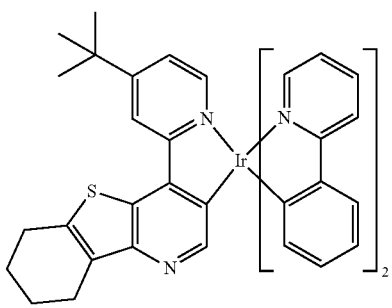
33
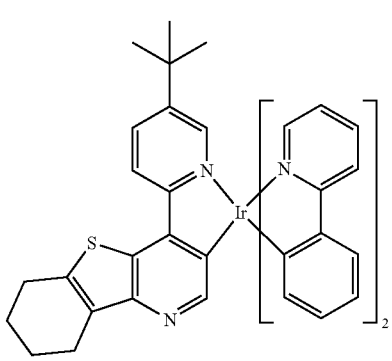
34
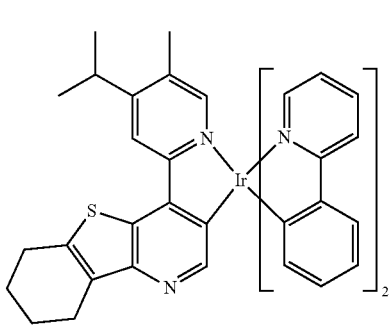
35
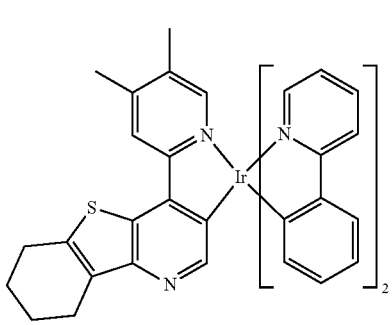
36
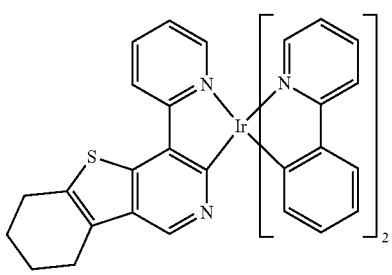

37
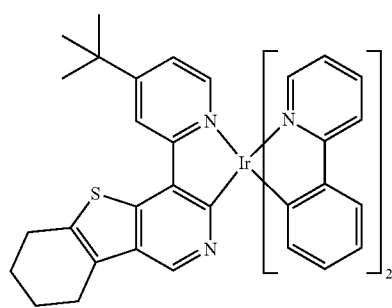
38
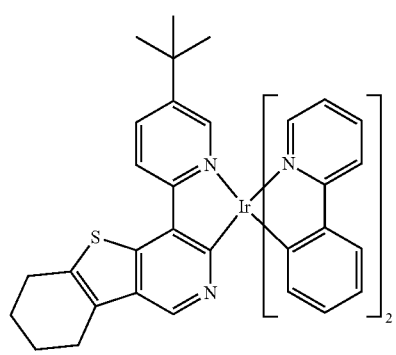
39
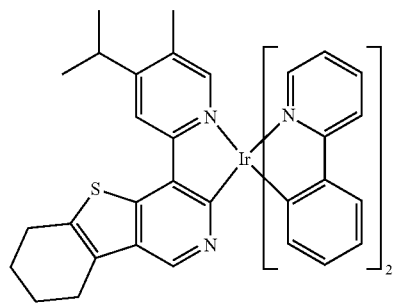
40
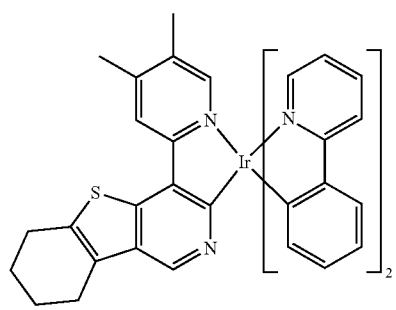
41
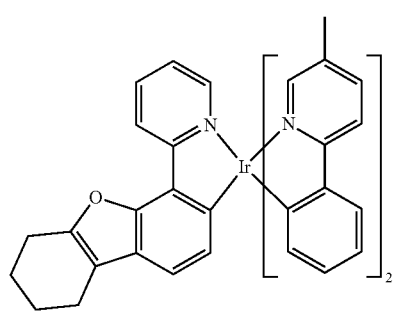
42
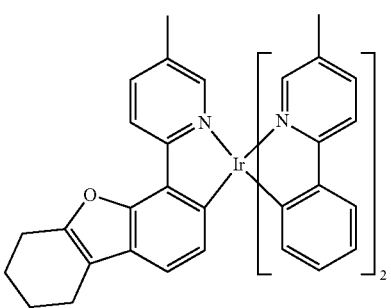
43
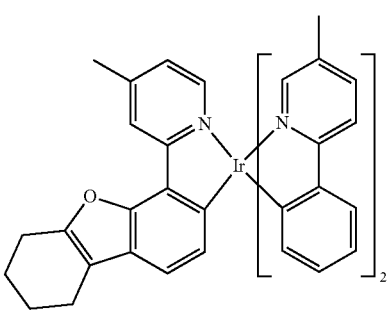
44
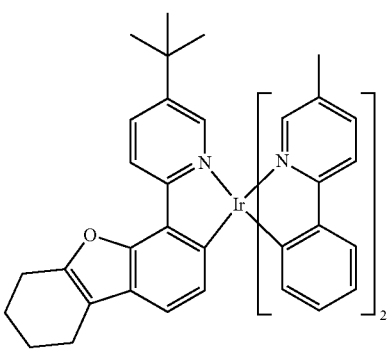
45
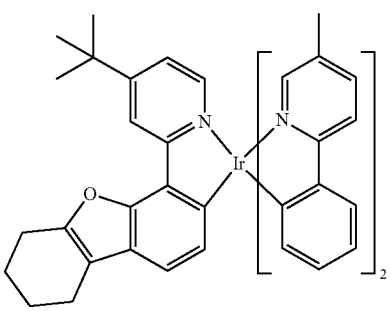
46
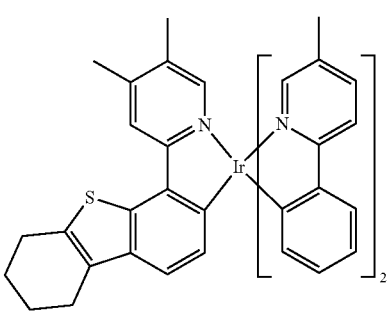

47
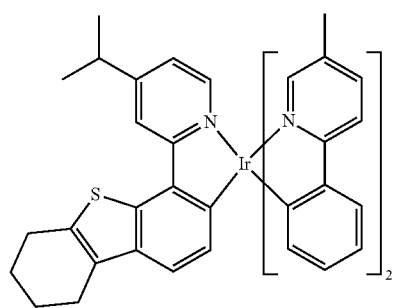
48
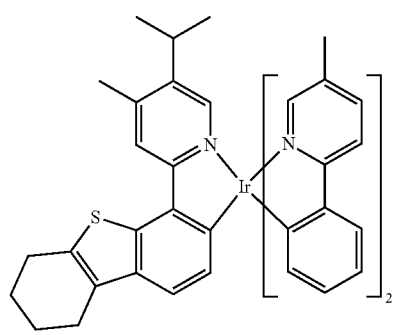
49
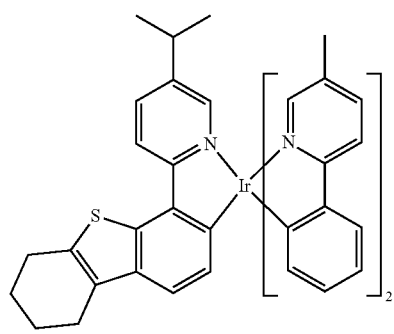
50
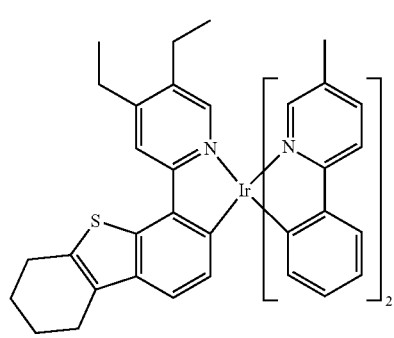
51
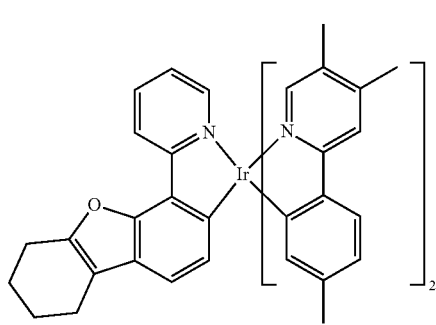
52
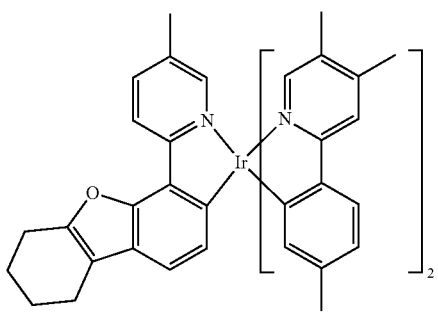
53
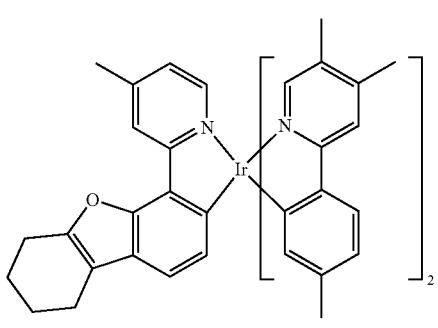
54
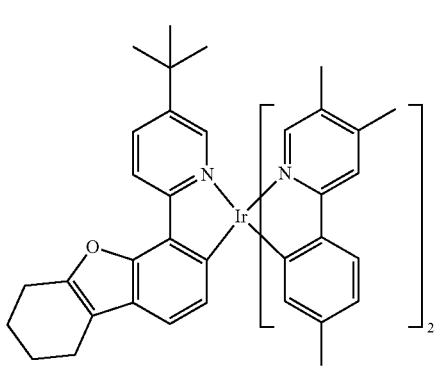
55
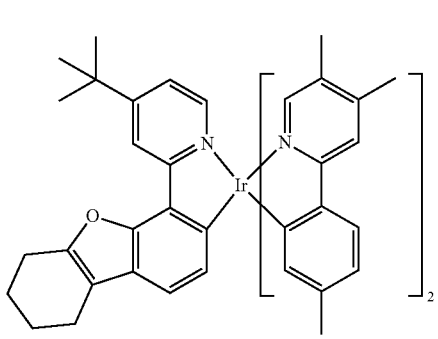
56
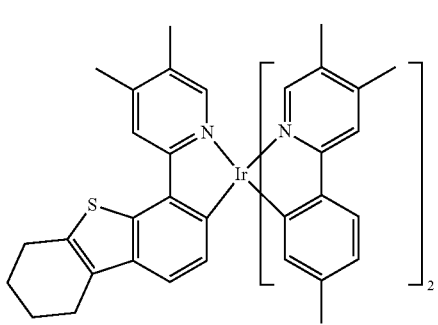

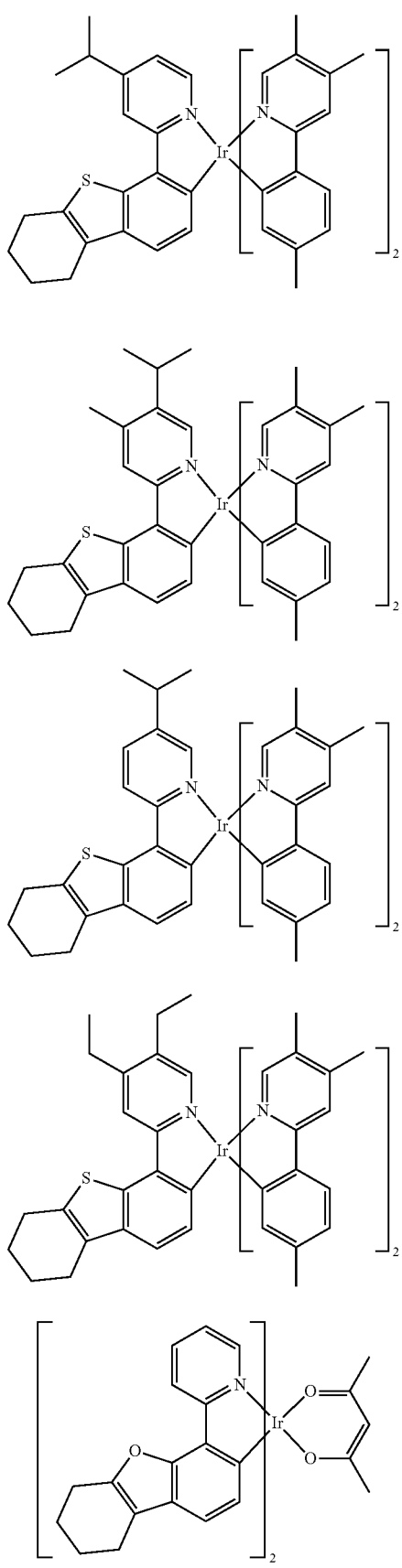
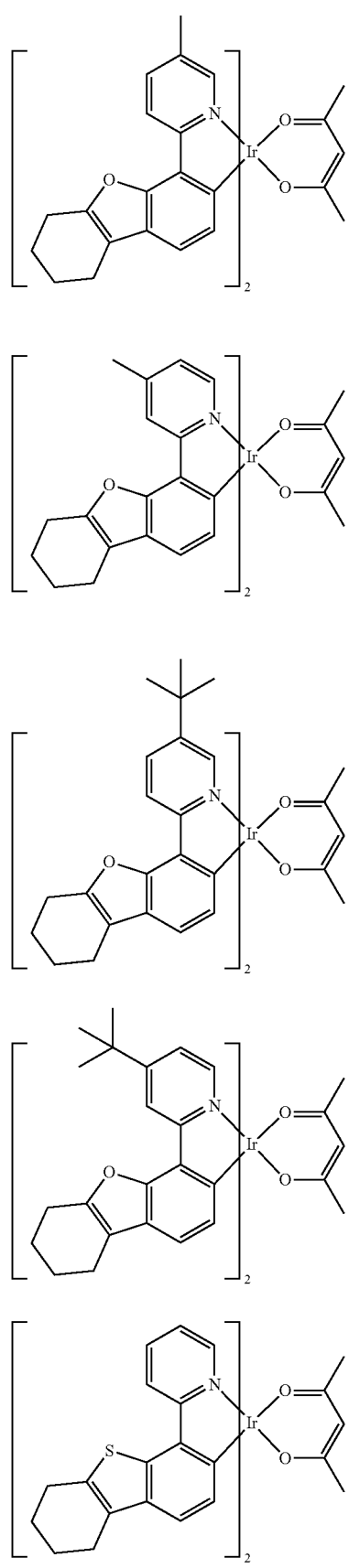

67 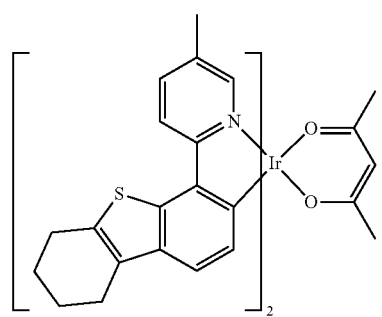
68 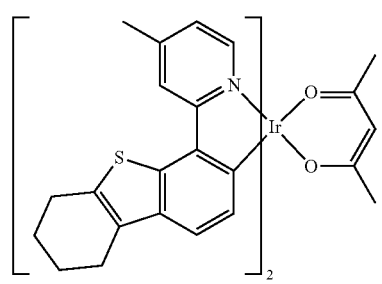
69 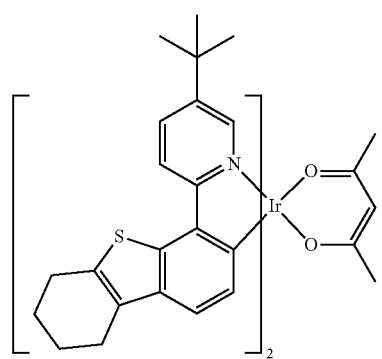
70 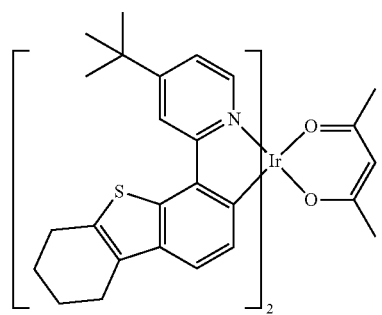
71 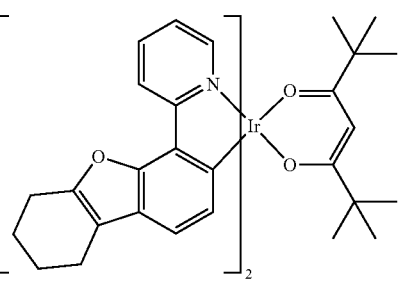
72 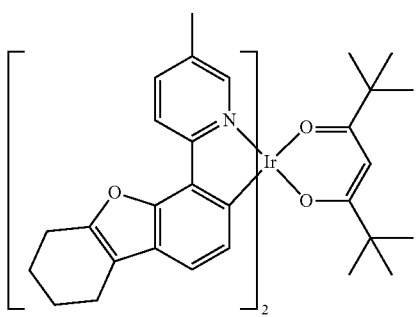
73 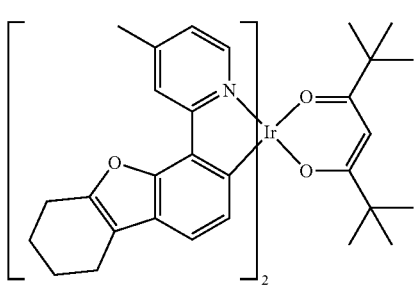
74 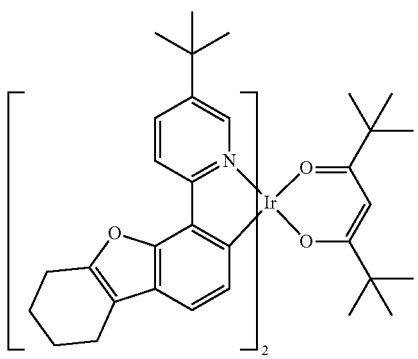
75 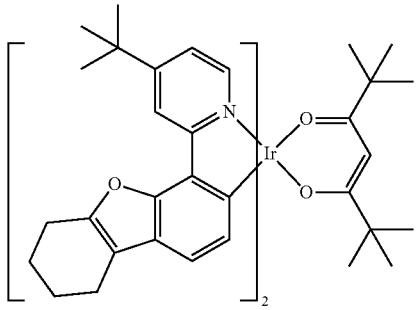
76 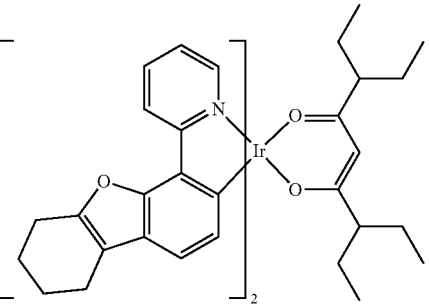

77
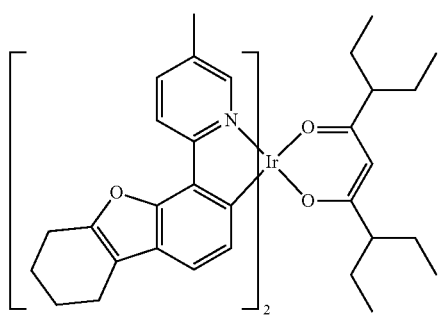
78
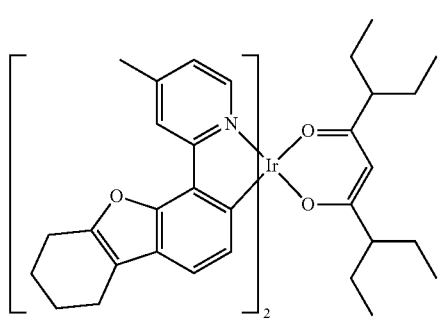
79
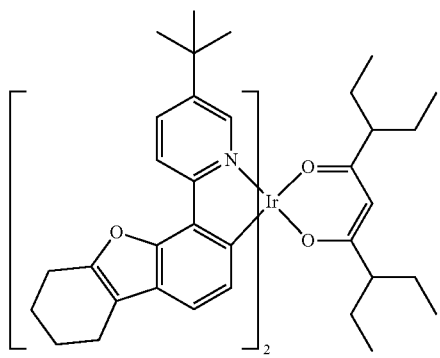
80
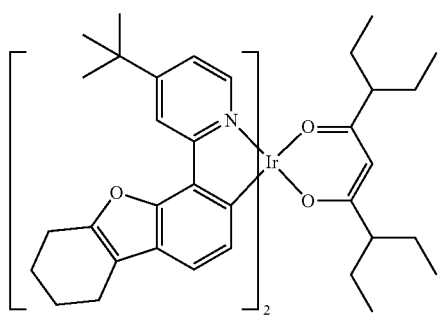
81
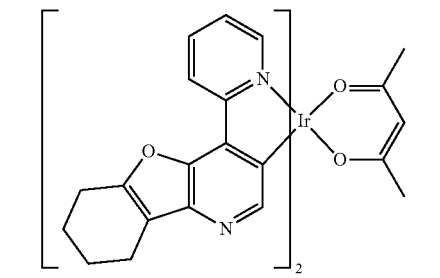
82
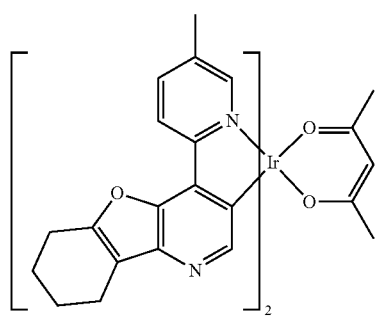
83
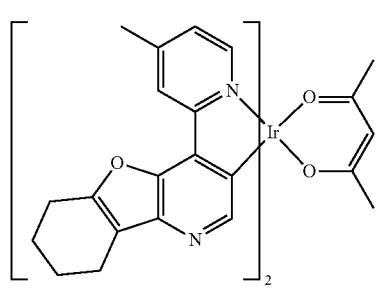
84
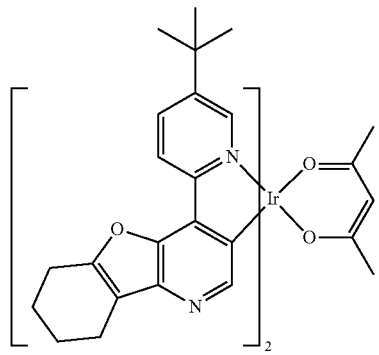
85
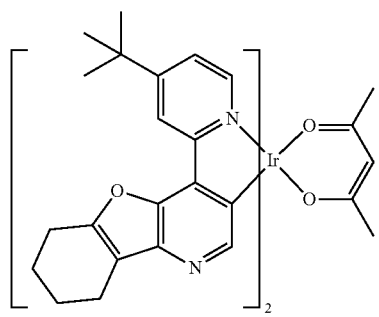
86
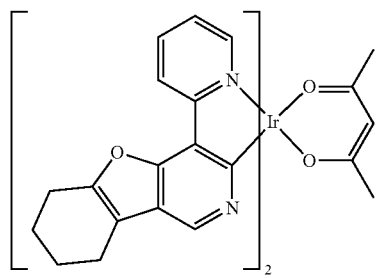

87
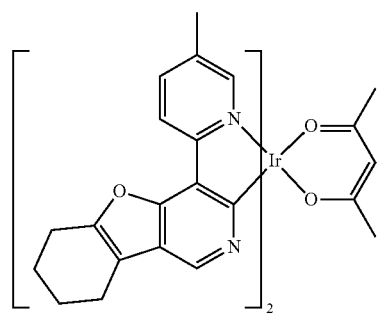
88
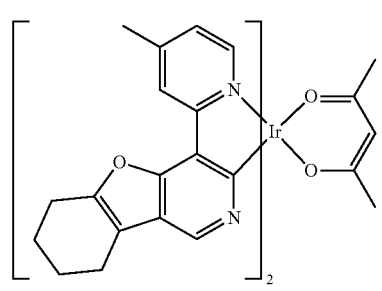
89
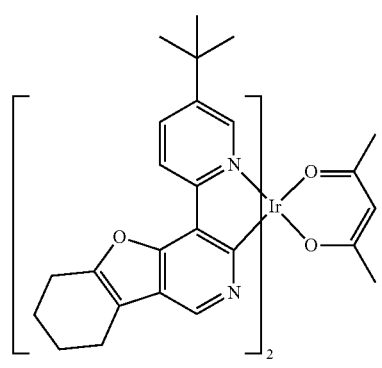
90
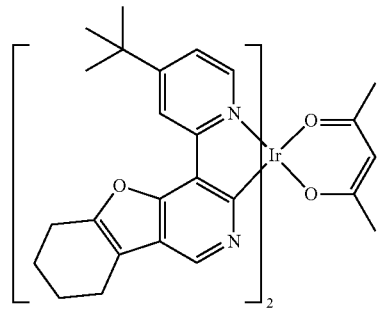
91
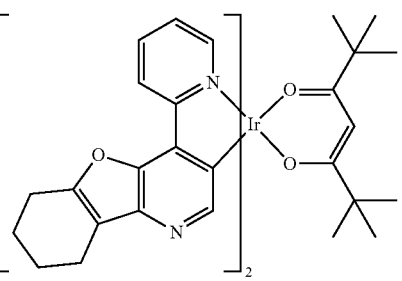
92
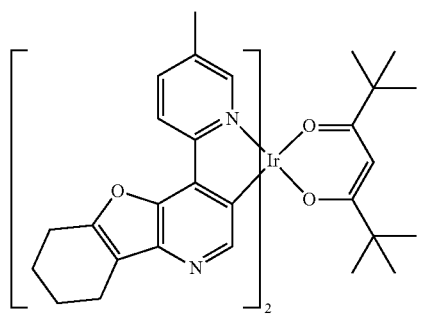
93
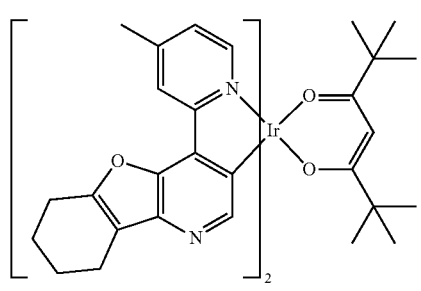
94
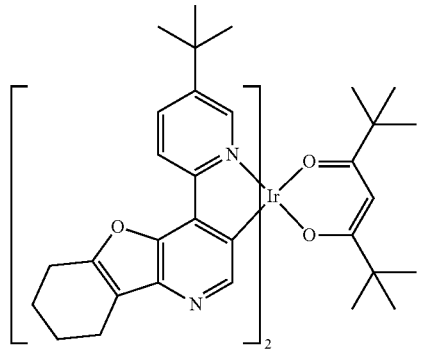
95
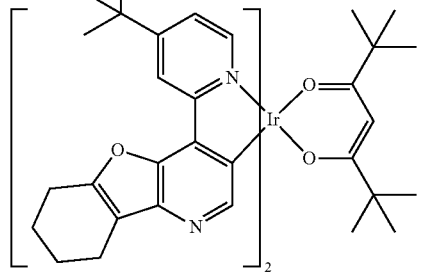
96
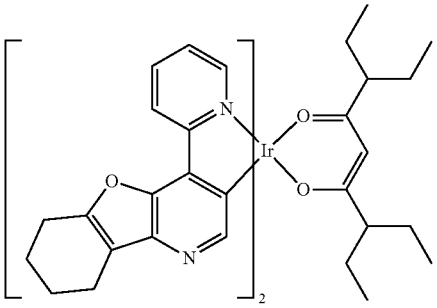

97
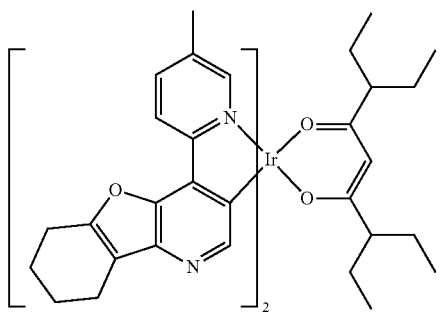
98
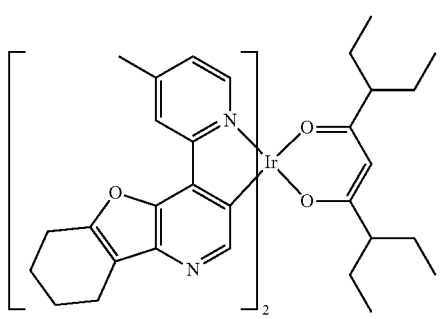
99
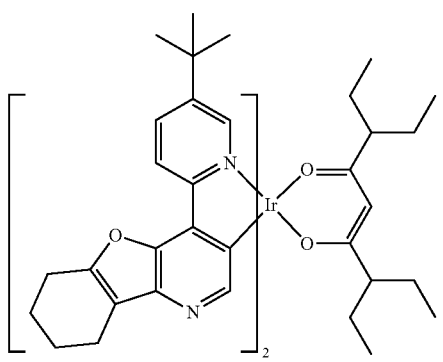
100
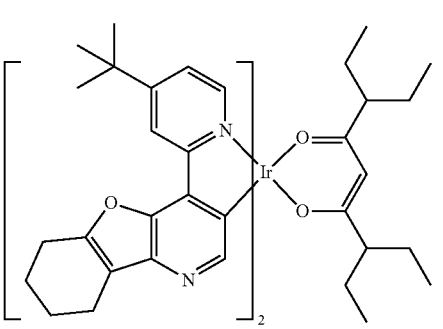
101
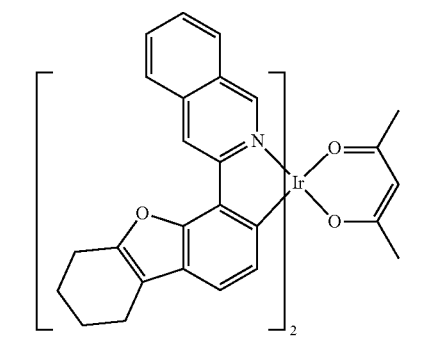
102
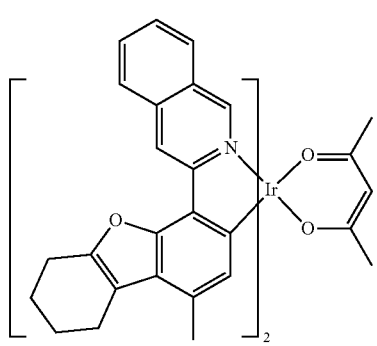
103
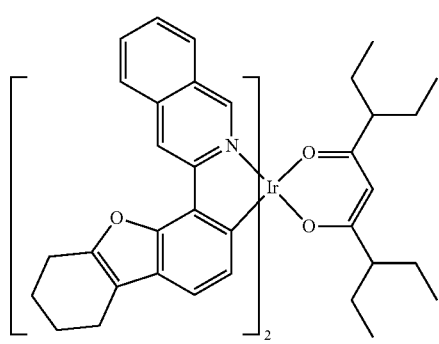
104
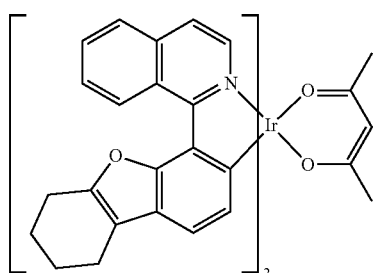
105
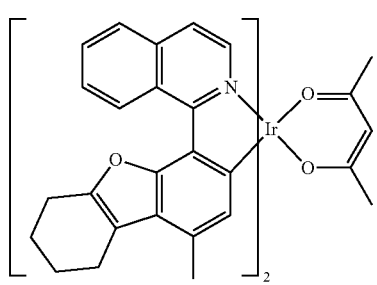
106
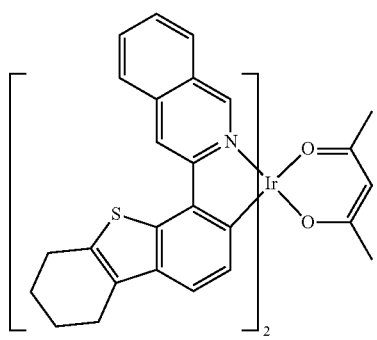

107
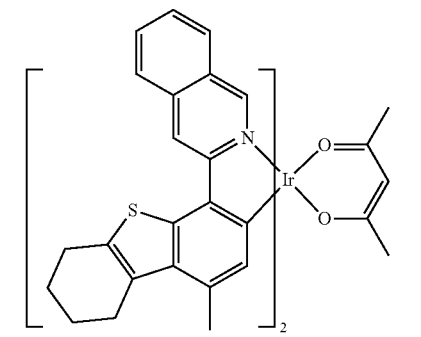
108
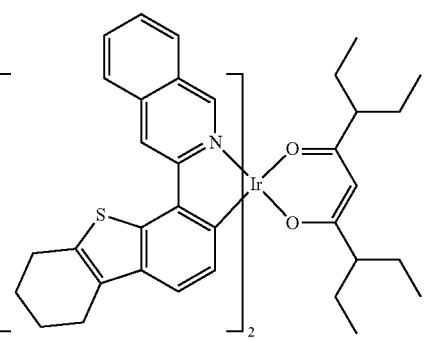
109
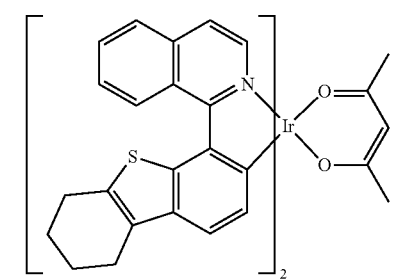
110
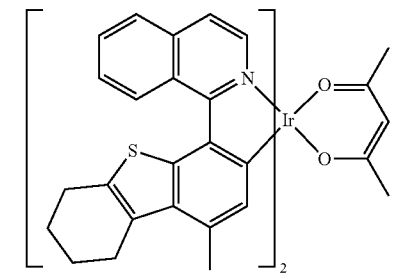
111
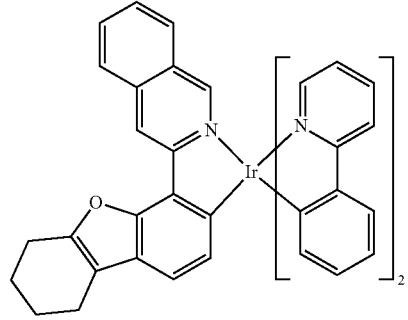
112
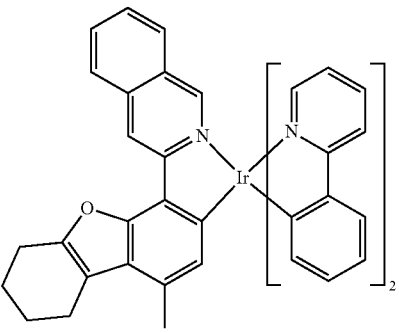
113
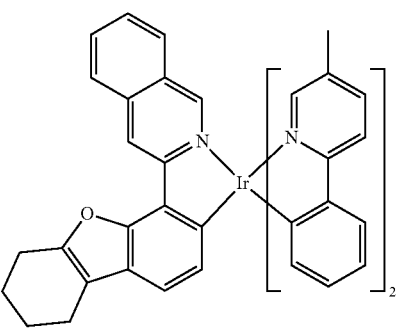
114
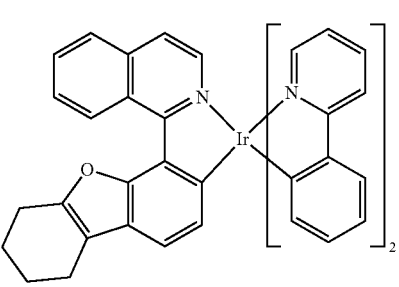
115
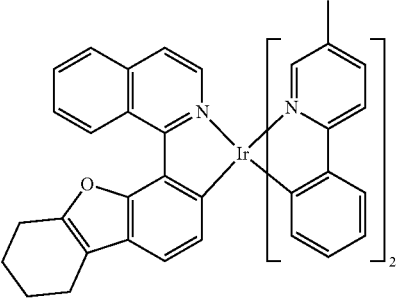
116
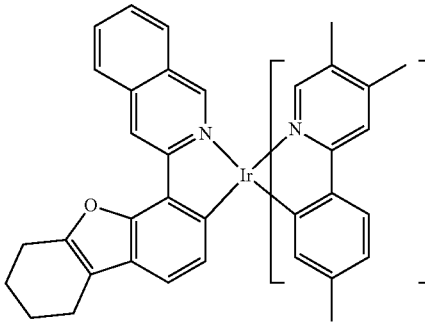

-continued

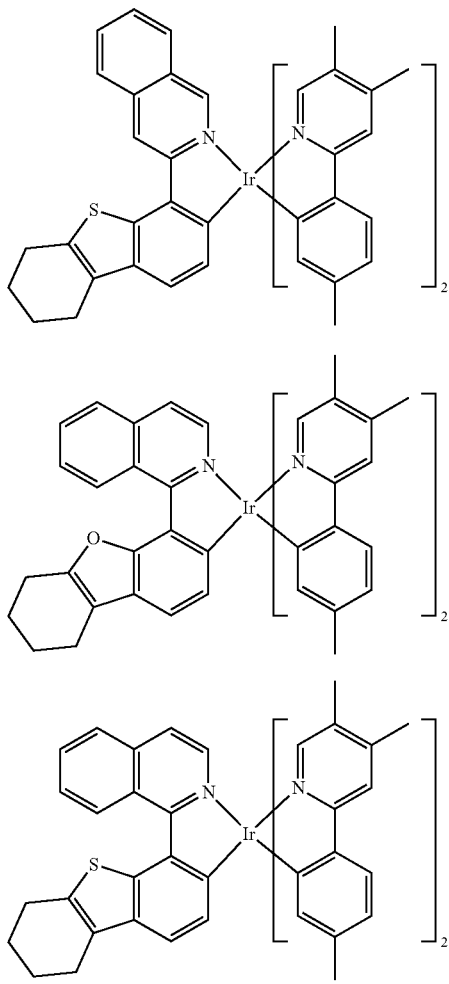

117

118

119

The present disclosure provides an electroluminescent display device that includes at least one compound of the chemical formulas 1 to 3 and the compounds 1 to 119 as a material of a light emitting layer.

Figure 2:
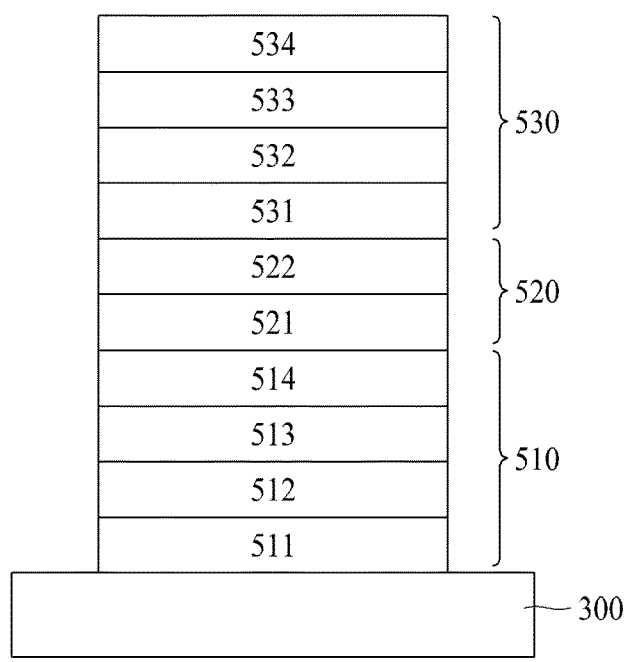
FIG. 2 is a cross-sectional view illustrating a structure of a light emitting layer according to one embodiment of the present disclosure.

FIG. 1 is a schematic cross-sectional view illustrating an electroluminescent display device according to one embodiment of the present disclosure, and FIG. 2 is a cross-sectional view illustrating a structure of a light emitting layer according to one embodiment of the present disclosure.

As noted from FIG. 1, the electroluminescent display device according to one embodiment of the present disclosure includes a substrate 100, a circuit element layer 200, a first electrode 300, a bank 400, a light emitting layer 500, a second electrode 600, and an encapsulation layer 700.

The electroluminescent display device according to one embodiment of the present disclosure may be provided in a bottom emission type in which light is emitted to a lower side. In this case, the substrate 100 may be made of a transparent material such as glass or plastic. However, if the electroluminescent display device according to one embodiment of the present disclosure is provided in a top emission type in which light is emitted to an upper side, the substrate 100 may be made of an opaque material as well as a transparent material.

The circuit element layer 200 is formed on the substrate 100. The circuit element layer 200 is provided with various signal lines including gate lines, data lines, power lines and reference lines, various thin film transistors including a switching thin film transistor, a driving thin film transistor Tr and a sensing thin film transistor, and a capacitor.

The switching thin film transistor is switched in accordance with a gate signal supplied to the gate line to supply a data voltage supplied from the data line to the driving thin film transistor Tr. The driving thin film transistor Tr is switched in accordance with the data voltage supplied from the switching thin film transistor to generate a data current from a power source supplied from the power line and supply the data current to a first electrode of an organic light emitting diode. The sensing thin film transistor serves to sense a threshold voltage deviation of the driving thin film transistor Tr, which causes deterioration of picture quality, and supplies the current of the driving thin film transistor Tr to the reference line in response to a sensing control signal supplied from the gate line or a separate sensing line.

The capacitor serves to maintain the data voltage supplied to the driving thin film transistor Tr for one frame, and is connected to each of a gate terminal and a source terminal of the driving thin film transistor Tr.

The driving thin film transistor Tr includes an active layer 210 provided on the substrate 100, a gate insulating film 220 provided on the active layer 210, a gate electrode 230 provided on the gate insulating film 220, an inter-layer dielectric film 240 provided on the gate electrode 230, and source and drain electrodes 251 and 252 provided on the inter-layer dielectric film 240 and connected to one end and the other end of the active layer 210 through a hole provided in the inter-layer dielectric film 240 and the gate insulating film 220.

Although not shown, a light-shielding layer may additionally be formed below the active layer 210 to shield external light from entering the active layer 210.

Although the driving thin film transistor Tr of a top gate structure in which the gate electrode 230 is provided above the active layer 210 is shown, the present disclosure may include a driving thin film transistor Tr of a bottom gate structure in which the gate electrode 230 is provided below the active layer 210. The driving thin film transistor Tr may be changed in various ways known in the art.

A passivation layer 260 is formed on the source electrode 251 and the drain electrode 252, and a planarization layer 270 is formed on the passivation layer 260. Since a contact hole CH is provided in the passivation layer 260 and the planarization layer 270, the drain electrode 252 may be exposed through the contact hole CH. As the case may be, the source electrode 251 may be exposed through the contact hole CH.

The first electrode 300 is formed on the planarization layer 270. The first electrode 300 may serve as an anode. The first electrode 300 may be connected with the drain electrode 252 of the driving thin film transistor Tr through the contact hole CH formed in the passivation layer 260 and the planarization layer 270. However, as the case may be, the first electrode 300 may be connected with the source electrode 251 of the driving thin film transistor Tr through the contact hole CH formed in the passivation layer 260 and the planarization layer 270.

The bank 400 is formed at boundary areas among a plurality of subpixels in a matrix structure while covering edges of the first electrode 300, thereby defining a light emission area in each subpixel. That is, an area of the first electrode 300 exposed without being covered by the bank 400 becomes a light emission area.

The light emitting layer 500 may be formed on the first electrode 300. The light emitting layer 500 may be formed in each subpixel and a boundary area between the respective subpixels continuously without being disconnected.

The light emitting layer 500 may be provided to emit white light. If the light emitting layer 500 is provided to emit white light, the light emitting layer 500 may include a first stack 510, a second stack 530, and a charge generation layer 520 provided between the first stack 510 and the second stack 530.

Referring to FIG. 2, the first stack 510 may include, but is not limited to, a hole injecting layer 511, a first hole transporting layer 512, a first organic light emitting layer 513 emitting light of a first color, and a first electron transporting layer 514. The second stack 530 may include, but is not limited to, a second hole transporting layer 531, a second organic light emitting layer 532 emitting light of a second color, a second electron transporting layer 533, and an electron injecting layer 534. The charge generation layer 520 includes an N-type charge generation layer formed on an upper surface of the first stack 510 to supply electrons to the first stack 510, and a P-type charge generation layer formed on a lower surface of the second stack 530 to supply holes to the second stack 530.

The first organic light emitting layer 513 may include a luminescent material comprising a host material and a dopant material to emit light of a first color, for example, blue light or yellow-green light. The second organic light emitting layer 532 may include a luminescent material comprising a host material and a dopant material to emit light of a second color, for example, yellow-green light or blue light.

At this time, at least one compound of the aforementioned chemical formulas 1 to 3 and the compounds 1 to 119 may be used as the dopant material of the first organic light emitting layer 513 or the second organic light emitting layer 532. The chemical formulas 1 to 3 and the compounds 1 to 119 may be used as the dopant material of the organic light emitting layers 513 and 532 emitting green light, yellow-green light or red light.

Although not shown, the light emitting layer 500 may include three stacks emitting light of different colors, wherein each of the three stacks may include an organic light emitting layer that includes a host material and a dopant material to emit light of different colors.

Referring to FIG. 1 again, the second electrode 600 is formed on the light emitting layer 500. The second electrode 600 may serve as a cathode. The second electrode 600 may be formed in the plurality of subpixels and their boundary areas continuously without being disconnected.

If the electroluminescent display device according to one embodiment of the present disclosure is provided in a bottom emission type, the second electrode 600 may include a reflective electrode. If the electroluminescent display device according to one embodiment of the present disclosure is provided in a top emission type, the second electrode 600 may include a transparent electrode.

The encapsulation layer 700 is formed on the second electrode 600. The encapsulation layer 700 serves to prevent external water from being permeated into the light emitting layer 500. The encapsulation layer 700 may be made of an inorganic insulating material or a deposited structure of an inorganic insulating material and an organic insulating material, which are alternately deposited, but is not limited thereto.

Also, although not shown, according to one embodiment of the present disclosure, a color filter may be provided per subpixel. If the electroluminescent display device according to one embodiment of the present disclosure is provided in a bottom emission type, the color filter may be provided in the circuit element layer 200. If the electroluminescent display device according to one embodiment of the present disclosure is provided in a top emission type, the color filter may be provided over the second electrode 600.

If the color filter is provided in the circuit element layer 200, the color filter may be formed between the passivation layer 260 and the planarization layer 270, between the inter-layer dielectric film 240 and the passivation layer 260, or between the gate insulating film 220 and the inter-layer dielectric film 240.

If the color filter is provided over the second electrode 200, the color filter may be formed between the second electrode 200 and the encapsulation layer 700 or on the encapsulation layer 700.

Figure 3:
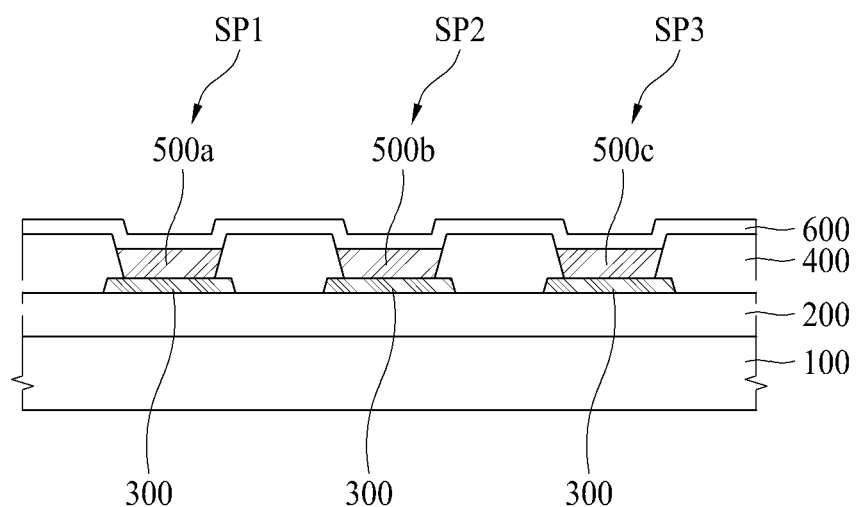
FIG. 3 is a schematic cross-sectional view illustrating an electroluminescent display device according to another embodiment of the present disclosure.
Figure 4:
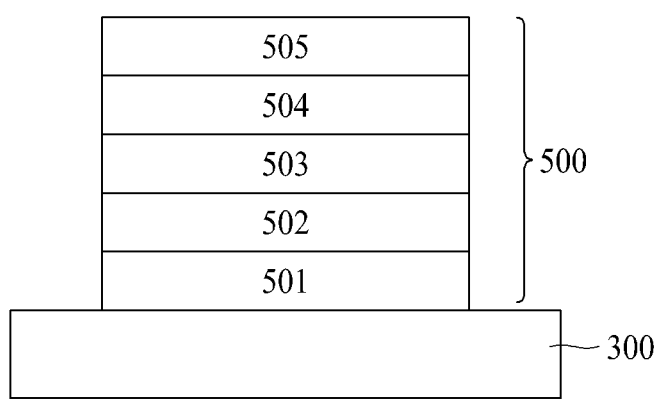
FIG. 4 is a cross-sectional view illustrating a structure of a light emitting layer according to another embodiment of the present disclosure.

FIG. 3 is a schematic cross-sectional view illustrating an electroluminescent display device according to another embodiment of the present disclosure, and FIG. 4 is a cross-sectional view illustrating a structure of a light emitting layer according to another embodiment of the present disclosure.

As noted from FIG. 3, the electroluminescent display device according to another embodiment of the present disclosure includes a substrate 100, a circuit element layer 200, a first electrode 300, a bank 400, light emitting layers 500$a$, 500$b$ and 500$c$, and a second electrode 600.

Since the substrate 100 and the circuit element layer 200 are the same those of the aforementioned embodiment, their repeated description will be omitted.

The first electrode 300 is formed per subpixels SP1, SP2 and SP3. Although not shown, the first electrode 300 is connected with the source electrode or the drain electrode of the driving thin film transistor provided in the circuit element layer 200 in the same manner as the aforementioned embodiment.

The bank 400 is provided at boundary areas among the subpixels SP1, SP2 and SP3 while covering both ends of the first electrode 300.

The light emitting layers 500$a$, 500$b$ and 500$c$ include a first light emitting layer 500$a$, a second light emitting layer 500$b$ and a third light emitting layer 500$c$, which are formed to be patterned per subpixels SP1, SP2 and SP3. The first light emitting layer 500$a$ is provided on the first electrode 300 of the first subpixel SP1, the second light emitting layer 500$b$ is provided on the first electrode 300 of the second subpixel SP2, and the third light emitting layer 500$c$ is provided on the first electrode 300 of the third subpixel SP3. The first light emitting layer 500$a$ may be made of, but not limited to, a red light emitting layer, the second light emitting layer 500$b$ may be made of, but not limited to, a green light emitting layer, and the third light emitting layer 500$c$ may be made of, but not limited to, a blue light emitting layer.

Referring to FIG. 4, each of the light emitting layers 500$a$, 500$b$ and 500$c$ may include, but is not limited to, a hole injecting layer 501, a hole transporting layer 502, an organic emitting layer 503, an electron transporting layer 504, and an electron injecting layer 505.

The organic light emitting layer 503 provided in the first light emitting layer 500$a$ may include a luminescent material comprising a host material and a dopant material to emit red light, the organic light emitting layer 503 provided in the second light emitting layer 500$b$ may include a luminescent material comprising a host material and a dopant material to emit green light, and the organic light emitting layer 503 provided in the third light emitting layer 500*c* may include a luminescent material comprising a host material and a dopant material to emit blue light.

At this time, at least one compound of the aforementioned chemical formulas 1 to 3 and the compounds 1 to 119 may be used as the dopant material of the organic light emitting layer 503. The chemical formulas 1 to 3 and the compounds 1 to 119 may be used as the dopant material of the organic light emitting layer 503 emitting green light, yellow-green light or red light.

Referring to FIG. 3 again, the second electrode 600 is formed on the light emitting layers 500*a*, 500*b* and 500*c* and the bank 400. In the same manner as the aforementioned embodiment, the second electrode 600 may serve as a cathode, and may be formed in the plurality of subpixels and their boundary areas continuously without being disconnected.

Although not shown, an encapsulation layer may additionally be formed on the second electrode 600 in the same manner as the aforementioned embodiment.

Hereinafter, a detailed example of manufacturing the luminescent material according to the present disclosure will be described.

1. Manufacture of Compound A

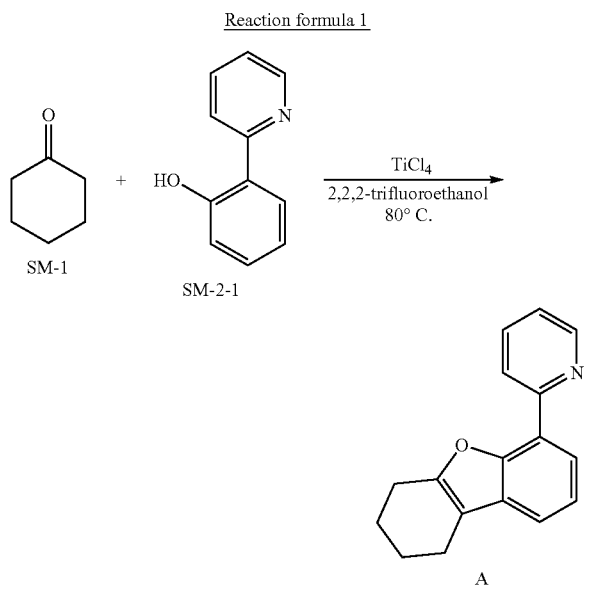

As noted from the above reaction formula 1, a start material SM-1 (4.91 g, 50 mmol), a start material SM-2 (8.56 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 80° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound A (9.35 g, yield: 75%) was manufactured.

2. Manufacture of Compound B

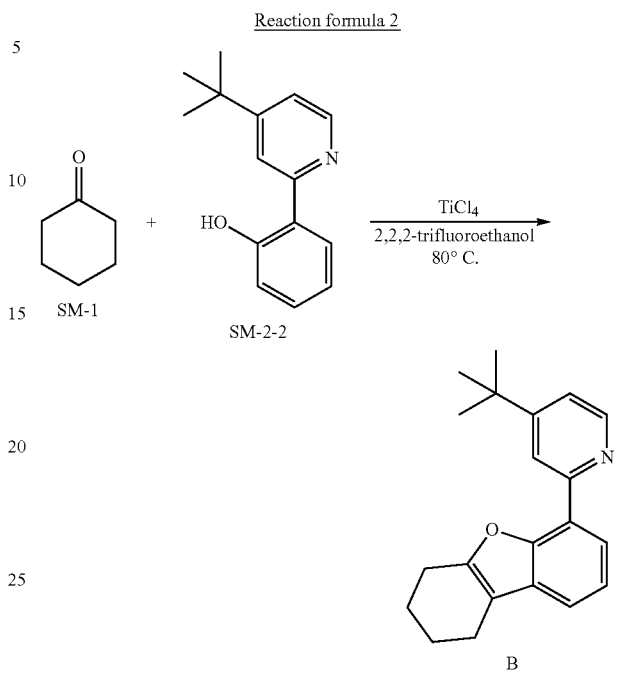

As noted from the above reaction formula 2, a start material SM-1 (4.91 g, 50 mmol), a start material SM-2 (11.4 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then stirred at 80° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound B (12.1 g, yield: 79%) was manufactured.

3. Manufacture of Compound C

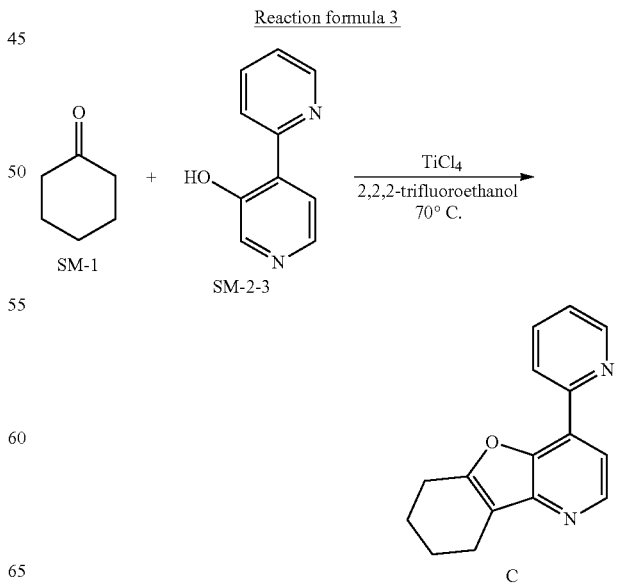

As noted from the above reaction formula 3, a start material SM-1 (4.91 g, 50 mmol), a start material SM-2 (8.61 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound C (9.01 g, yield: 72%) was manufactured.

4. Manufacture of Compound D

Reaction formula 4

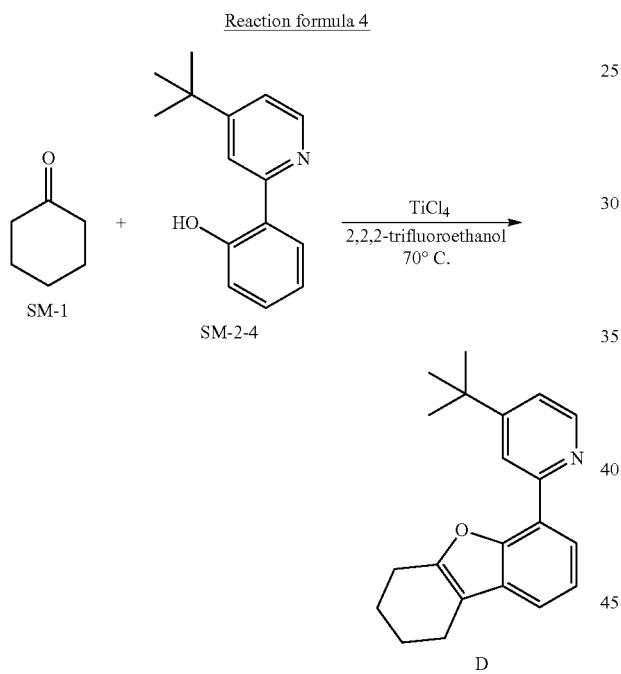

As noted from the above reaction formula 4, a start material SM-1 (4.91 g, 50 mmol), a start material SM-2 (11.4 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound D (12.1 g, yield: 79%) was manufactured.

5. Manufacture of Compound E

Reaction formula 5

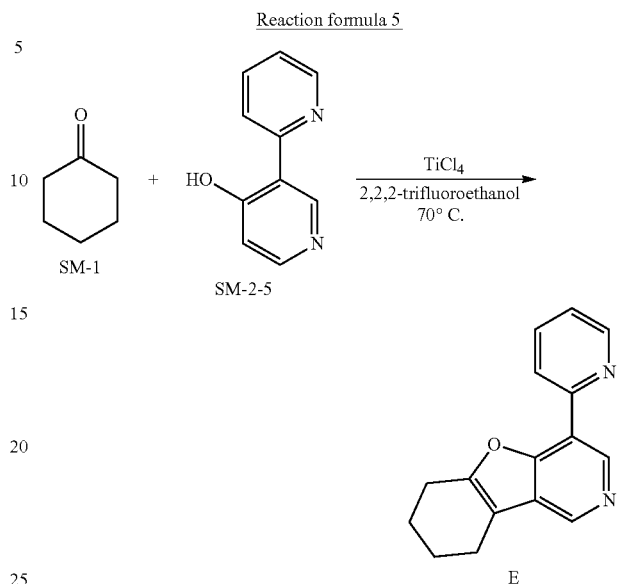

As noted from the above reaction formula 5, a start material SM-1 (4.91 g, 50 mmol), a start material SM-2 (8.61 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound E (9.26 g, yield: 74%) was manufactured.

6. Manufacture of Compound F

Reaction formula 6

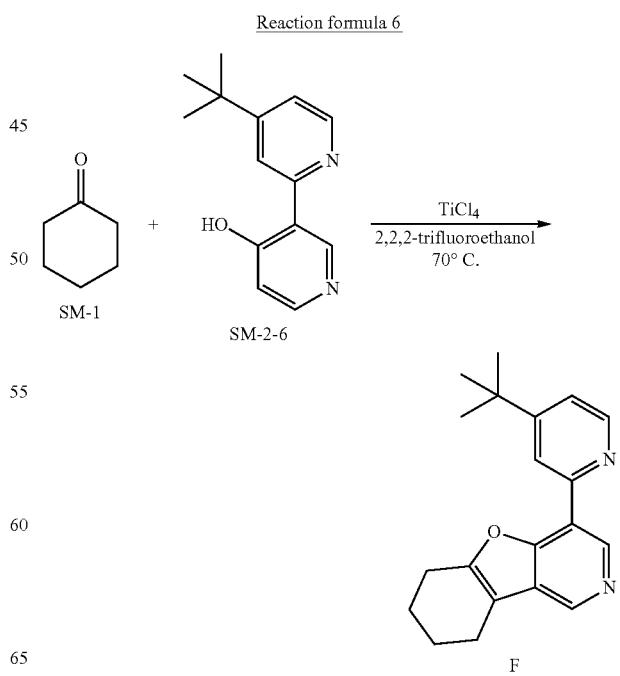

As noted from the above reaction formula 6, a start material SM-1 (4.91 g, 50 mmol), a start material SM-2 (11.4 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound F (11.5 g, yield: 75%) was manufactured.

7. Manufacture of Compound G

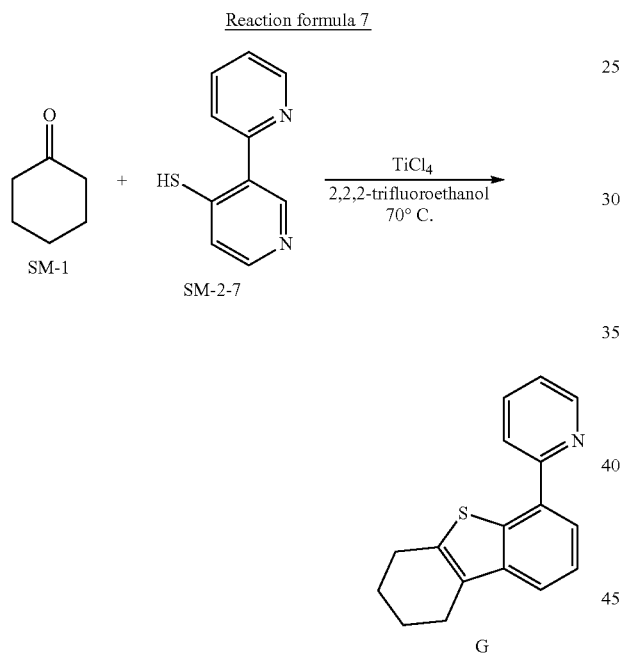

As noted from the above reaction formula 7, a start material SM-1 (4.91 g, 50 mmol), a start material SM-2 (9.37 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound G (10.2 g, yield: 77%) was manufactured.

8. Manufacture of Compound H

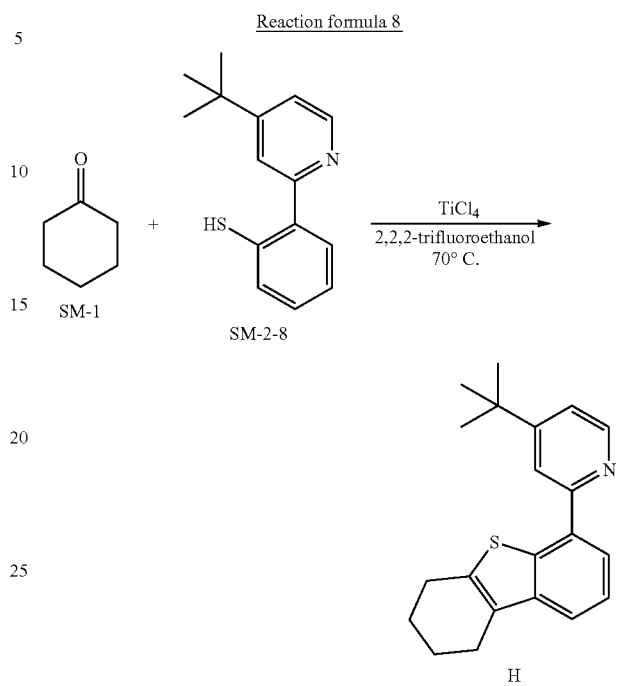

As noted from the above reaction formula 8, a start material SM-1 (4.91 g, 50 mmol), a start material SM-2 (12.2 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound H (11.4 g, yield: 71%) was manufactured.

9. Manufacture of Compound I

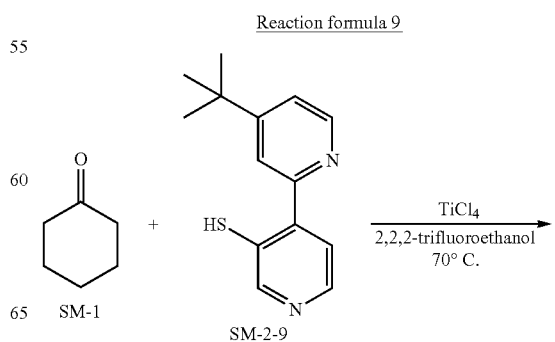

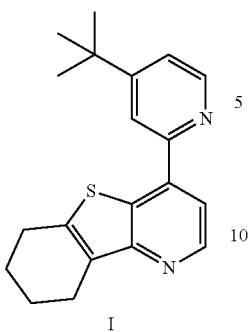

I

As noted from the above reaction formula 9, a start material SM-1 (4.91 g, 50 mmol), a start material SM-2 (12.2 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound I (11.4 g, yield: 71%) was manufactured.

10. Manufacture of Compound J

Reaction formula 10

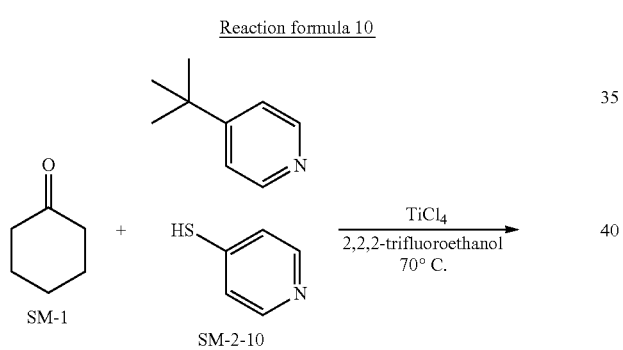

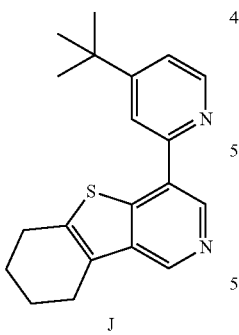

J

As noted from the above reaction formula 10, a start material SM-1 (4.91 g, 50 mmol), a start material SM-2 (12.2 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound J (10.6 g, yield: 66%) was manufactured.

11. Manufacture of Compound K

Reaction formula 11

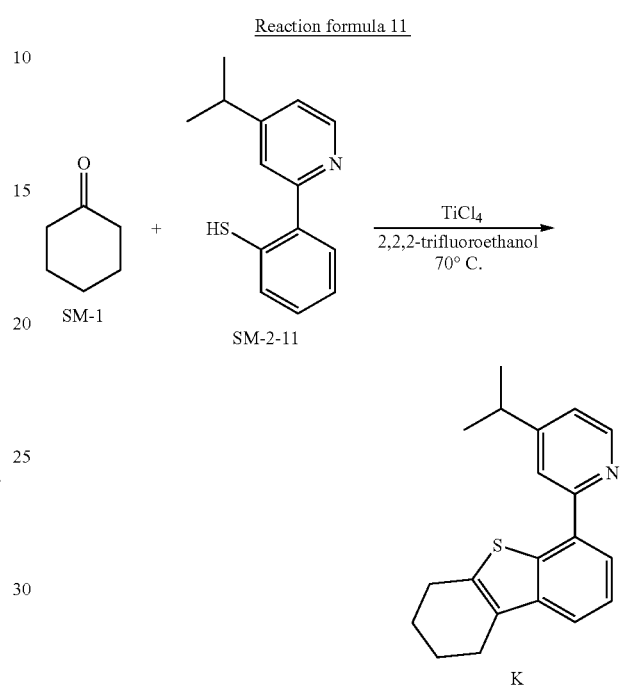

K

As noted from the above reaction formula 11, a start material SM-1 (4.91 g, 50 mmol), a start material SM-2 (11.5 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound K (10.8 g, yield: 70%) was manufactured.

12. Manufacture of Compound L

Reaction formula 12

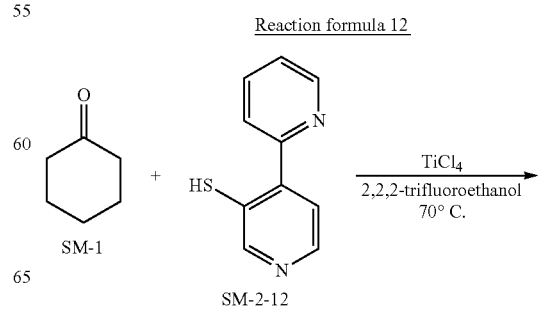

14. Manufacture of Compound N

Reaction formula 14

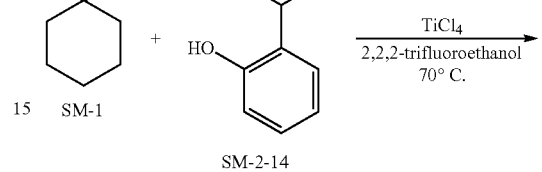

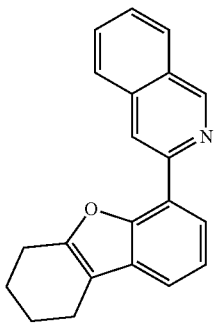

N

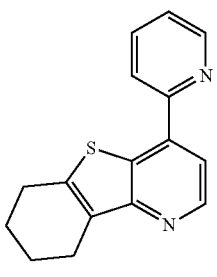

L

As noted from the above reaction formula 12, a start material SM-1 (4.91 g, 50 mmol), a start material SM-2 (9.41 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound L (10.1 g, yield: 76%) was manufactured.

13. Manufacture of Compound M

Reaction formula 13

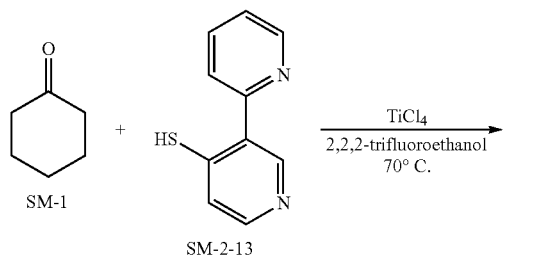

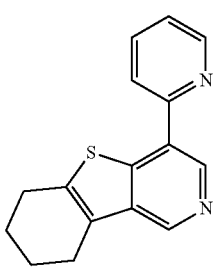

M

As noted from the above reaction formula 13, a start material SM-1 (4.91 g, 50 mmol), a start material SM-2 (9.41 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound M (9.46 g, yield: 71%) was manufactured.

As noted from the above reaction formula 14, a start material SM-1 (4.91 g, 50 mmol), a start material SM-2 (11.1 g, 50 mmol), and TiCl$_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound N (12.0 g, yield: 80%) was manufactured.

15. Manufacture of Compound O

Reaction formula 15

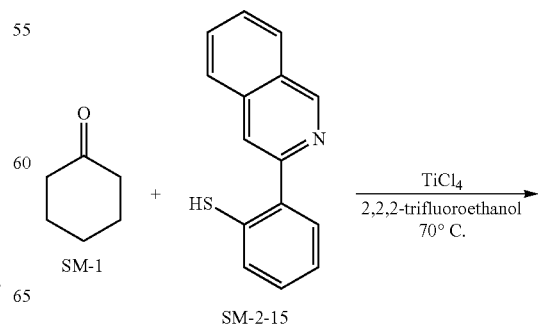

-continued

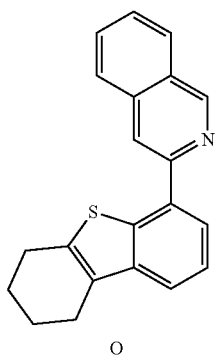

O

As noted from the above reaction formula 15, a start material SM-1 (4.91 g, 50 mmol), a start material SM-2 (11.9 g, 50 mmol), and $TiCl_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound O (11.4 g, yield: 72%) was manufactured.

16. Manufacture of Compound P

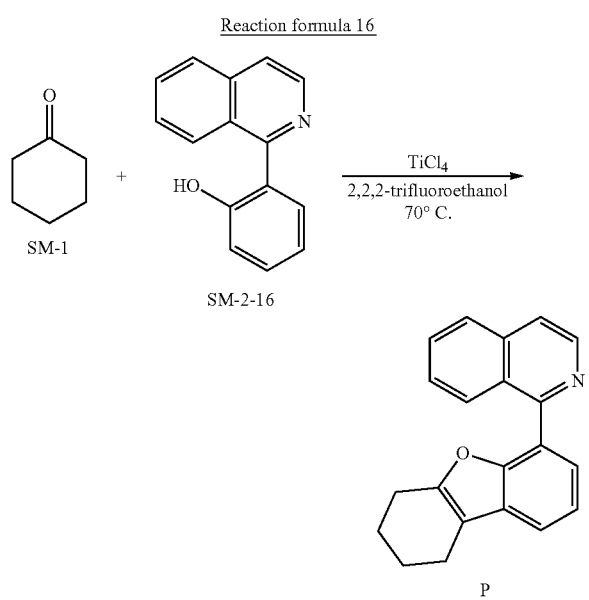

As noted from the above reaction formula 16, a start material SM-1 (4.91 g, 50 mmol), a start material SM-2 (11.1 g, 50 mmol), and $TiCl_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound P (10.3 g, yield: 69%) was manufactured.

17. Manufacture of Compound Q

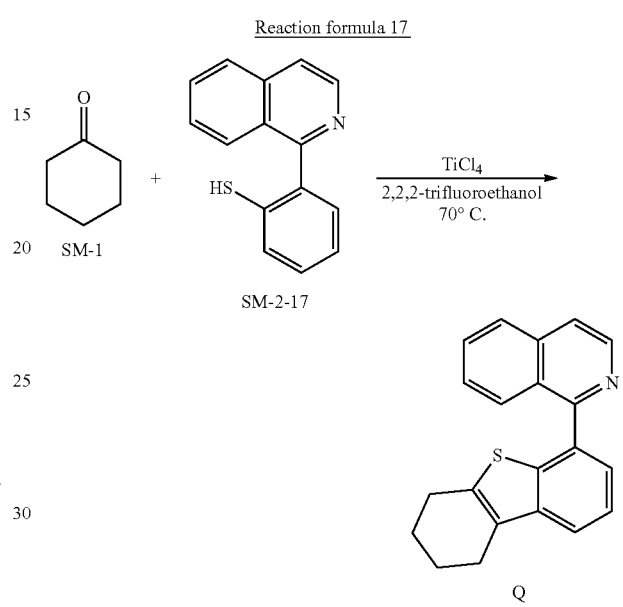

As noted from the above reaction formula 17, a start material SM-1 (4.91 g, 50 mmol), a start material SM-2 (11.9 g, 50 mmol), and $TiCl_4$ (9.50 g, 50 mmol) were dissolved in 2,2,2-trifluoroethanol of 200 ml in a rounded bottom flask of 500 ml under a nitrogen atmosphere and then heated and stirred at 70° C. for three hours. After the reaction was ended, the corresponding materials were cooled down at a room temperature, extracted with chloroform and washed with water. After water was removed by magnesium sulfate anhydrous, the materials were decompressed and concentrated and then subjected to column separation at a ratio of methylene chloride:hexane=1:3, whereby a compound Q (11.0 g, yield: 70%) was manufactured.

18. Manufacture of Compound R

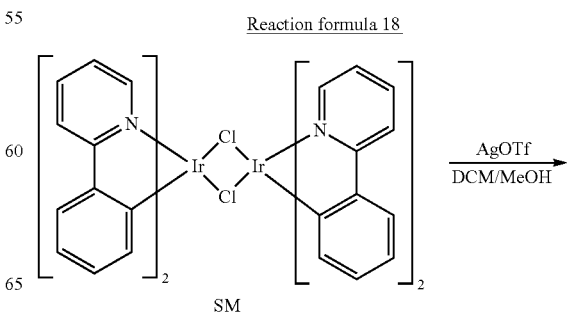

-continued

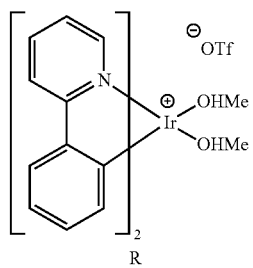

R

As noted from the above reaction formula 18, a start material SM (5.1 g, 4.8 mmol), silver trifluoromethanesulfonate (AgOTf, 3.6 g, 14.3 mmol) and dichloromethane were stirred in a rounded bottom flask of 1000 ml at a room temperature for 16 hours. After the reaction was ended, the corresponding material was filtered with celite to remove solid. The solvent was removed by decompression and distillation, whereby a solid compound R (5.7 g, yield: 84%) was obtained.

18. Manufacture of Compound S

Reaction formula 19

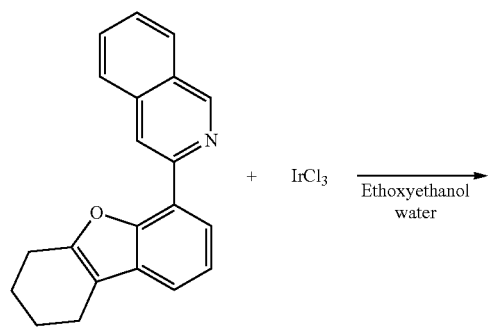

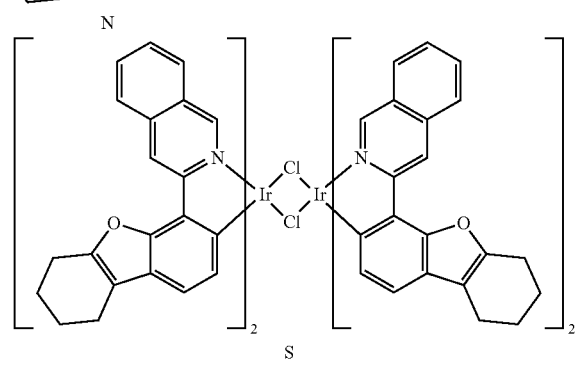

S

As noted from the above reaction formula 19, a compound N (17.3 g, 58 mmol), IrCl$_3$ (6.94 g, 23.2 mmol), and a mixed solvent (ethoxyethanol:water=90 ml:30 ml) were stirred in a rounded bottom flask of 250 ml at 130° C. for 16 hours. After the reaction was ended, the temperature was lowered to a room temperature, and a solid generated by adding methanol was decompressed and filtered. As a result, a solid compound S (15.3 g, yield: 80%) was obtained.

20. Manufacture of Compound T

Reaction formula 20

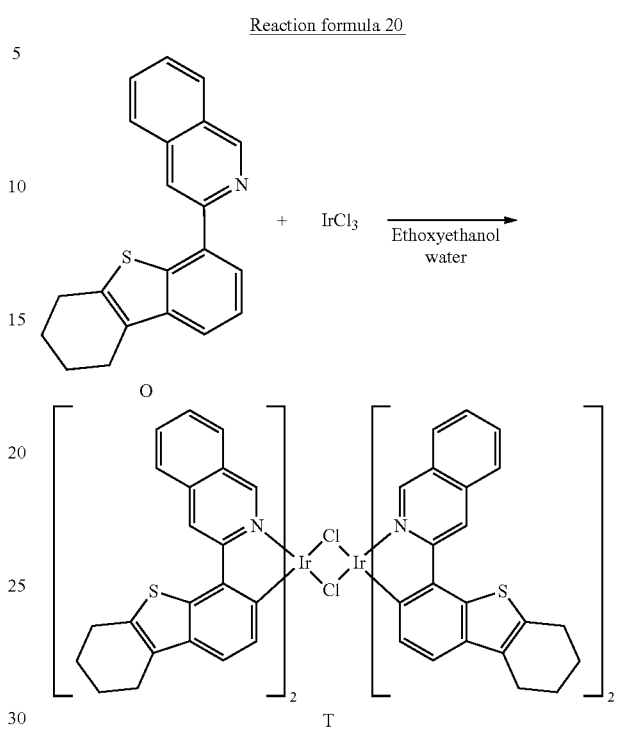

T

As noted from the above reaction formula 20, a compound O (18.3 g, 58 mmol), IrCl$_3$ (6.94 g, 23.2 mmol), and a mixed solvent (ethoxyethanol:water=90 ml:30 ml) were stirred in a rounded bottom flask of 250 ml at 130° C. for 16 hours. After the reaction was ended, the temperature was lowered to a room temperature, and a solid generated by adding methanol was decompressed and filtered. As a result, a solid compound T (15.5 g, yield: 78%) was obtained.

21. Manufacture of Compound U

Reaction formula 21

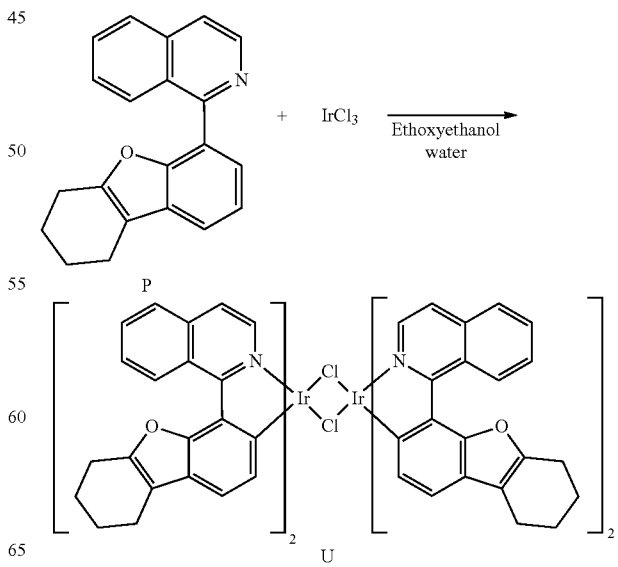

U

As noted from the above reaction formula 21, a compound P (17.3 g, 58 mmol), IrCl₃ (6.94 g, 23.2 mmol), and a mixed solvent (ethoxyethanol:water=90 ml:30 ml) were stirred in a rounded bottom flask of 250 ml at 130° C. for 16 hours. After the reaction was ended, the temperature was lowered to a room temperature, and a solid generated by adding methanol was decompressed and filtered. As a result, a solid compound U (14.4 g, yield: 75%) was obtained.

22. Manufacture of Compound V

Reaction formula 21

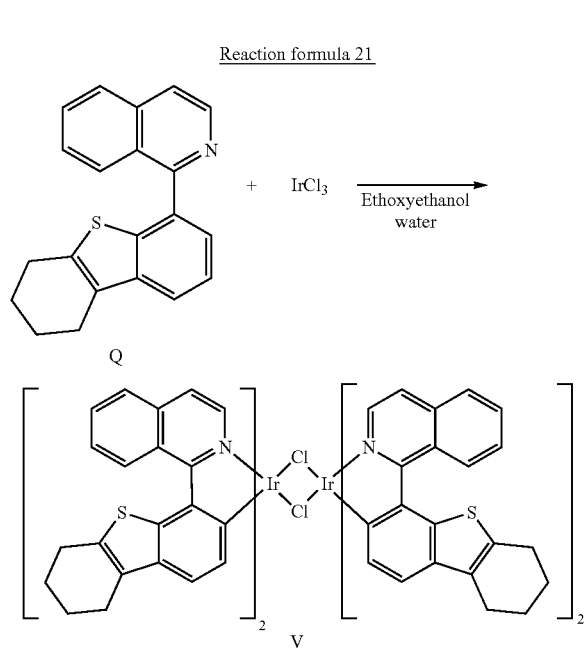

As noted from the above reaction formula 22, a compound Q (18.3 g, 58 mmol), IrCl₃ (6.94 g, 23.2 mmol), and a mixed solvent (ethoxyethanol:water=90 ml:30 ml) were stirred in a rounded bottom flask of 250 ml at 130° C. for 16 hours. After the reaction was ended, the temperature was lowered to a room temperature, and a solid generated by adding methanol was decompressed and filtered. As a result, a solid compound V (14.1 g, yield: 71%) was obtained.

23. Manufacture of Compound 1

Reaction formula 23

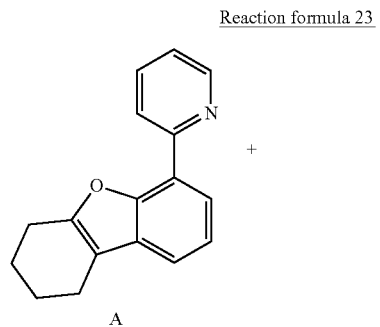

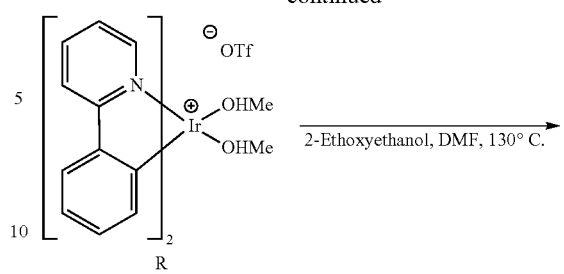

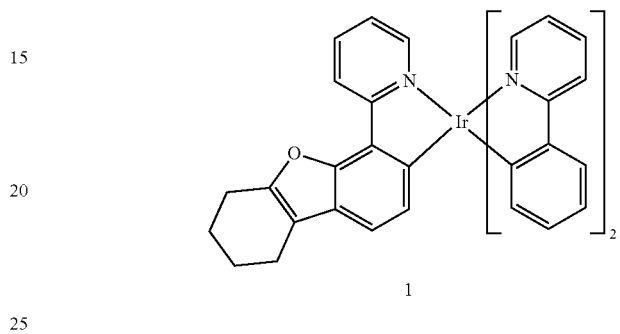

As noted from the above reaction formula 23, a compound A (0.92 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 1 (0.68 g, yield: 60%) was obtained.

24. Manufacture of Compound 5

Reaction formula 24

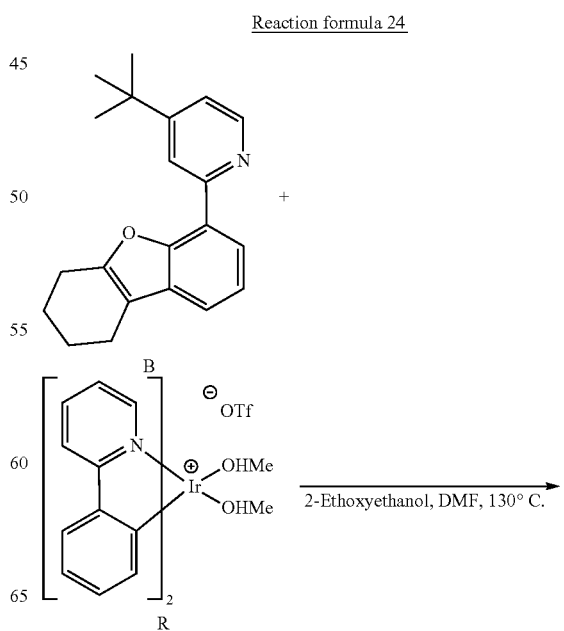

-continued

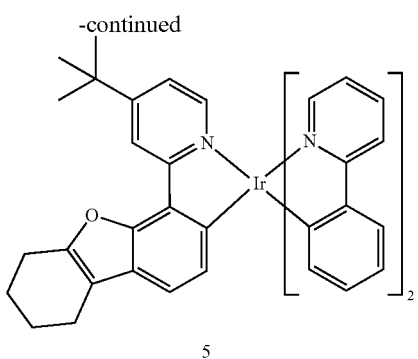

5

As noted from the above reaction formula 24, a compound B (1.13 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 5 (0.80 g, yield: 66%) was obtained.

25. Manufacture of Compound 16

Reaction formula 25

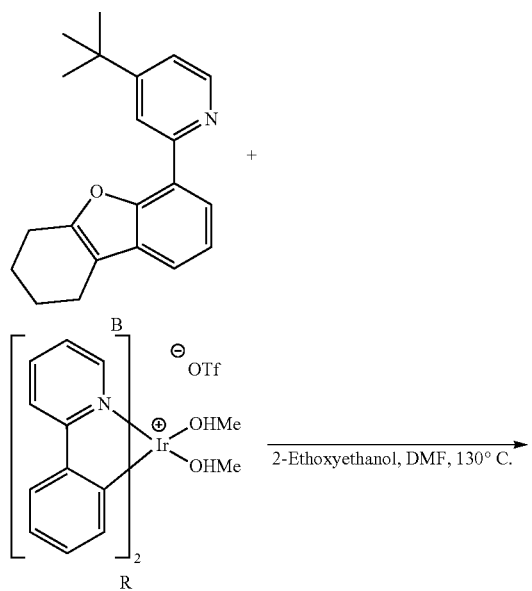

As noted from the above reaction formula 25, a compound C (0.92 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 16 (0.77 g, yield: 68%) was obtained.

26. Manufacture of Compound 17

Reaction formula 24

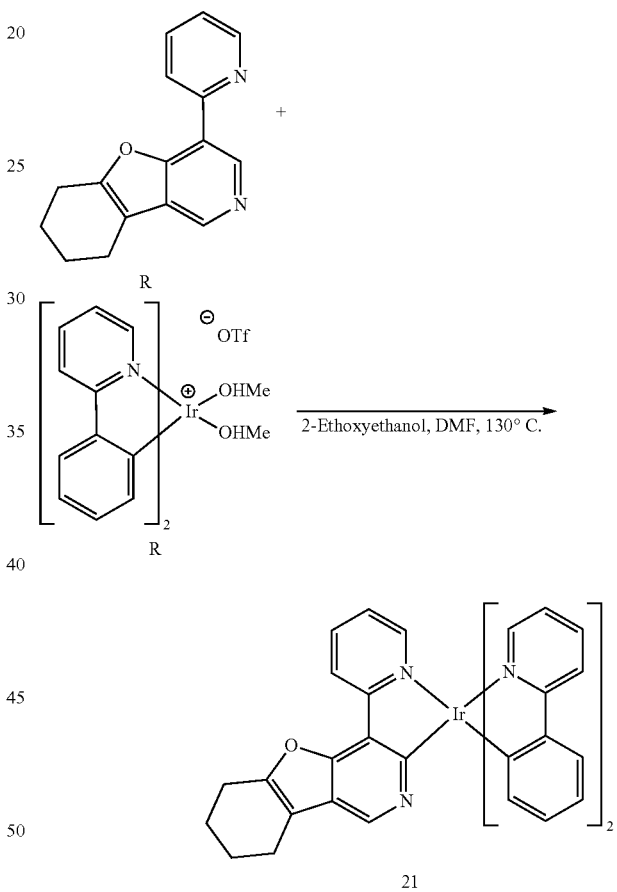

As noted from the above reaction formula 26, a compound D (1.13 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 17 (0.76 g, yield: 63%) was obtained.

27. Manufacture of Compound 21

Reaction formula 27

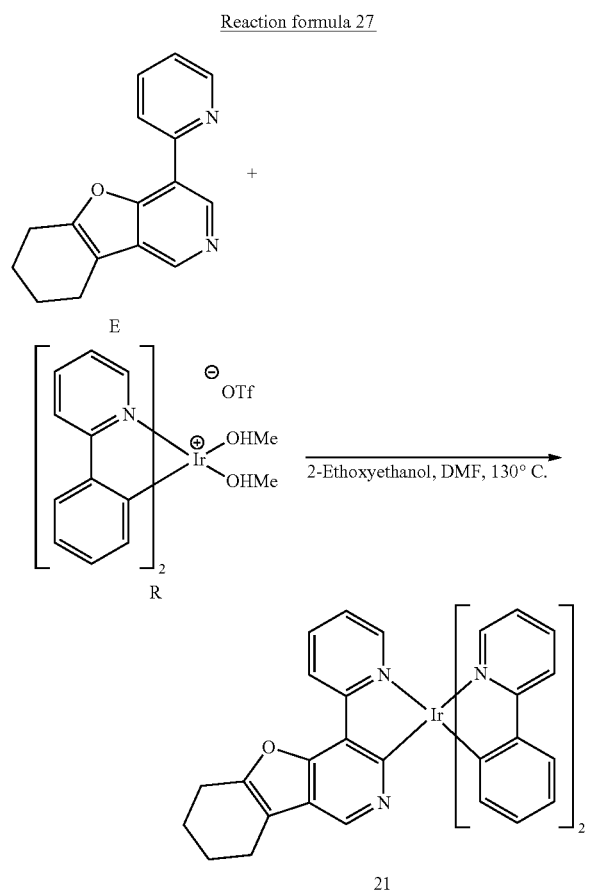

As noted from the above reaction formula 27, a compound E (0.92 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 21 (0.77 g, yield: 68%) was obtained.

28. Manufacture of Compound 22

Reaction formula 28

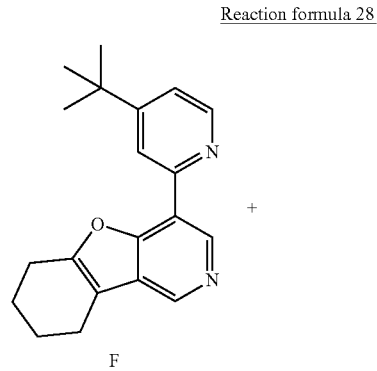

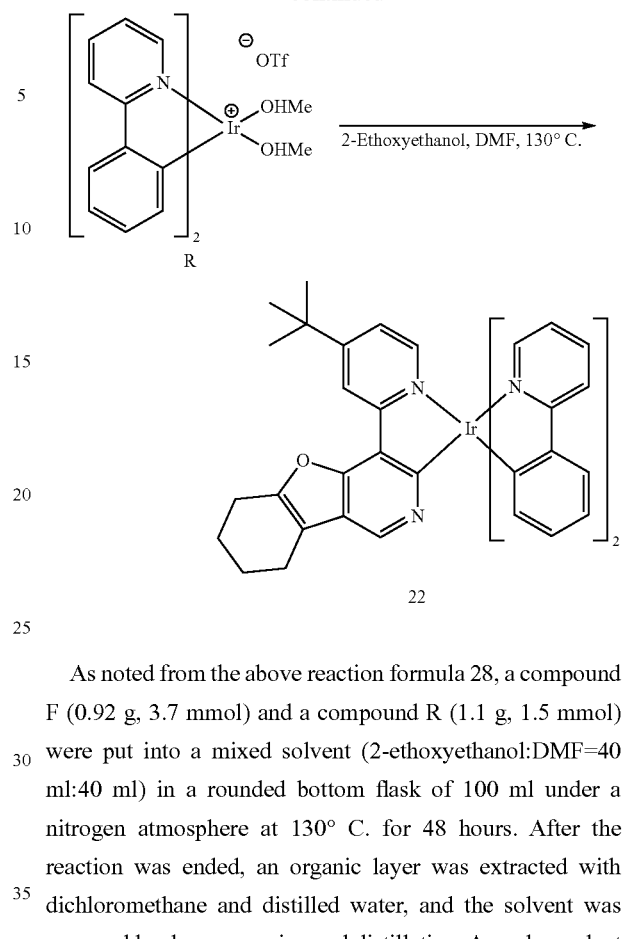

As noted from the above reaction formula 28, a compound F (0.92 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 22 (0.85 g, yield: 70%) was obtained.

29. Manufacture of Compound 26

Reaction formula 29

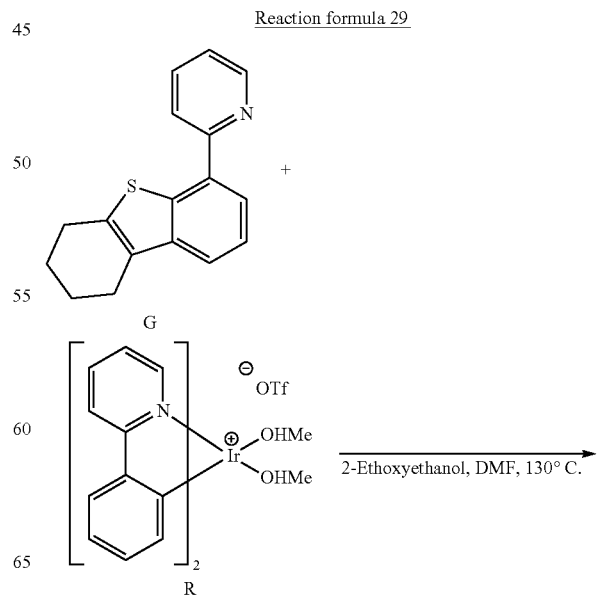

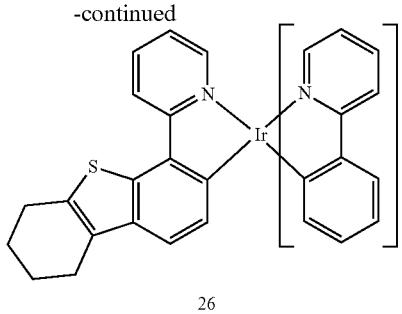

26

As noted from the above reaction formula 29, a compound G (0.98 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 26 (0.80 g, yield: 70%) was obtained.

30. Manufacture of Compound 27

As noted from the above reaction formula 30, a compound H (1.19 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 27 (0.89 g, yield: 72%) was obtained.

31. Manufacture of Compound 31

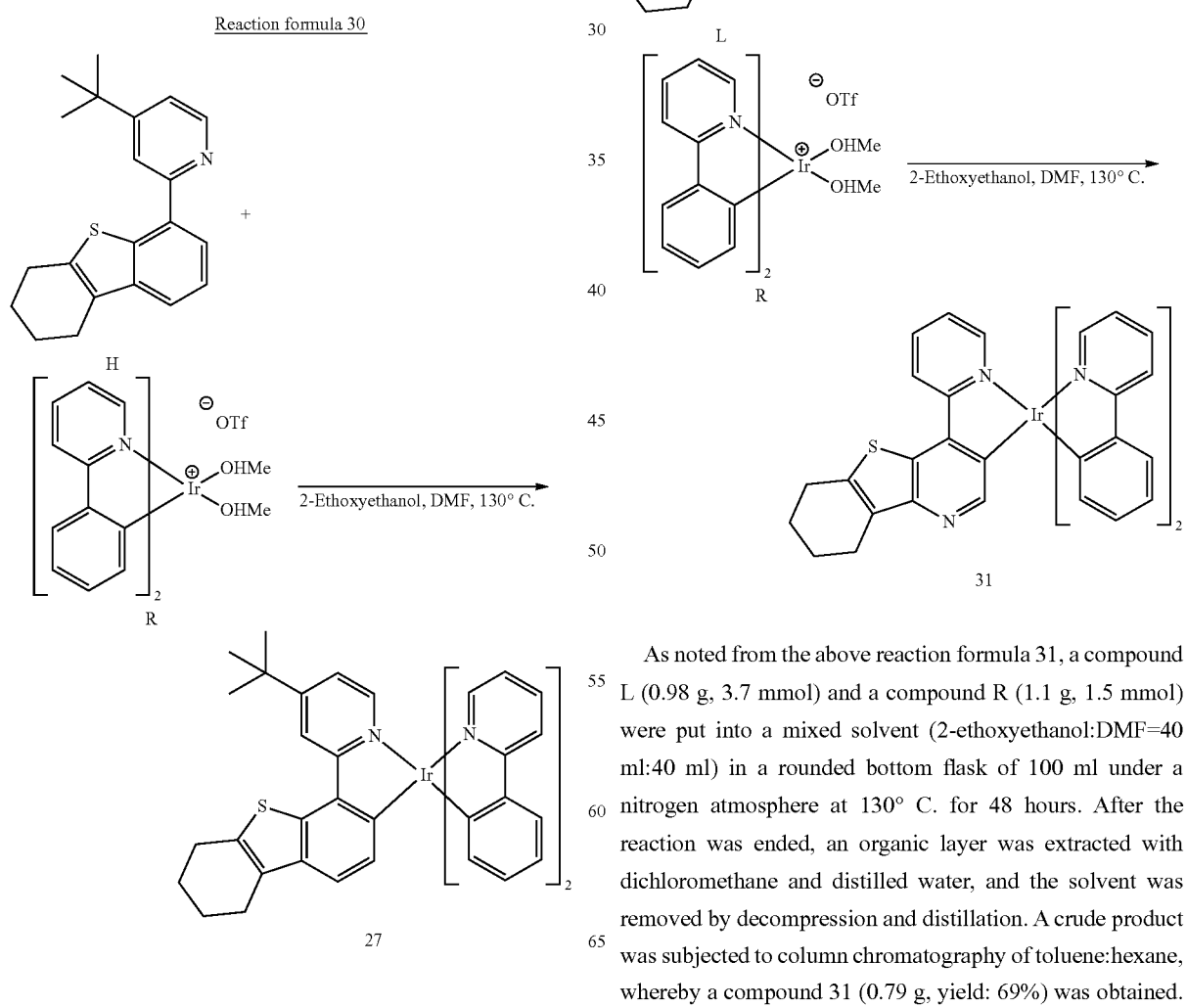

As noted from the above reaction formula 31, a compound L (0.98 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 31 (0.79 g, yield: 69%) was obtained.

32. Manufacture of Compound 32

Reaction formula 32

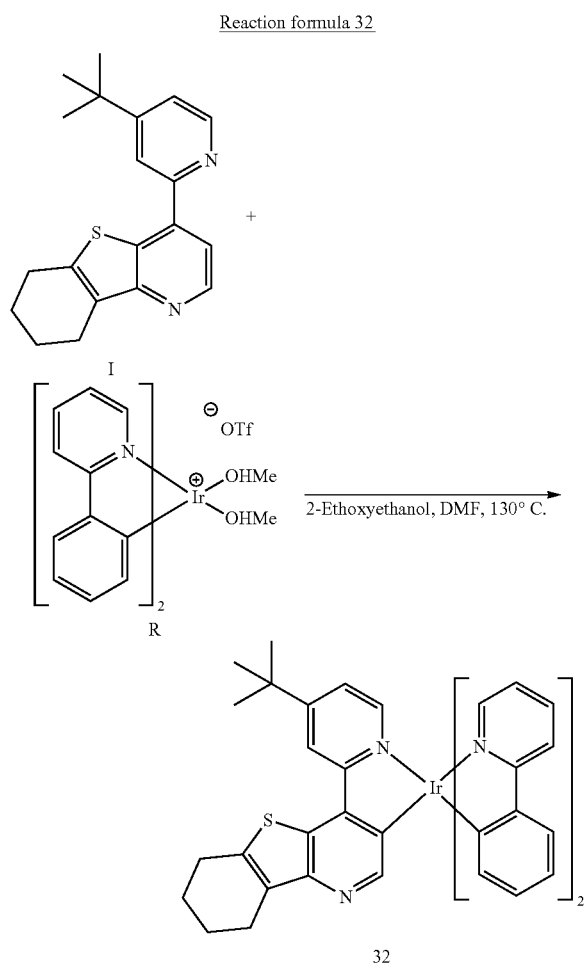

As noted from the above reaction formula 32, a compound I (1.19 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 32 (0.80 g, yield: 65%) was obtained.

33. Manufacture of Compound 36

Reaction formula 33

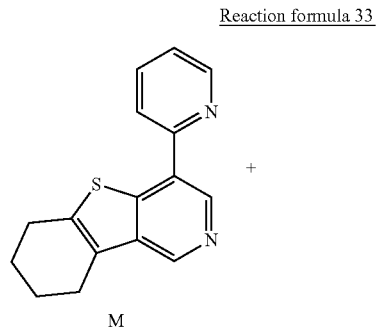

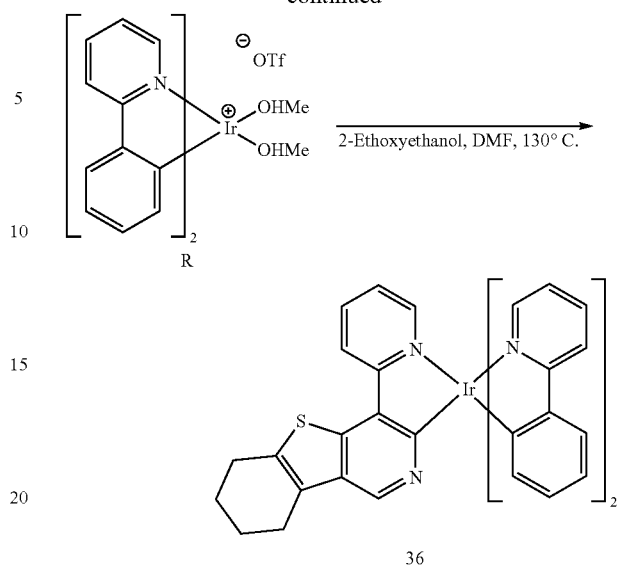

As noted from the above reaction formula 33, a compound M (0.98 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 36 (0.72 g, yield: 63%) was obtained.

34. Manufacture of Compound 37

Reaction formula 34

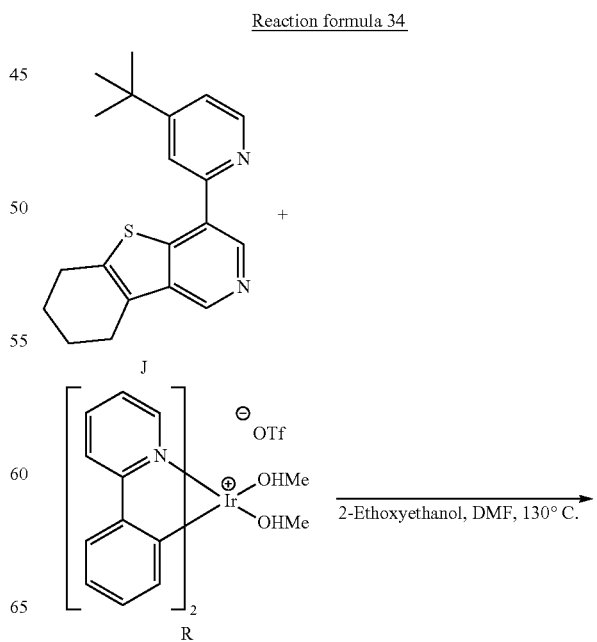

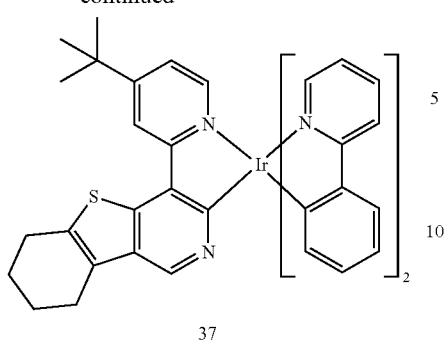

37

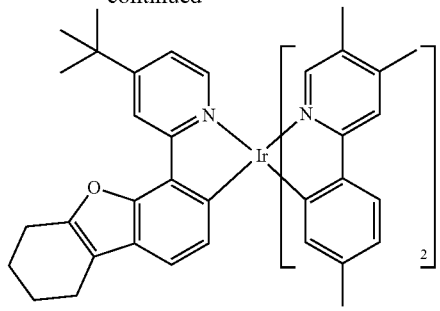

55

As noted from the above reaction formula 34, a compound J (1.19 g, 3.7 mmol) and a compound R (1.1 g, 1.5 mmol) were put into a mixed solvent (2-ethoxyethanol:DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 37 (0.74 g, yield: 60%) was obtained.

35. Manufacture of Compound 55

Reaction formula 35

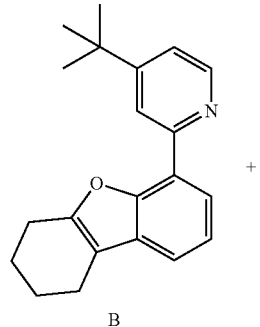

B

As noted from the above reaction formula 35, a compound B (1.13 g, 3.7 mmol) and a start material SM (1.35 g, 1.5 mmol) were put into a mixed solvent (2-ethoxyethanol: DMF=40 ml:40 ml) in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 55 (1.21 g, yield: 70%) was obtained.

36. Manufacture of Compound 65

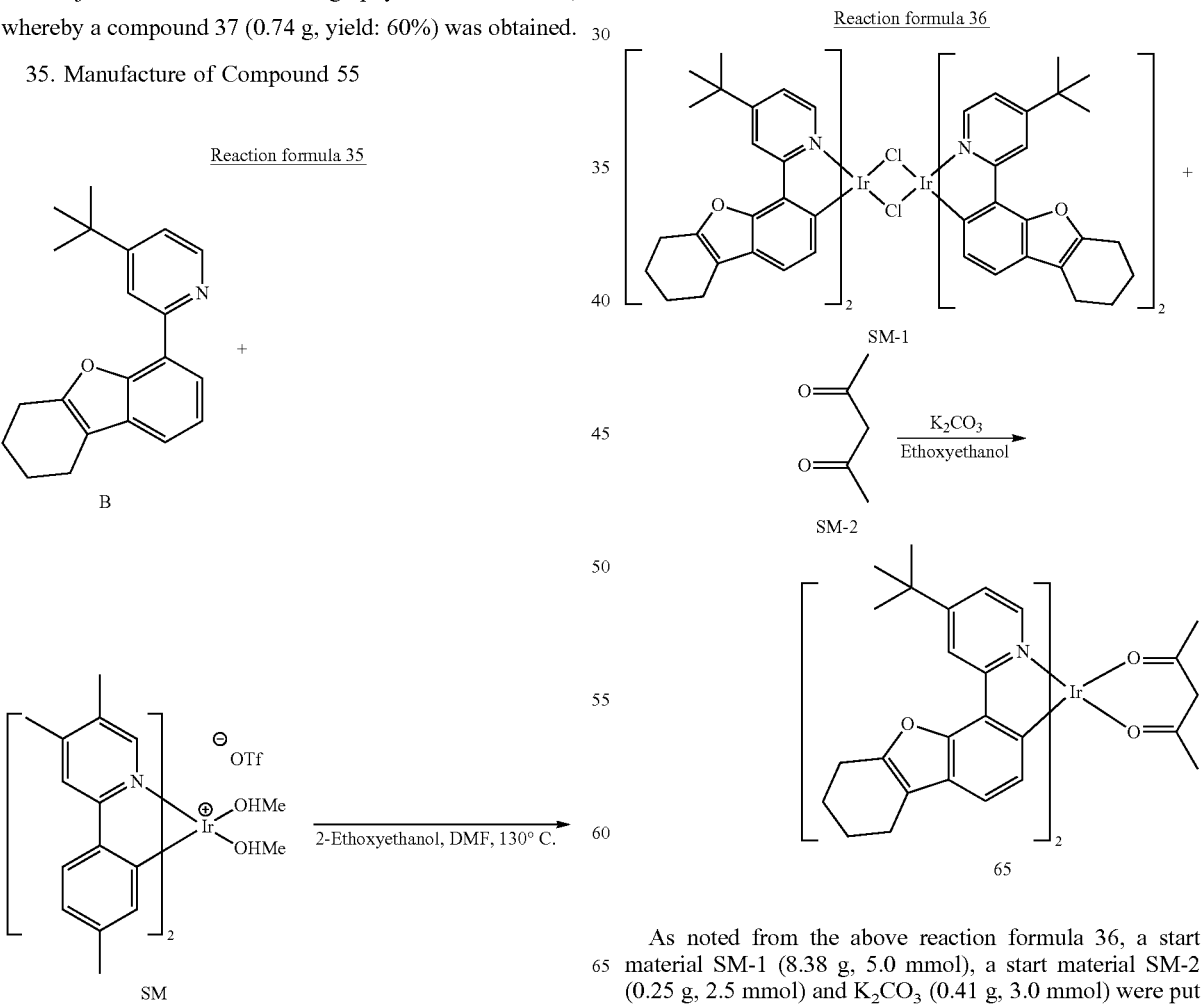

As noted from the above reaction formula 36, a start material SM-1 (8.38 g, 5.0 mmol), a start material SM-2 (0.25 g, 2.5 mmol) and K$_2$CO$_3$ (0.41 g, 3.0 mmol) were put into ethoxyethanol of 50 ml in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 65 (1.35 g, yield: 60%) was obtained.

37. Manufacture of Compound 70

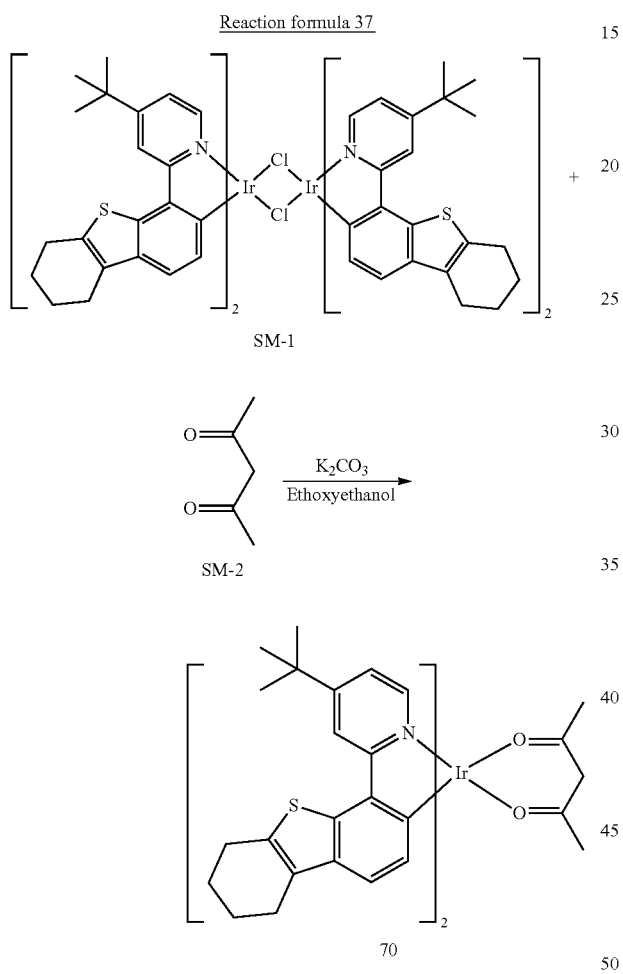

38. Manufacture of Compound 101

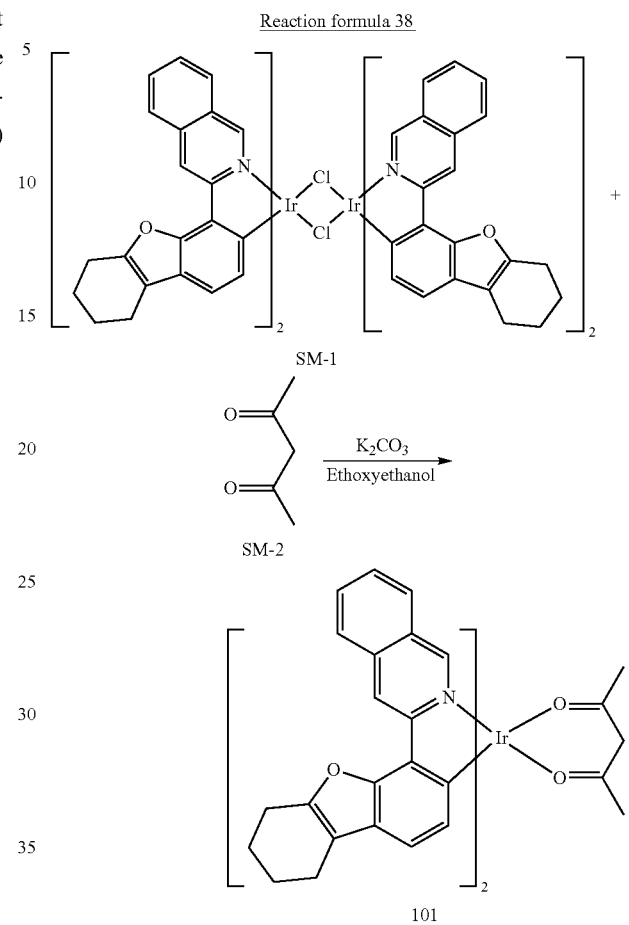

As noted from the above reaction formula 38, a start material SM-1 (8.24 g, 5.0 mmol), a start material SM-2 (0.25 g, 2.5 mmol) and K$_2$CO$_3$ (0.41 g, 3.0 mmol) were put into ethoxyethanol of 50 ml in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 101 (1.40 g, yield: 63%) was obtained.

39. Manufacture of Compound 106

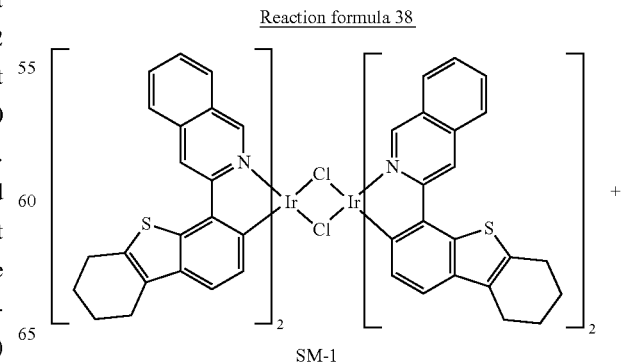

As noted from the above reaction formula 37, a start material SM-1 (8.70 g, 5.0 mmol), a start material SM-2 (0.25 g, 2.5 mmol) and K$_2$CO$_3$ (0.41 g, 3.0 mmol) were put into ethoxyethanol of 50 ml in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 70 (1.49 g, yield: 64%) was obtained.

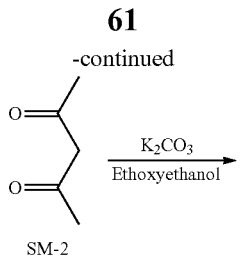

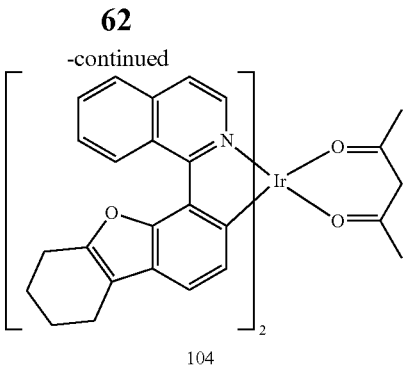

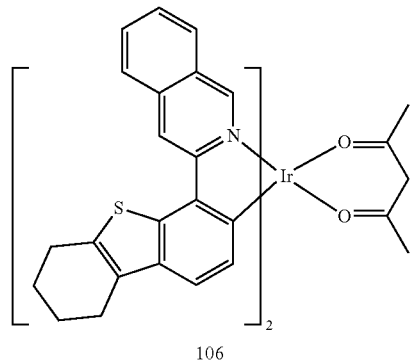

As noted from the above reaction formula 40, a start material SM-1 (8.24 g, 5.0 mmol), a start material SM-2 (0.25 g, 2.5 mmol) and K₂CO₃ (0.41 g, 3.0 mmol) were put into ethoxyethanol of 50 ml in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 104 (1.47 g, yield: 66%) was obtained.

41. Manufacture of Compound 109

Reaction formula 41

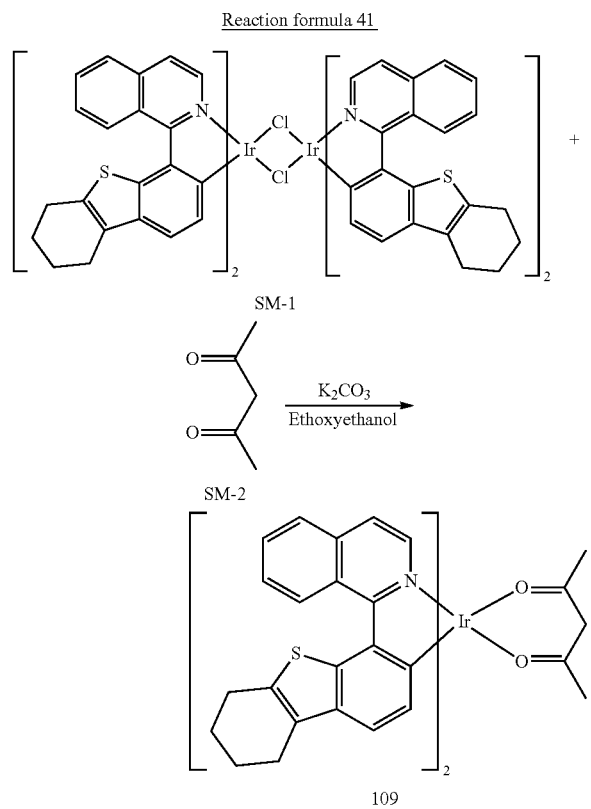

As noted from the above reaction formula 39, a start material SM-1 (8.57 g, 5.0 mmol), a start material SM-2 (0.25 g, 2.5 mmol) and K₂CO₃ (0.41 g, 3.0 mmol) were put into ethoxyethanol of 50 ml in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 106 (1.61 g, yield: 70%) was obtained.

40. Manufacture of Compound 104

Reaction formula 40

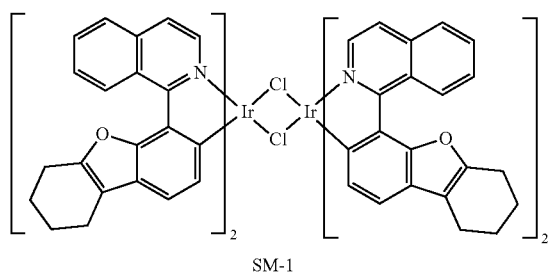

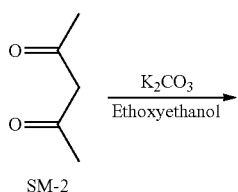

As noted from the above reaction formula 41, a start material SM-1 (8.57 g, 5.0 mmol), a start material SM-2 (0.25 g, 2.5 mmol) and K₂CO₃ (0.41 g, 3.0 mmol) were put into ethoxyethanol of 50 ml in a rounded bottom flask of 100 ml under a nitrogen atmosphere at 130° C. for 48 hours. After the reaction was ended, an organic layer was extracted with dichloromethane and distilled water, and the solvent was removed by decompression and distillation. A crude product was subjected to column chromatography of toluene:hexane, whereby a compound 109 (1.59 g, yield: 69%) was obtained.

Hereinafter, detailed embodiments of the electroluminescent display device according to the present disclosure will be described.

Embodiment 1

After a glass substrate coated with ITO thin film of a thickness of 1,000 Å was washed, the glass substrate was washed with a solvent such as isopropyl alcohol, acetone and methanol by ultrasonic cleaning and then dried. In this way, an ITO transparent electrode was prepared, and HI-1 was deposited on the ITO transparent electrode at a thickness of 60 nm by thermal vacuum as a hole injecting material and then NPB was deposited at a thickness of 80 nm as a hole transporting material. Then, a light emitting layer was formed using the compound 1 obtained by the aforementioned reaction formula 23 as a dopant and using CBP as a host. At this time, a doping concentration was 5%, and a doping thickness was 30 nm. Subsequently, after a compound of ET-1:Liq (1:1) (30 nm) was deposited by thermal vacuum as a material of each of an electron transporting layer and an electron injecting layer, aluminum of 100 nm was deposited to form a cathode, whereby the electroluminescent display device according to the embodiment 1 was manufactured.

HI-1

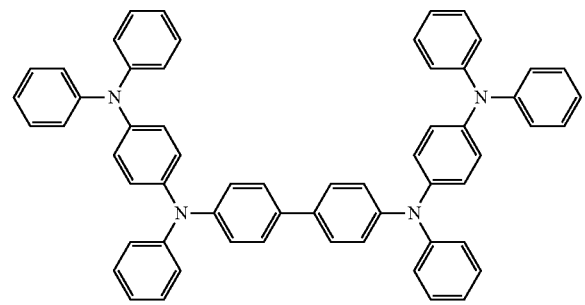

NPB

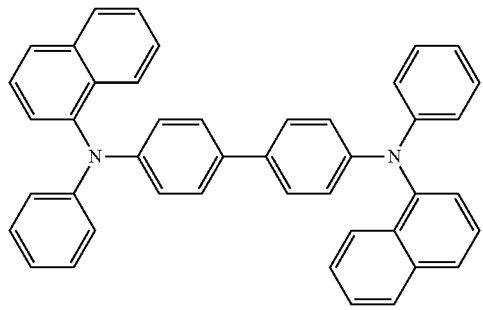

CBP

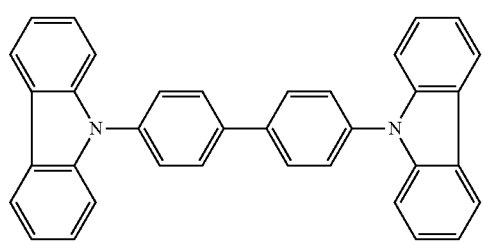

ET-1

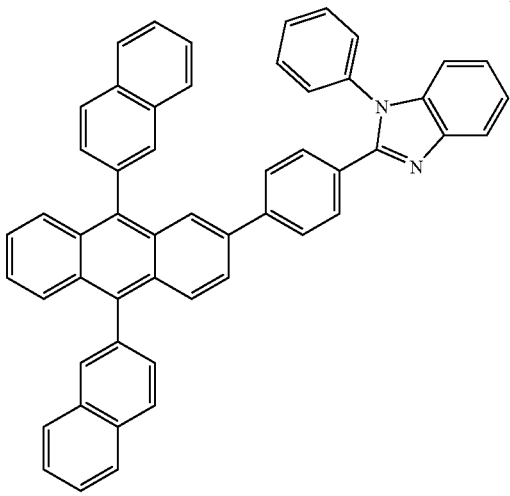

Liq

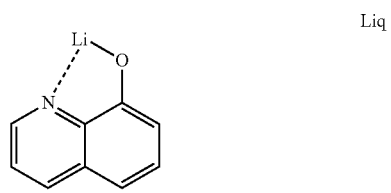

Embodiments 2 to 7

The electroluminescent display device according to the embodiments 2 to 7 was manufactured by the same method as that of the embodiment 1 except that a compound of Table 1 below is used as a dopant of a light emitting layer instead of the compound 1.

Comparison Examples 1 and 2

The electroluminescent display device according to the comparison example 1 was manufactured by the same method as that of the embodiment 1 except that the following compound I is used as a dopant of a light emitting layer instead of the compound 1, and the electroluminescent display device according to the comparison example 2 was manufactured by the same method as that of the embodiment 1 except that the following compound II is used as a dopant of a light emitting layer instead of the compound 1.

I

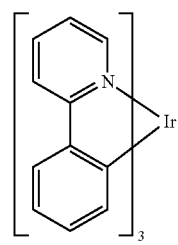

-continued

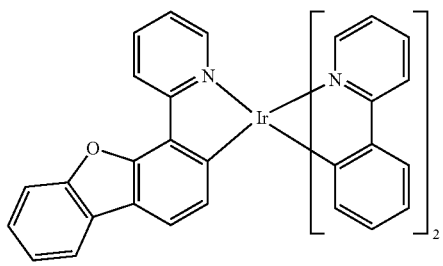

II

TABLE 1

|  | dopant | Driving voltage (V) | Maximum emission quantum efficiency (%, relative value) | EQE (%, relative value) | LT95 (%, relative value) |
|---|---|---|---|---|---|
| Comparison Example 1 | Compound I | 4.25 | 100 | 100 | 100 |
| Comparison Example 2 | Compound II | 4.24 | 108 | 107 | 108 |
| Embodiment 1 | Compound 1 | 4.23 | 122 | 111 | 136 |
| Embodiment 2 | Compound 5 | 4.24 | 121 | 115 | 127 |
| Embodiment 3 | Compound 26 | 4.25 | 119 | 108 | 129 |
| Embodiment 4 | Compound 27 | 4.23 | 121 | 116 | 132 |
| Embodiment 5 | Compound 55 | 4.26 | 122 | 114 | 129 |
| Embodiment 6 | Compound 65 | 4.22 | 124 | 118 | 133 |
| Embodiment 7 | Compound 70 | 4.25 | 124 | 121 | 137 |

In Table 1 above and Tables 2 and 3 below, EQE means external quantum efficiency, and LT95 means the time required for luminance to be reduced to 95%.

As noted from Table 1, according to comparison between the comparison examples 1 and 2 in which the compounds I and II with which a benzene ring is combined at a lower left end of Ir are used as dopants of a light emitting layer and the embodiments 1 to 7 in which the compounds 1, 5, 26, 27, 55, 65 and 70 with which a benzene ring is not combined at a lower left end of Ir are used as dopants of a light emitting layer, there is no big difference in a driving voltage between the comparison examples 1 and 2 and the embodiments 1 to 7. However, it is noted that maximum emission quantum efficiency, EQE and LT95 in the embodiments 1 to 7 are more excellent than those of the comparison examples 1 and 2. The light emitting layer applied to the embodiments 1 to 7 emits green light or yellow-green light.

Embodiments 8 to 15

The electroluminescent display device according to the embodiments 8 to 15 was manufactured by the same method as that of the embodiment 1 except that a compound of Table 2 below was used as a dopant of a light emitting layer instead of the compound 1.

Comparison Example 3

The electroluminescent display device according to the comparison example 3 was manufactured by the same method as that of the embodiment 1 except that the following compound III was used as a dopant of a light emitting layer instead of the compound 1.

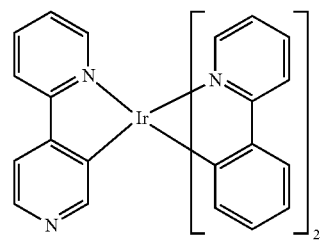

III

TABLE 2

|  | dopant | Driving voltage (V) | Maximum emission quantum efficiency (%, relative value) | EQE (%, relative value) | LT95 (%, relative value) |
|---|---|---|---|---|---|
| Comparison Example 3 | Compound III | 4.31 | 100 | 100 | 100 |
| Embodiment 8 | Compound 16 | 4.29 | 121 | 118 | 142 |
| Embodiment 9 | Compound 17 | 4.30 | 122 | 120 | 148 |
| Embodiment 10 | Compound 21 | 4.27 | 124 | 118 | 145 |
| Embodiment 11 | Compound 22 | 4.33 | 121 | 121 | 141 |
| Embodiment 12 | Compound 31 | 4.30 | 123 | 117 | 147 |
| Embodiment 13 | Compound 32 | 4.28 | 124 | 122 | 142 |

TABLE 2-continued

| | dopant | Driving voltage (V) | Maximum emission quantum efficiency (%, relative value) | EQE (%, relative value) | LT95 (%, relative value) |
|---|---|---|---|---|---|
| Embodiment 14 | Compound 36 | 4.28 | 122 | 119 | 145 |
| Embodiment 15 | Compound 37 | 4.29 | 127 | 124 | 146 |

As noted from Table 2, according to comparison between the comparison example 3 in which the compound III with which a benzene ring is combined at a lower left end of Ir is used as a dopant of a light emitting layer and the embodiments 8 to 15 in which the compounds 16, 17, 21, 22, 31, 32, 36 and 37 with which a benzene ring is not combined at a lower left end of Ir are used as dopants of a light emitting layer, there is no big difference in a driving voltage between the comparison example 3 and the embodiments 8 to 15. However, it is noted that maximum emission quantum efficiency, EQE and LT95 in the embodiments 8 to 15 are more excellent than those of the comparison example 3. The light emitting layer applied to the embodiments 8 to 15 emits green light or yellow-green light.

Embodiments 16 to 19

The electroluminescent display device according to the embodiments 16 to 19 was manufactured by the same method as that of the embodiment 1 except that a compound of Table 3 below was used as a dopant of a light emitting layer instead of the compound 1.

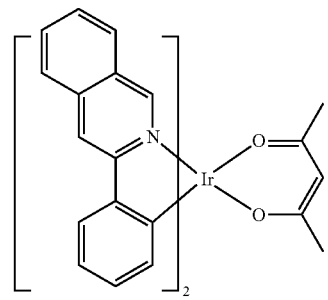

IV

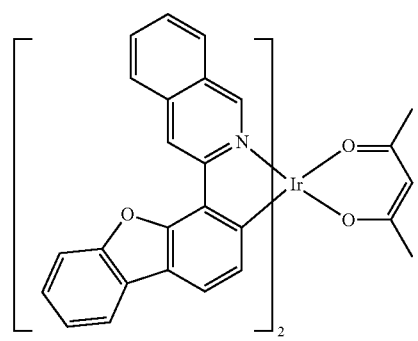

V

TABLE 3

| | dopant | Driving voltage (V) | Maximum emission quantum efficiency (%, relative value) | EQE (%, relative value) | LT95 (%, relative value) |
|---|---|---|---|---|---|
| Comparison Example 4 | Compound IV | 4.31 | 100 | 100 | 100 |
| Comparison Example 5 | Compound V | 4.33 | 109 | 105 | 102 |
| Embodiment 16 | Compound 101 | 4.30 | 127 | 119 | 132 |
| Embodiment 17 | Compound 106 | 4.26 | 122 | 121 | 133 |
| Embodiment 18 | Compound 104 | 4.31 | 124 | 118 | 133 |
| Embodiment 19 | Compound 109 | 4.27 | 126 | 120 | 134 |

Comparison Examples 4 and 5

The electroluminescent display device according to the comparison example 4 was manufactured by the same method as that of the embodiment 1 except that the following compound IV was used as a dopant of a light emitting layer instead of the compound 1, and the electroluminescent display device according to the comparison example 5 was manufactured by the same method as that of the embodiment 1 except that the following compound V was used as a dopant of a light emitting layer instead of the compound 1.

As noted from Table 3, according to comparison between the comparison examples 4 and 5 in which the compound III with which a benzene ring is combined at a lower left end of Ir is used as a dopant of a light emitting layer and the embodiments 16 to 19 in which the compounds 101, 106, 104 and 109 with which a benzene ring is not combined at a lower left end of Ir are used as dopants of a light emitting layer, there is no big difference in a driving voltage between the comparison examples 4 and 5 and the embodiments 16 to 19. However, it is noted that maximum emission quantum efficiency, EQE and LT95 in the embodiments 16 to 19 are more excellent than those of the comparison examples 4 and 5. The light emitting layer applied to the embodiments 16 to 19 emits red light.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A luminescent material comprising a compound expressed by the following chemical formula 1:

Chemical formula 1

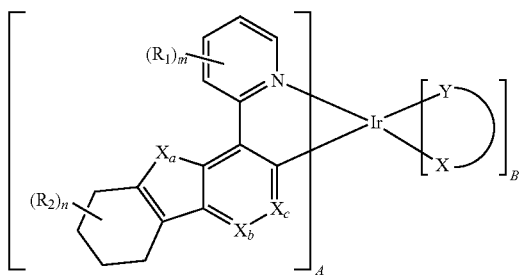

in the chemical formula 1, $X_a$ is selected from oxygen or sulfur;

$X_b$ and $X_c$ are independently selected from nitrogen or carbon;

$R_1$ and $R_2$ are independently selected from the group consisting of hydrogen, heavy hydrogen, —F, —Cl, —Br, —I, hydroxyl group, cyano group, nitro group, amidino group, hydrazine group, hydrazone group, alkyl group of substituted or unsubstituted $C_1$-$C_{20}$, alkenyl group of substituted or unsubstituted $C_2$-$C_{20}$, alkynyl group of substituted or unsubstituted $C_2$-$C_{20}$, heteroalkyl group of substituted or unsubstituted $C_1$-$C_{20}$, aralkyl group of substituted or unsubstituted $C_7$-$C_{20}$, aryl group of substituted or unsubstituted $C_6$-$C_{30}$, heteroaryl group of substituted or unsubstituted $C_3$-$C_{30}$, and heteroaralkyl group of substituted or unsubstituted $C_3$-$C_{20}$;

m is selected from integers of 1 to 4;

two or more $R_1$ are equal to or different from one another if m is 2 or more;

two $R_1$, which are combined with adjacent carbons, are optionally combined with each other to form a ring;

n is selected from integers of 1 to 8;

two or more $R_2$ are equal to or different from one another if n is 2 or more;

two $R_2$, which are combined with adjacent carbons, are optionally combined with each other to form a ring;

two $R_2$, which are combined with a same carbon, are optionally combined with each other to form a ring;

X-Y is an auxiliary ligand; and

A and B indicate values of ligands combined with iridium, wherein A is an integer of 1 to 3, B is an integer of 0 to 2, and a sum of A and B is 3.

2. The luminescent material of claim 1, wherein the chemical formula 1 is a compound expressed by the following chemical formula 2:

Chemical formula 2

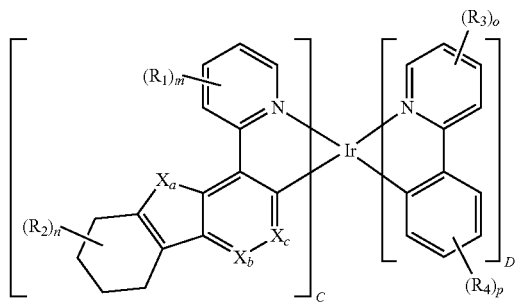

in the chemical formula 2, $X_a$, $X_b$, $X_c$, $R_1$, $R_2$, m, and n are as defined in the chemical formula 1, $R_3$ and $R_4$ are respectively equal to $R_1$, o and p are equal to m, C is equal to A of the chemical formula 1, and D is equal to B of the chemical formula 1.

3. The luminescent material of claim 1, wherein the chemical formula 1 is a compound expressed by the following chemical formula 3:

Chemical formula 3

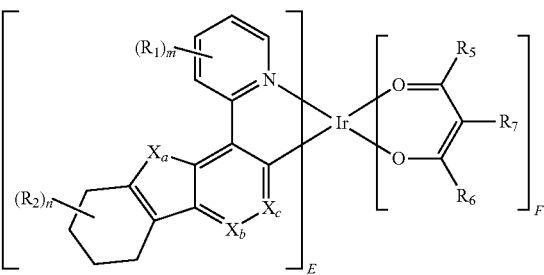

in the chemical formula 3, $X_a$, $X_b$, $X_c$, $R_1$, $R_2$, m, and n are as defined in the chemical formula 1, $R_5$, $R_6$, and $R_7$ are respectively equal to $R_1$, E is equal to A of the chemical formula 1, and F is equal to B of the chemical formula 1.

4. The luminescent material of claim 2, wherein the chemical formula 2 is a compound selected from a group including the following compounds 1 to 60 and 111 to 119:

1
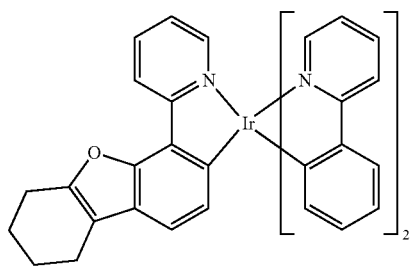
2
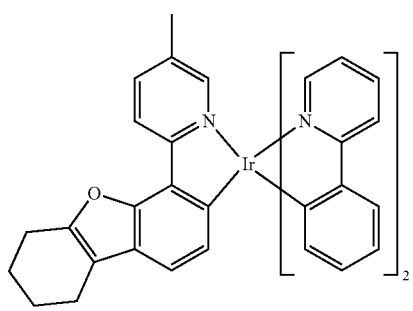
3
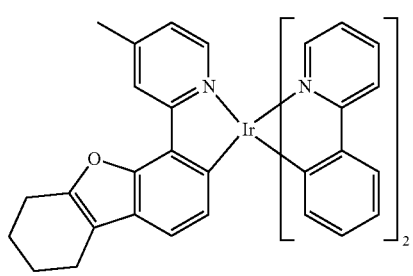
4
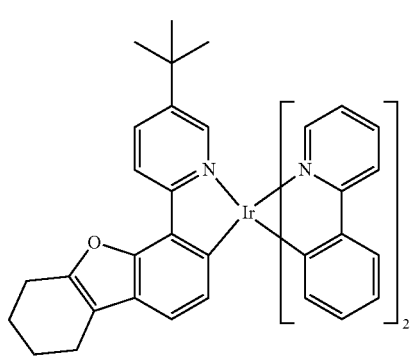
5
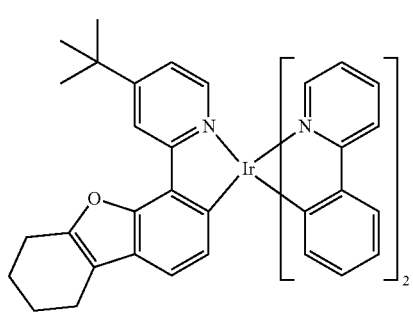
6
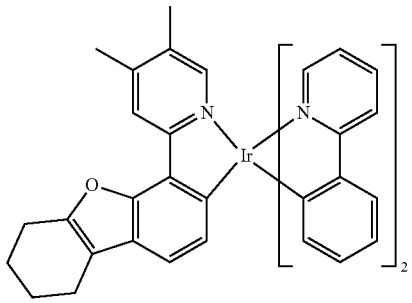
7
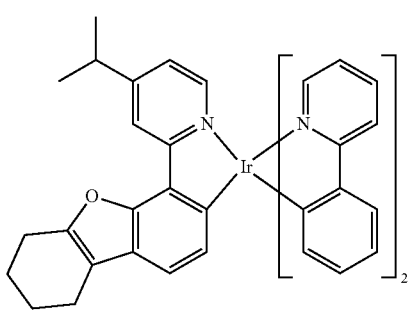
8
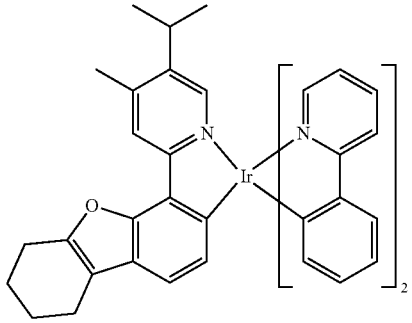
9
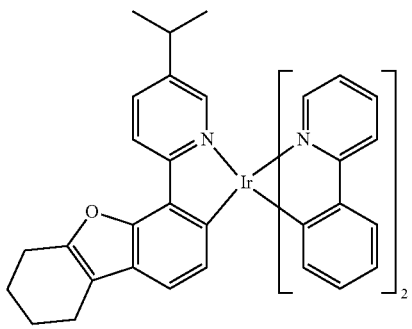
10
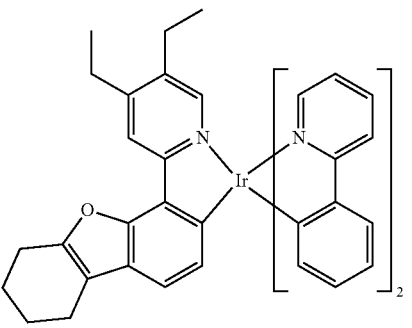

11 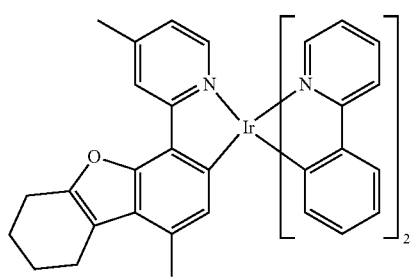
12 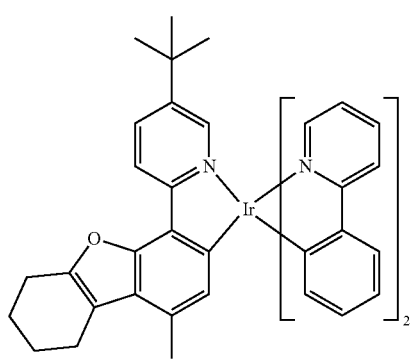
13 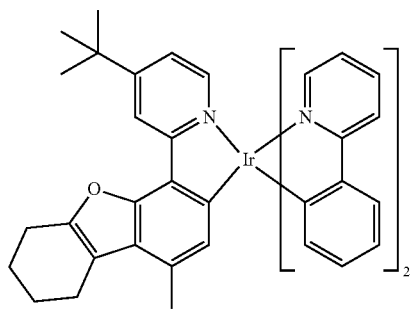
14 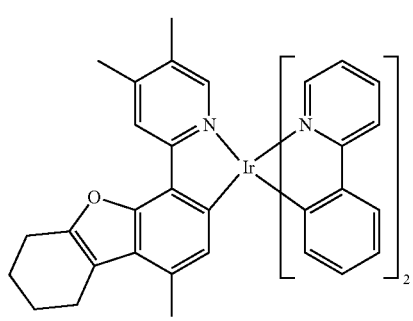
15 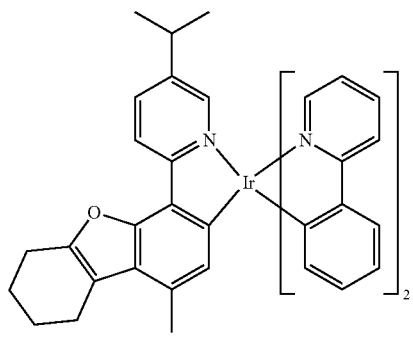
16 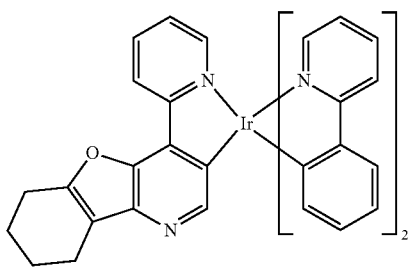
17 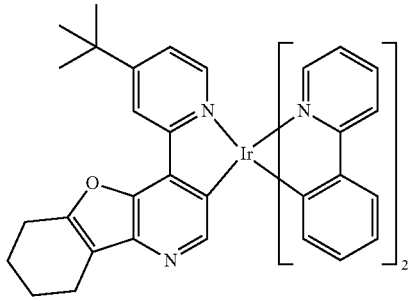
18 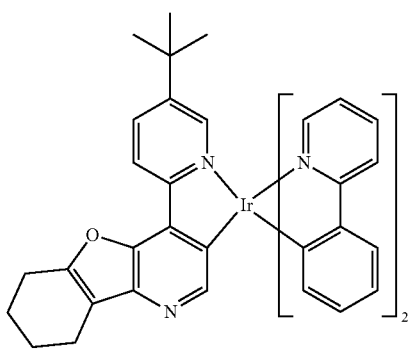
19 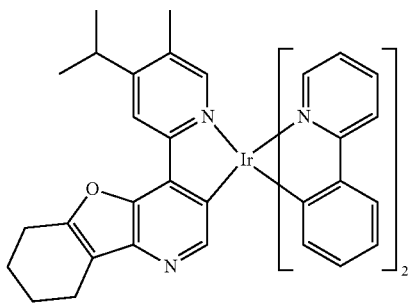
20 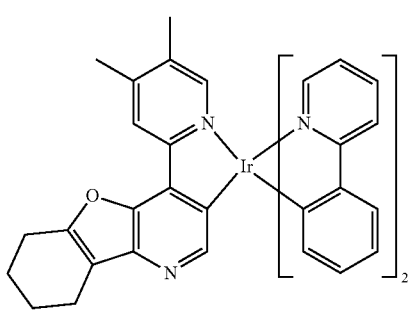

-continued
21
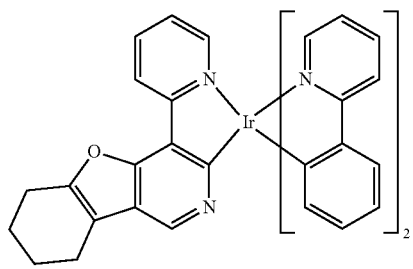
22
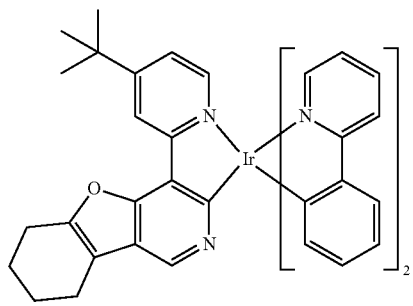
23
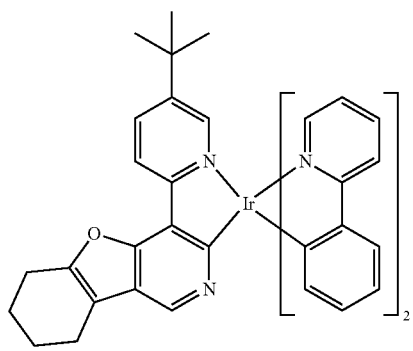
24
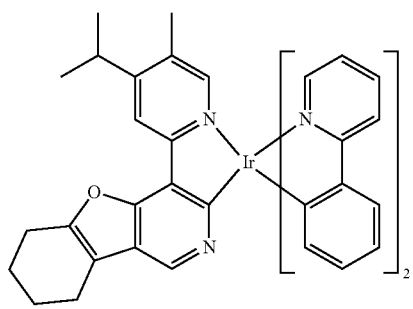
25
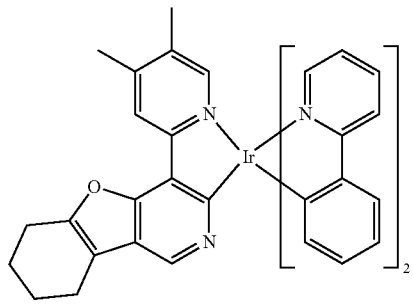
-continued
26
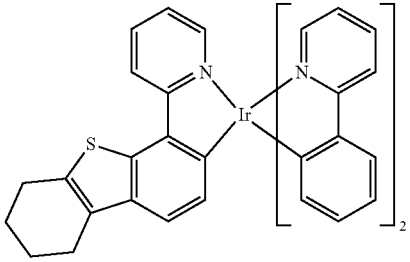
27
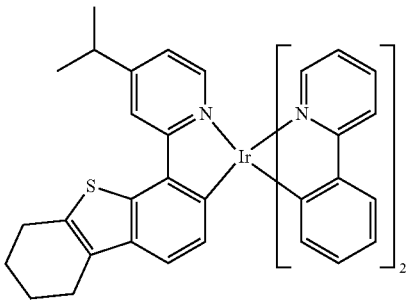
28
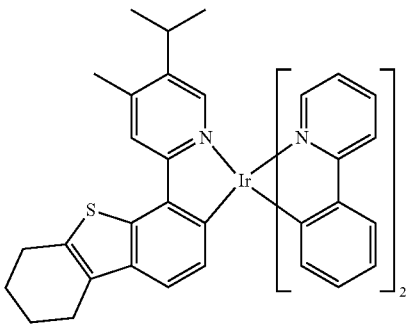
29
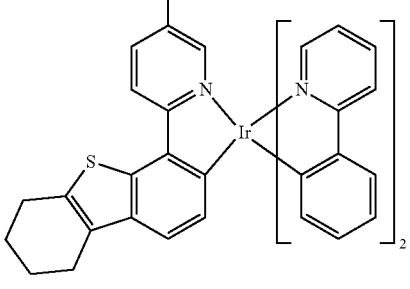
30
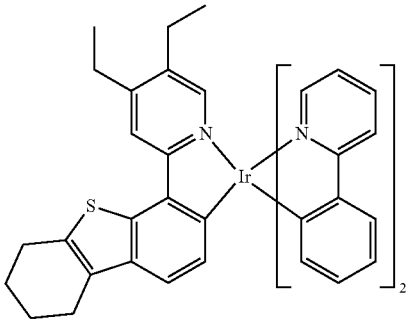

31
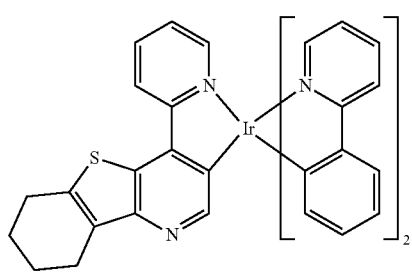
32
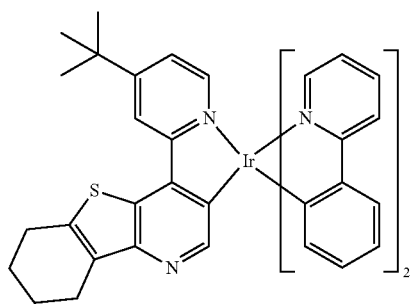
33
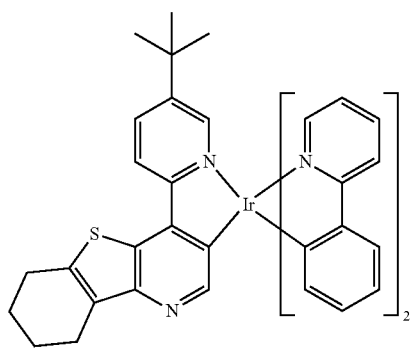
34
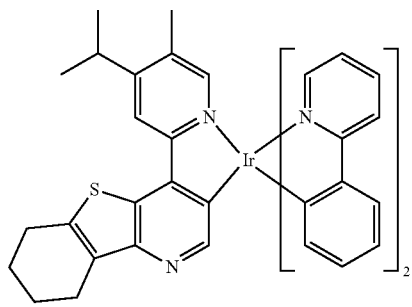
35
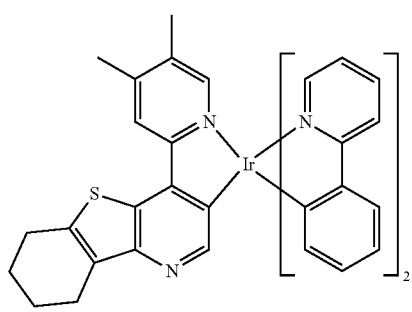
36
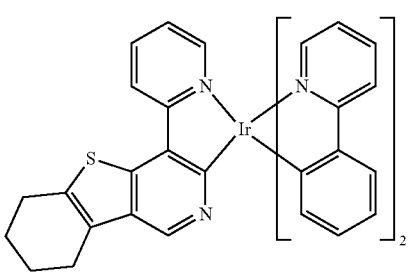
37
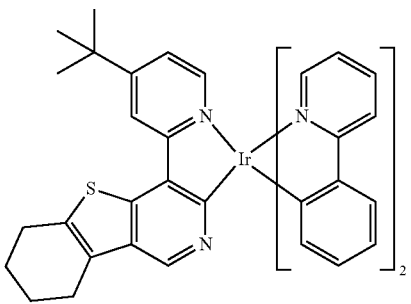
38
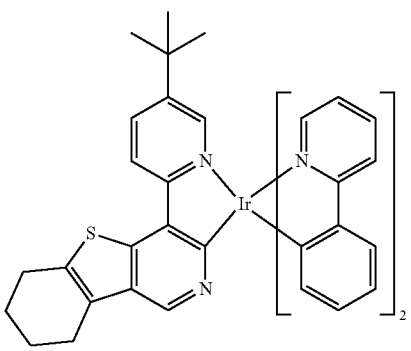
39
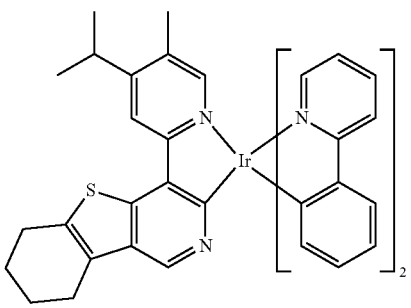
40
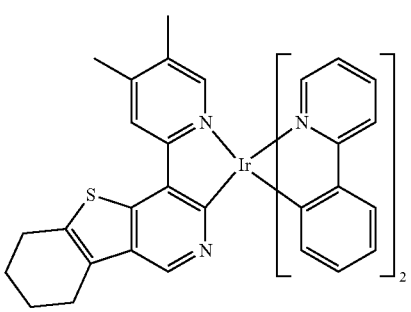

41
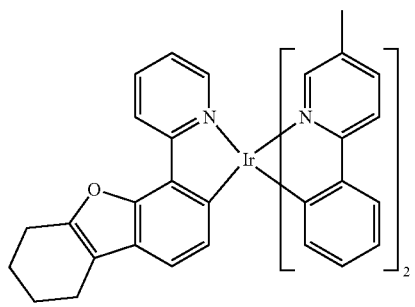
42
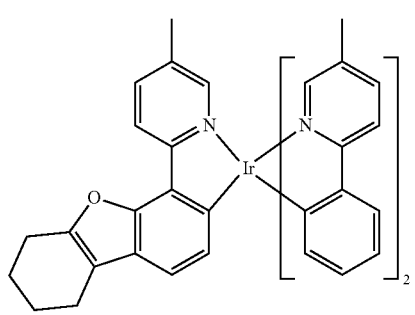
43
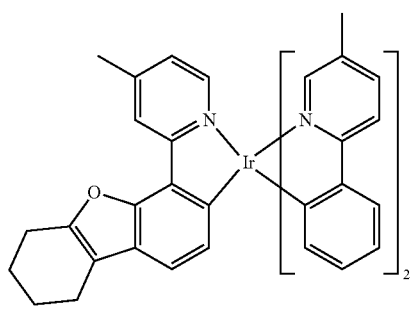
44
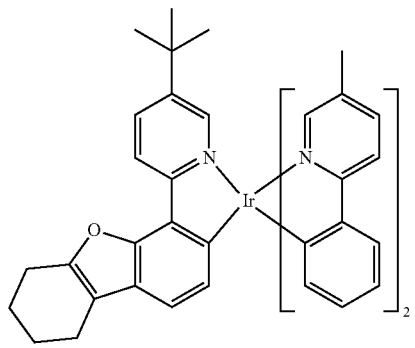
45
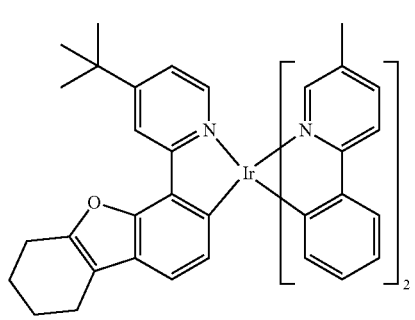
46
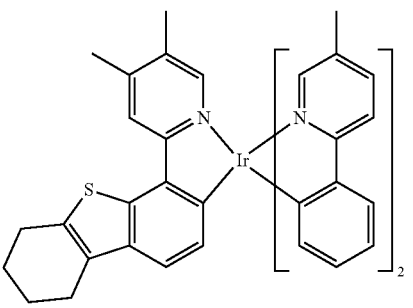
47
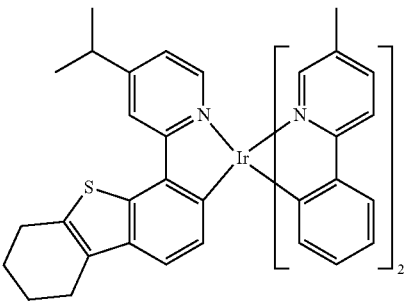
48
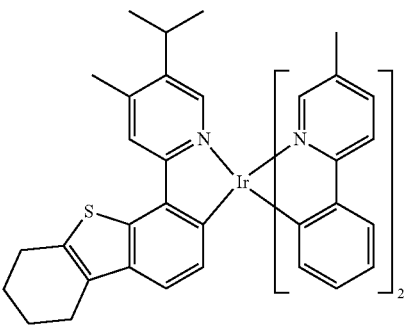
49
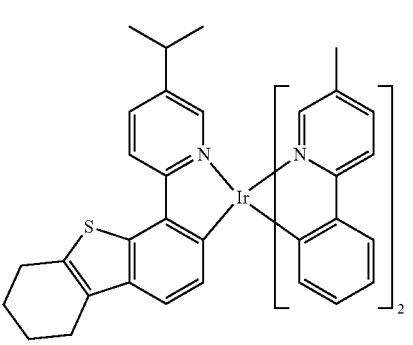
50
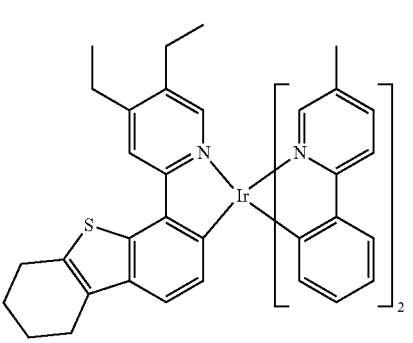

51
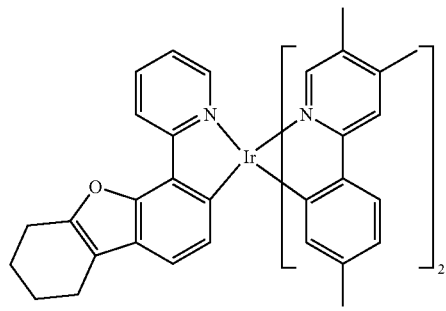
52
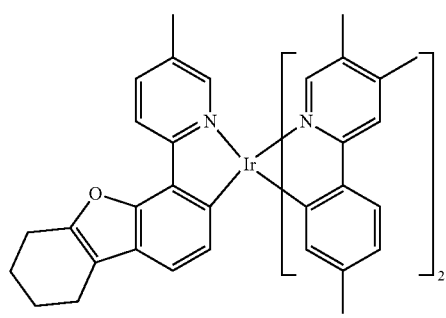
53
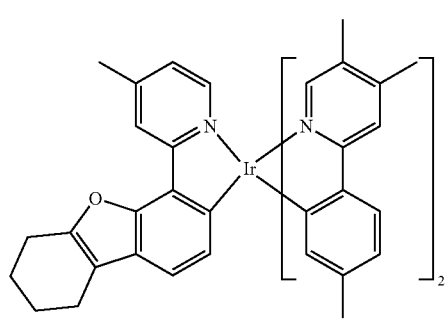
54
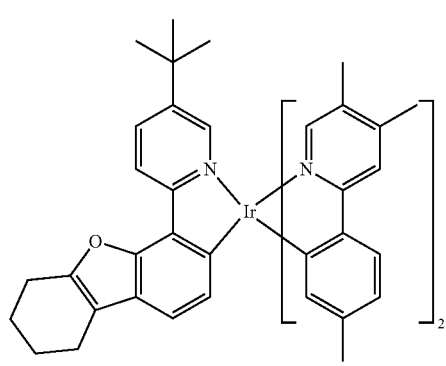
55
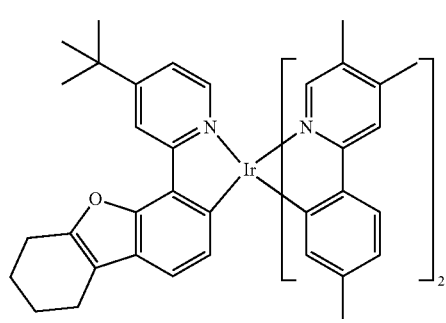
56
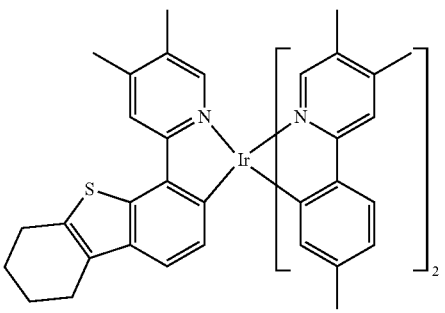
57
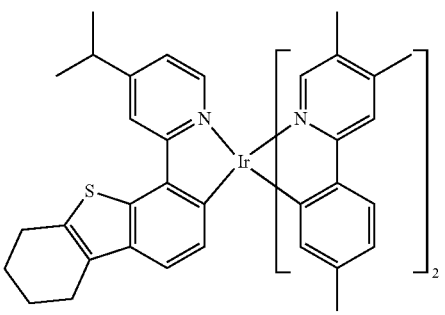
58
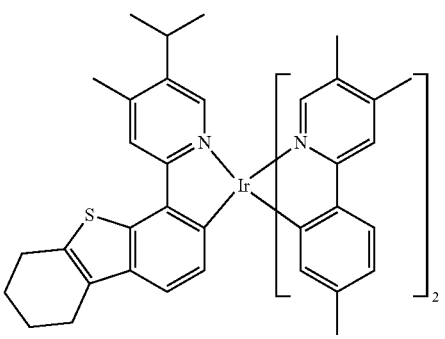
59
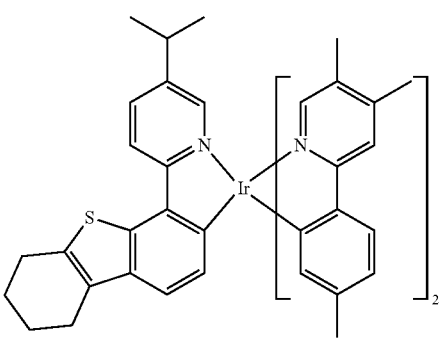
60
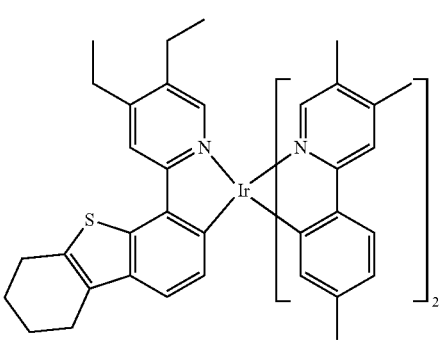

111 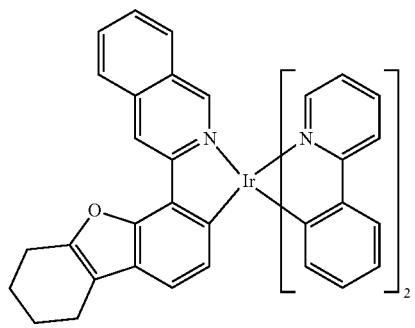
112 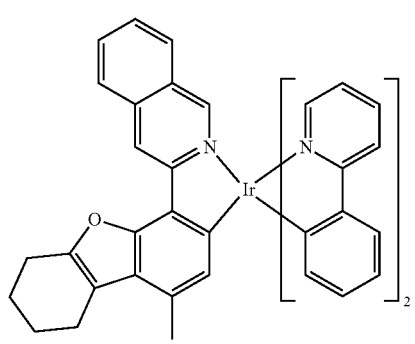
113 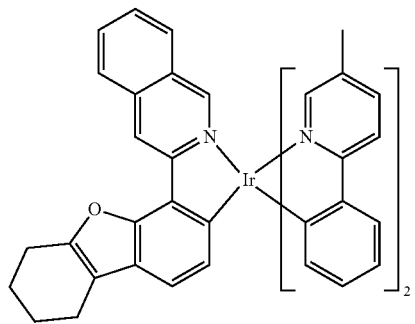
114 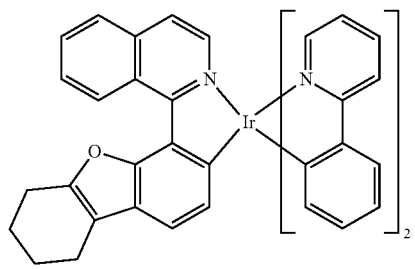
115 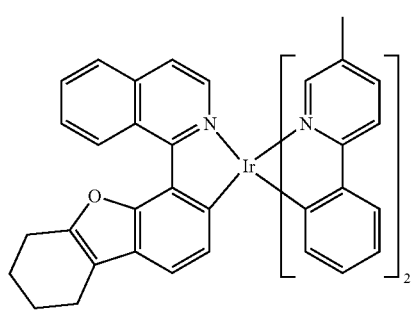
116 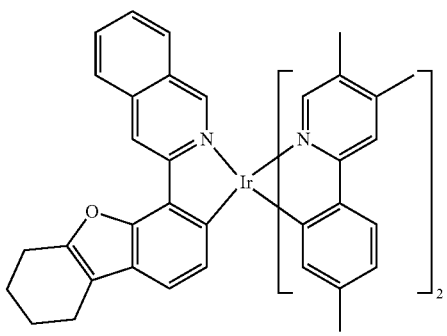
117 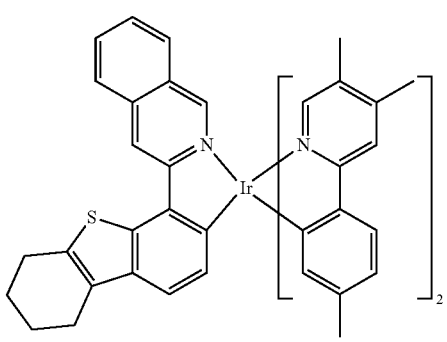
118 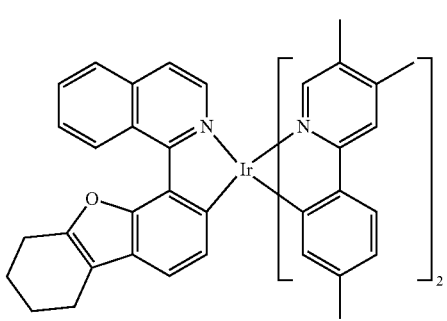
119 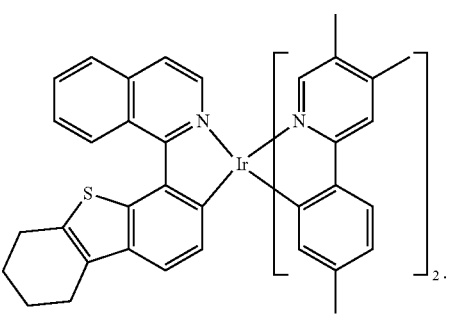
5. The luminescent material of claim 3, wherein the chemical formula 3 is a compound selected from a group including the following compounds 61 to 110:

85
61
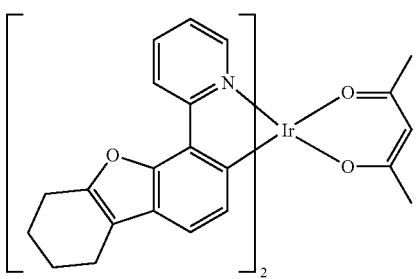
62
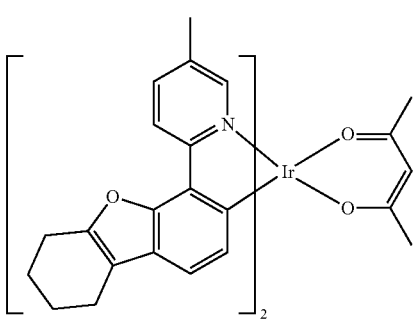
63
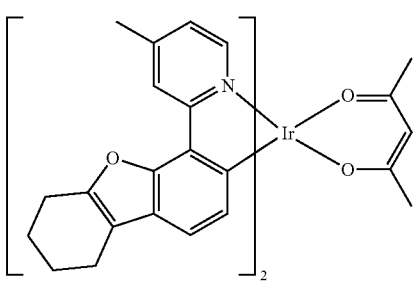
64
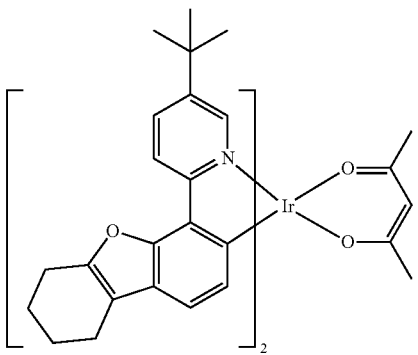
65
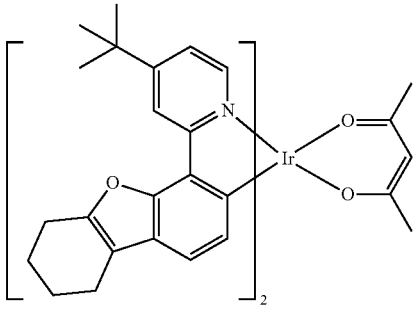
86
-continued
66
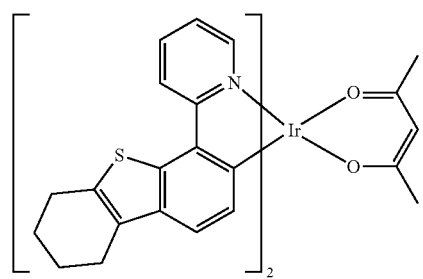
67
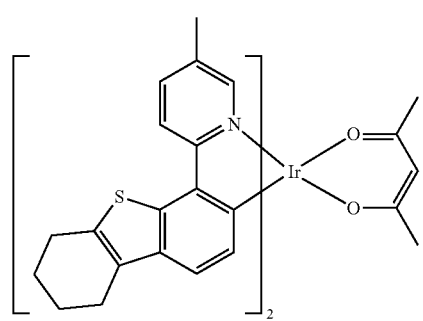
68
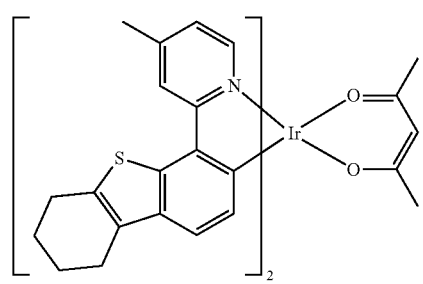
69
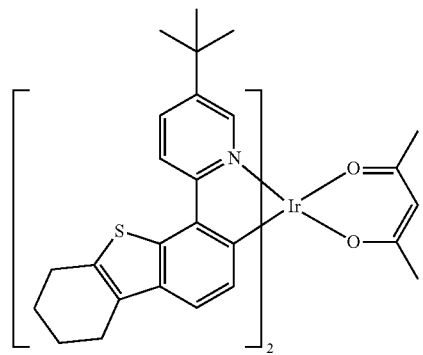
70
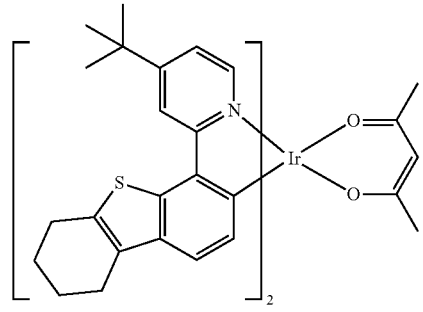

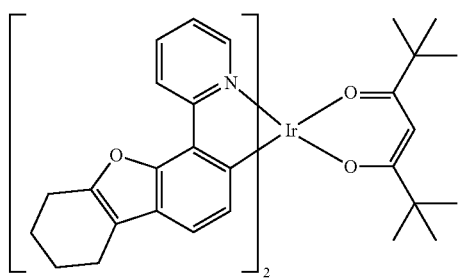
71
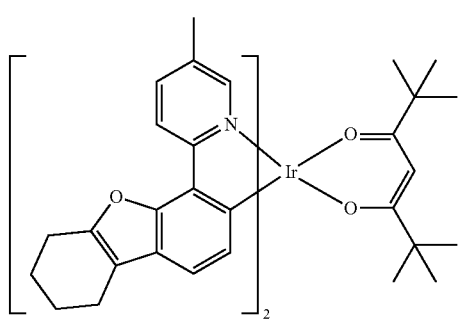
72
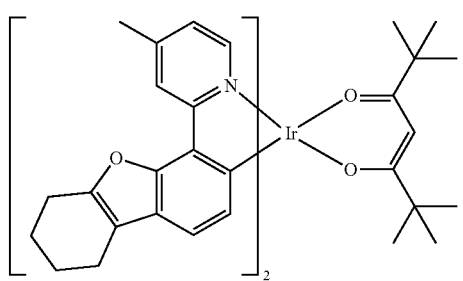
73
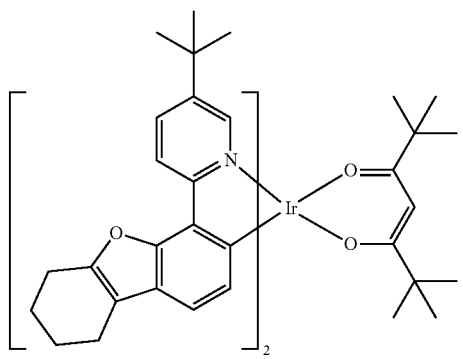
74
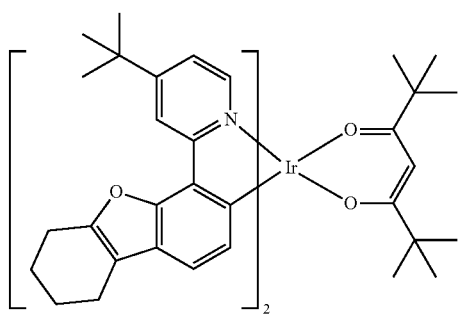
75
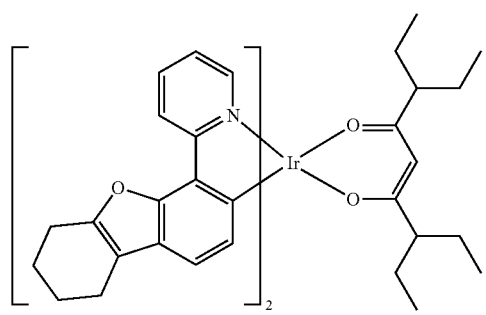
76
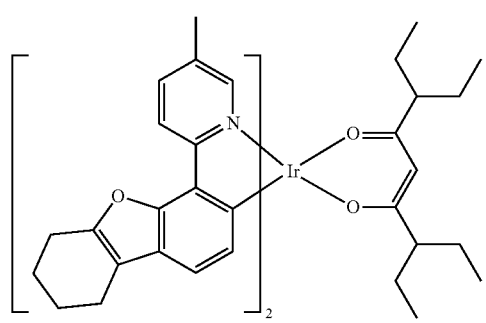
77
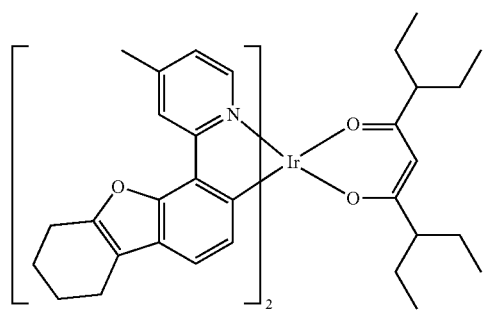
78
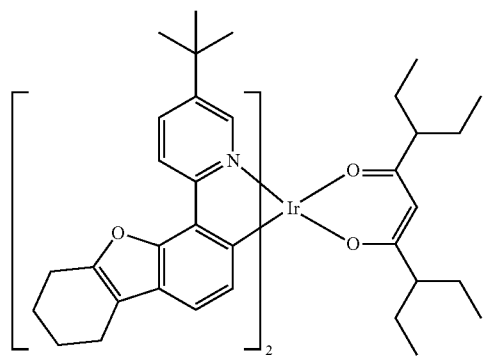
79
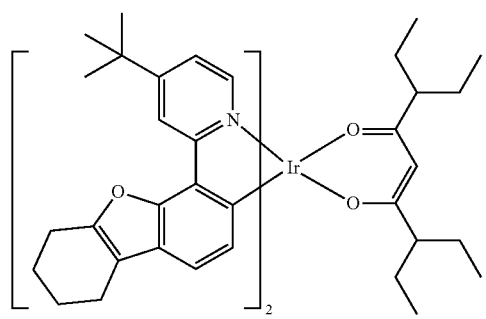
80

81
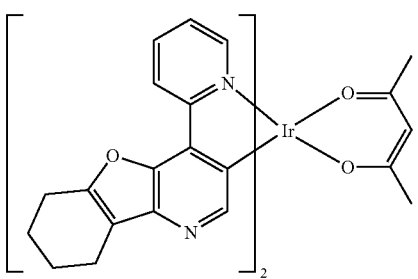
82
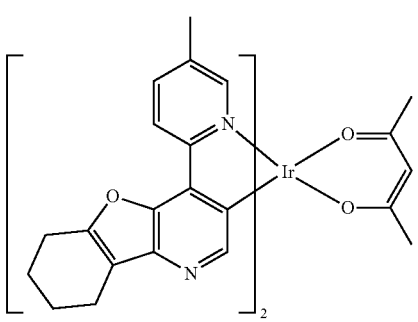
83
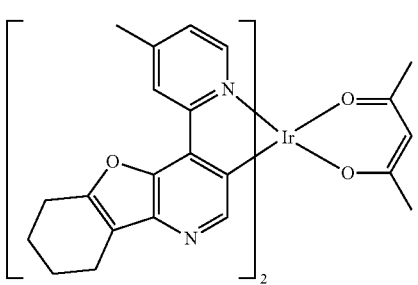
84
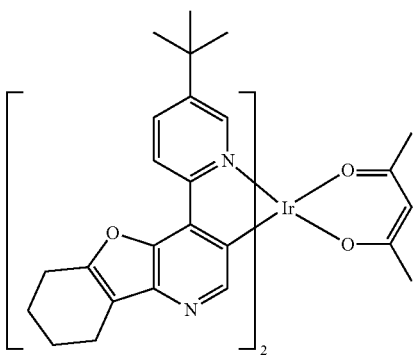
85
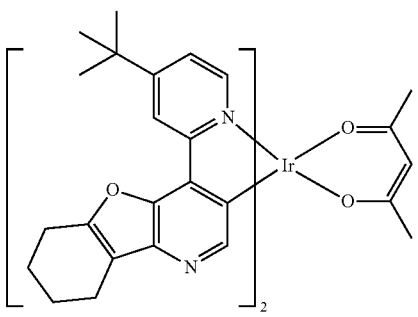
86
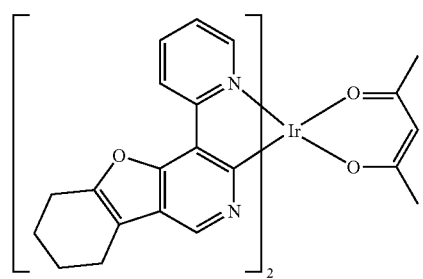
87
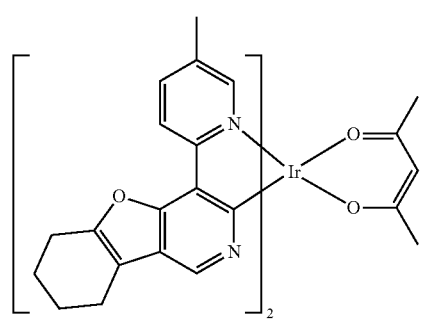
88
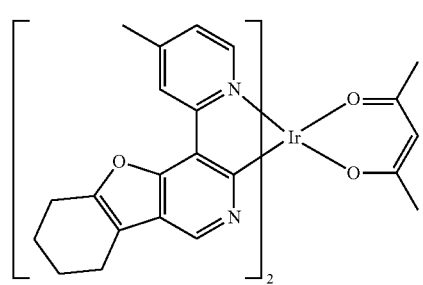
89
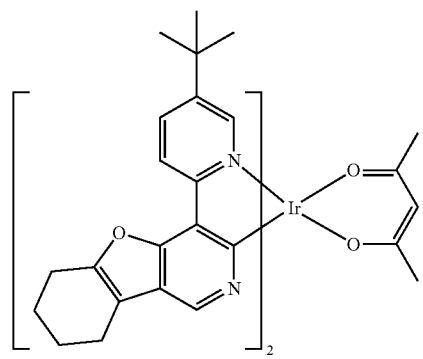
90
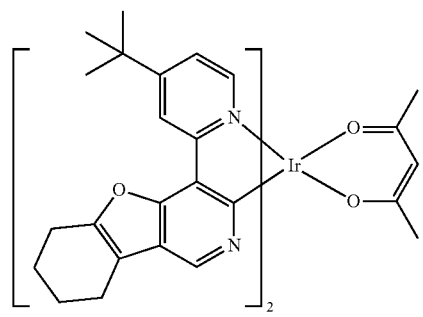

91
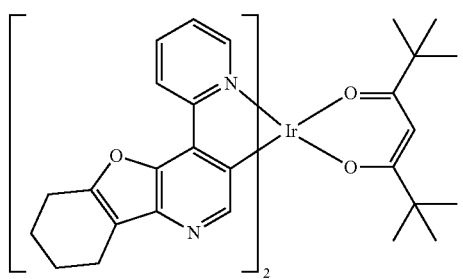
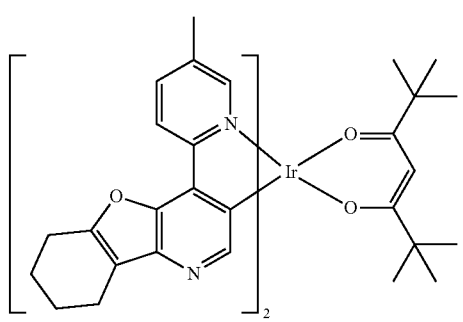
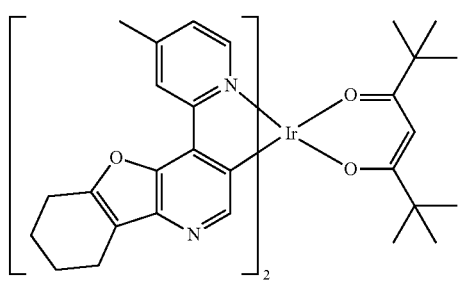
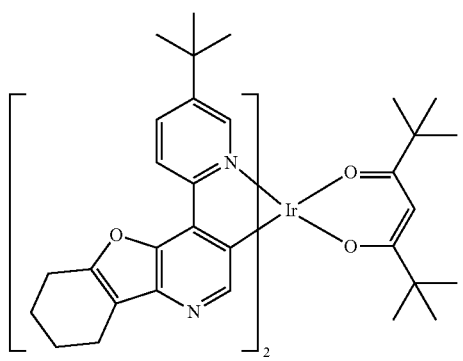
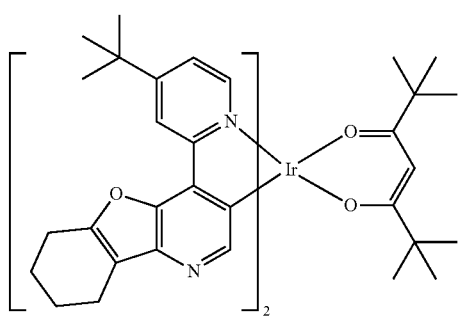
92
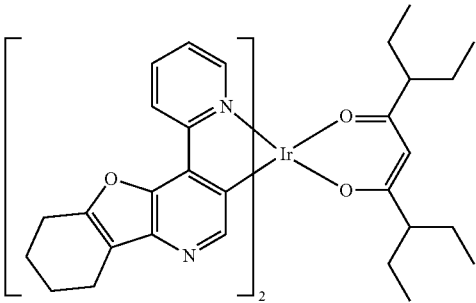
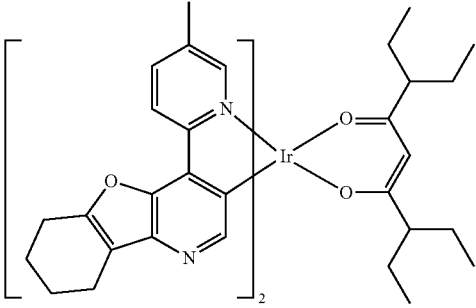
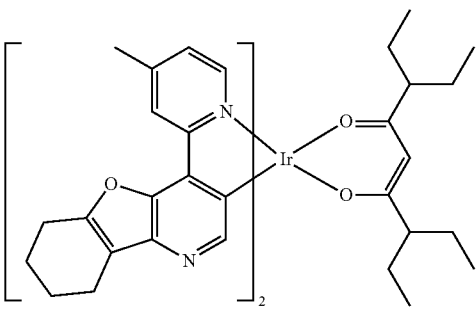
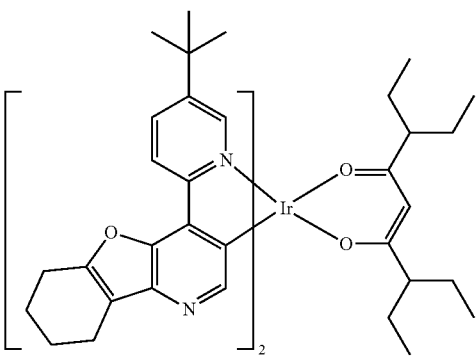
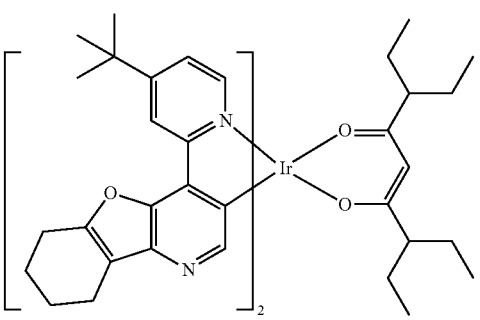

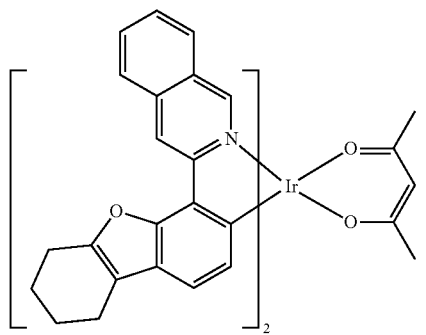
101
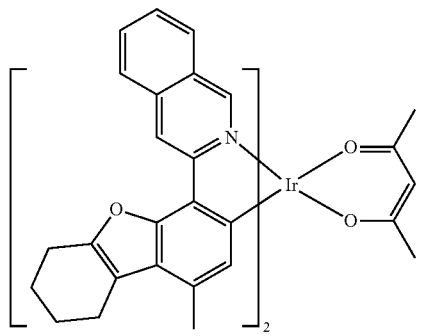
102
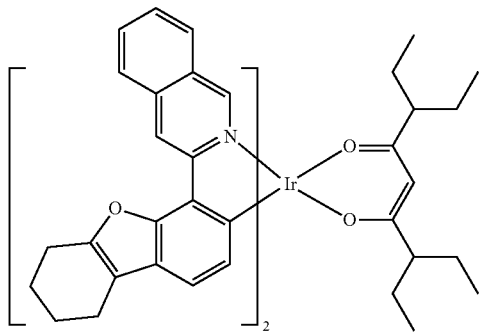
103
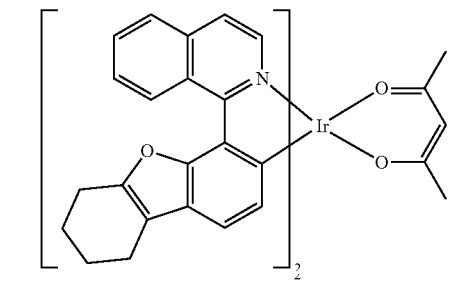
104
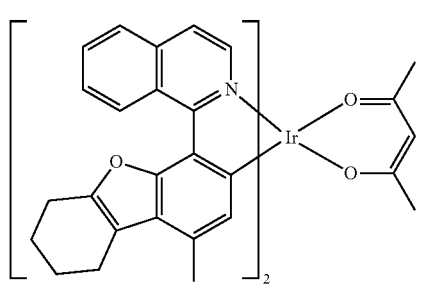
105
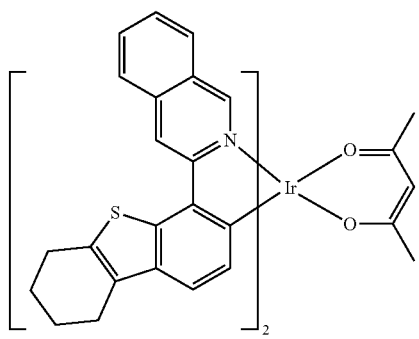
106
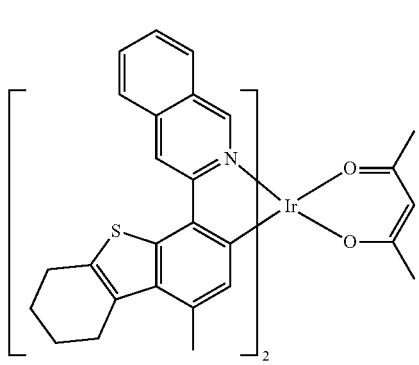
107
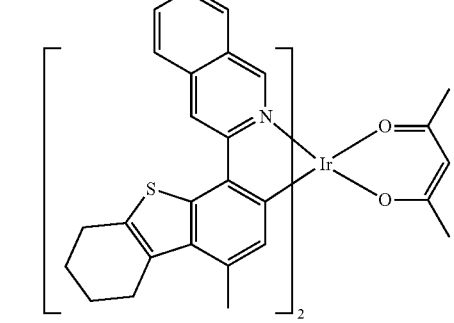
108
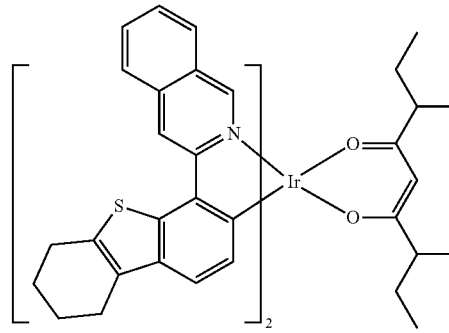
109
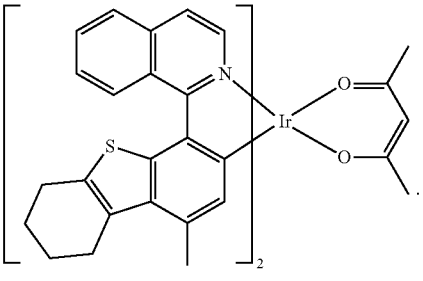
110

6. The luminescent material of claim 1, wherein the luminescent material emits light of a green, a yellow-green or red color.

7. An electroluminescent display device comprising:
a substrate;
a first electrode provided on the substrate;
a light emitting layer provided on the first electrode; and
a second electrode provided on the light emitting layer,
wherein the light emitting layer includes a luminescent material comprising a compound expressed by the following chemical formula 1:

Chemical formula 1

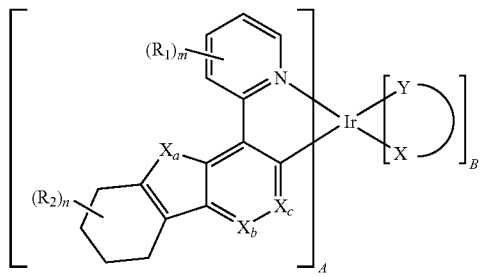

in the chemical formula 1,
$X_a$ is selected from oxygen or sulfur;
$X_b$ and $X_c$ are independently selected from nitrogen or carbon;
$R_1$ and $R_2$ are independently selected from the group consisting of hydrogen, heavy hydrogen, —F, —Cl, —Br, —I, hydroxyl group, cyano group, nitro group, amidino group, hydrazine group, hydrazone group, alkyl group of substituted or unsubstituted $C_1$-$C_{20}$, alkenyl group of substituted or unsubstituted $C_2$-$C_{20}$, alkynyl group of substituted or unsubstituted $C_2$-$C_{20}$, heteroalkyl group of substituted or unsubstituted $C_1$-$C_{20}$, aralkyl group of substituted or unsubstituted $C_7$-$C_{20}$, aryl group of substituted or unsubstituted $C_6$-$C_{30}$, heteroaryl group of substituted or unsubstituted $C_3$-$C_{30}$, and heteroaralkyl group of substituted or unsubstituted $C_3$-$C_{20}$;
m is selected from integers of 1 to 4;
two or more $R_1$ are equal to or different from one another if m is 2 or more;
two $R_1$, which are combined with adjacent carbons, are optionally combined with each other to form a ring;
n is selected from integers of 1 to 8;
two or more $R_2$ are equal to or different from one another if n is 2 or more;
two $R_2$, which are combined with adjacent carbons, are optionally combined with each other to form a ring;
two $R_2$, which are combined with a same carbon, are optionally combined with each other to form a ring;
X-Y is an auxiliary ligand; and
A and B indicate values of ligands combined with iridium, wherein A is an integer of 1 to 3, B is an integer of 0 to 2, and a sum of A and B is 3.

8. The electroluminescent display device of claim 7, wherein the chemical formula 1 is a compound expressed by the following chemical formula 2:

Chemical formula 2

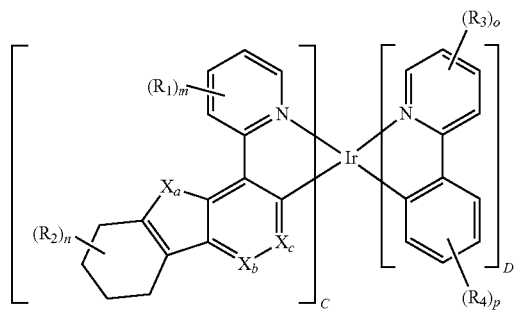

in the chemical formula 2,
$X_a$, $X_b$, $X_c$, $R_1$, $R_2$, m, and n are as defined in the chemical formula 1,
$R_3$ and $R_4$ are respectively equal to $R_1$,
o and p are equal to m,
C is equal to A of the chemical formula 1, and D is equal to B of the chemical formula 1.

9. The electroluminescent display device of claim 7, wherein the chemical formula 1 is a compound expressed by the following chemical formula 3:

Chemical formula 3

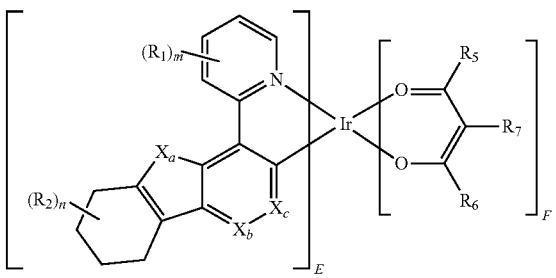

in the chemical formula 3,
$X_a$, $X_b$, $X_c$, $R_1$, $R_2$, m, and n are as defined in the chemical formula 1,
$R_5$, $R_6$, and $R_7$ are respectively equal to $R_1$,
E is equal to A of the chemical formula 1, and F is equal to B of the chemical formula 1.

10. The electroluminescent display device of claim 7, wherein the light emitting layer includes a dopant and a host, the dopant comprising the luminescent material.

11. The electroluminescent display device of claim 7, wherein the light emitting layer includes a first stack emitting light of a first color, a second stack emitting light of a second color, and a charge generating layer provided between the first stack and the second stack, and one of the first stack or the second stack includes the luminescent material.

12. The electroluminescent display device of claim 11, wherein one stack including the luminescent material is provided to emit light of a green, a yellow-green or red color.

* * * * *